(12) United States Patent
Kim et al.

(10) Patent No.: US 9,184,227 B1
(45) Date of Patent: Nov. 10, 2015

(54) METHODS OF MANUFACTURING SEMICONDUCTOR DEVICES HAVING SELF-ALIGNED CONTACT PADS

(71) Applicants: Young-Kuk Kim, Seoul (KR); Ki-Vin Im, Seongnam-si (KR); Han-Jin Lim, Seoul (KR); In-Seak Hwang, Suwon-si (KR)

(72) Inventors: Young-Kuk Kim, Seoul (KR); Ki-Vin Im, Seongnam-si (KR); Han-Jin Lim, Seoul (KR); In-Seak Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/529,500

(22) Filed: Oct. 31, 2014

(30) Foreign Application Priority Data

Apr. 29, 2014 (KR) ........................ 10-2014-0051678

(51) Int. Cl.
*H01L 21/336* (2006.01)
*H01L 49/02* (2006.01)
*H01L 21/8234* (2006.01)

(52) U.S. Cl.
CPC ........ *H01L 28/60* (2013.01); *H01L 21/823437* (2013.01); *H01L 21/823475* (2013.01)

(58) Field of Classification Search
CPC .................. H01L 29/66734; H01L 29/66704; H01L 29/7825; H01L 29/7813
USPC .................................................. 438/253, 270
See application file for complete search history.

(56) References Cited

U.S. PATENT DOCUMENTS

| 7,388,243 | B2 | 6/2008 | Yun et al. |
| 2013/0052780 | A1* | 2/2013 | Kim et al. ..................... 438/270 |
| 2013/0056823 | A1 | 3/2013 | Kim et al. |
| 2013/0093093 | A1 | 4/2013 | Lee |
| 2013/0292847 | A1* | 11/2013 | Choi et al. ..................... 257/774 |

FOREIGN PATENT DOCUMENTS

| KR | 10-2013-0026266 A | 3/2013 |
| KR | 10-2013-0039525 A | 4/2013 |

\* cited by examiner

*Primary Examiner* — Brook Kebede
(74) *Attorney, Agent, or Firm* — Myers Bigel Sibley & Sajovec, P.A.

(57) ABSTRACT

A semiconductor device includes a substrate having a field area that defines active areas, gate trenches in the substrate and extending in a first direction, a buried gate in a respective gate trench, gate capping fences in a respective gate trench over a respective buried gate, the gate capping fences protruding from top surfaces of the active areas and extending in the first direction, bit line trenches in the gate capping fences, a respective bit line trench crossing the gate capping fences and extending in a second direction perpendicular to the first direction, an insulator structure on inner walls of a respective bit line trench, bit lines and bit line capping patterns stacked on the insulator structures in a respective bit line trench, contact pads self-aligned with the gate capping fences and on the substrate between the adjacent bit lines, and a lower electrode of a capacitor on a respective contact pad.

13 Claims, 59 Drawing Sheets

METHODS OF MANUFACTURING SEMICONDUCTOR DEVICES HAVING SELF-ALIGNED CONTACT PADS

CROSS-REFERENCE TO RELATED APPLICATION

This application claims priority under 35 U.S.C. §119 to Korean Patent Application No. 10-2014-0051678 filed on Apr. 29, 2014, the disclosure of which is hereby incorporated by reference in its entirety.

BACKGROUND

1. Field

Various embodiments described herein relate to semiconductor devices, methods of manufacturing semiconductor devices, and electronic devices and electronic systems adopting the same.

2. Description of Related Art

With an increase in the degree of integration of semiconductor devices, a design rule of components of the semiconductor devices is being reduced. It is difficult to stably separate a bit line and a lower electrode of a capacitor, and parasitic capacitance between the bit line and the lower electrode of the capacitor may increase. A contact margin between an active area and the lower electrode of the capacitor also may be insufficient, which can increase the difficulty of a bit line forming process.

SUMMARY

Various embodiments described herein can provide semiconductor devices capable of reducing or preventing contact misalignment.

Other embodiments can provide semiconductor devices having damascene bit lines.

Other embodiments can provide methods of manufacturing semiconductor devices capable of reducing or preventing contact misalignment.

Other embodiments can provide methods of manufacturing semiconductor devices having damascene bit lines.

The technical objectives of the inventive concepts are not limited to the above disclosure; other objectives may become apparent to those of ordinary skill in the art based on the following description.

Various embodiments described herein may be realized by providing a semiconductor device including a substrate having a field area that defines active areas; gate trenches extending in a first direction in the substrate; buried gates in the gate trenches; gate capping fences in, and in some embodiments filling, the gate trenches over a respective buried gate, protruding from top surfaces of the active areas, and extending in the first direction; bit line trenches crossing the gate capping fences and extending in a second direction perpendicular to the first direction in the gate capping fence; insulator structures on inner walls of a respective bit line trench; bit lines and bit line capping patterns stacked on the insulator structures in, and in some embodiments to fill, a respective bit line trench; contact pads self-aligned with the gate capping fences and on the substrate between the adjacent bit lines; and a lower electrode of a capacitor on a respective contact pad.

A top surface of the contact pad may be located at substantially the same level as a top surface of the gate capping fence.

A depth of the bit line trench may be greater than or equal to a protruding height of the gate capping fence from a top surface of the active area.

A top surface of the bit line may be located at a lower level than the top surface of the active area.

The top surface of the bit line may be located at a higher level than the top surface of the active area.

A top surface of the bit line capping pattern may be located at substantially the same level as the top surface of the gate capping fence.

The insulator structure may include an insulating layer, an air gap, or a multi-structure having an insulating layer and an air gap.

Other embodiments may be realized by providing a method of manufacturing a semiconductor device, the method including forming a field area in a substrate to define active areas; forming gate trenches extending in a first direction in the substrate; forming buried gates in a respective gate trench; forming gate capping fences in, and in some embodiments filling, the gate trenches over a respective buried gate, the gate capping fences protruding from top surfaces of the active areas and extending in the first direction; forming line-shaped pad patterns self-aligned with the gate capping fences and extending in the first direction on the substrate; forming contact pads and bit line trenches by patterning a part of the pad patterns and the gate capping fences to expose at least some areas of the substrate between the adjacent gate capping fences, each contact pad being formed on the substrate between the adjacent bit line trenches and a respective bit line trench extending in a second direction perpendicular to the first direction; forming a bit line in a respective bit line trench; and forming a lower electrode of a capacitor on a respective contact pad.

The formation of the line-shaped pad patterns self-aligned with the gate capping fences and extending in the first direction may include forming a pad conductive layer on a surface, and in some embodiments on an entire surface, of the substrate, and partially removing the pad conductive layer until a top surface of the gate capping fence is exposed. A top surface of the line-shaped pad pattern may be located at substantially the same level as the top surface of the gate capping fence.

The formation of the contact pads and the bit line trenches may include forming mask patterns extending in the second direction and defining bit line forming areas, on the substrate on which the line-shaped pad patterns are formed, forming the contact pads and the bit line trenches by etching the exposed areas of the pad patterns and some areas of the gate capping fences using the mask patterns, and removing the mask patterns.

Insulator structures may further be formed on inner walls of a respective bit line trench. A respective insulator structure may include an insulating layer, an air gap, or a multi-structure having an insulating layer and an air gap.

Bit line capping patterns may further be formed in the bit line trenches over each bit line. Top surfaces of the bit line capping patterns may be located at substantially the same level as top surfaces of the gate capping fences.

Yet other embodiments may be realized by providing a method of manufacturing a semiconductor device, the method comprising: forming spaced-apart line-shaped structures that extend in a first direction of a substrate, the spaced-apart line-shaped structures comprising gate trenches in the substrate having buried gates therein and gate capping fences thereon that protrude from the substrate; forming line-shaped pad patterns that extend in the first direction, between the spaced-apart line-shaped structures; forming a mask pattern on the gate capping fences and on the line-shaped pad patterns to define spaced-apart line-shaped mask openings that extend in a second direction perpendicular to the first direction; and etching portions of the line-shaped pad patterns and the gate capping fences that are exposed by the mask openings to form contact pads from the line-shaped pad patterns and to form trenches in the gate capping fences that extend in the second direction.

The formation of the line-shaped pad patterns may include forming a pad conductive layer on the spaced-apart line-shaped structures and between the spaced-apart line-shaped structures; and removing the pad conductive layer until top surfaces of the gate capping fences are exposed to form the line-shaped pad patterns.

The method may further comprise forming a bit line in a respective bit line trench. The method may further comprise forming a lower electrode of a capacitor directly on a respective contact pad.

The following may be performed between the etching and the forming a bit line: forming an insulating layer including an air gap on walls of the bit line trenches.

Specific particulars of other embodiments are included in the detailed description and drawings.

BRIEF DESCRIPTION OF THE DRAWINGS

The foregoing and other features and advantages of the inventive concepts will be apparent from the more particular description of various embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
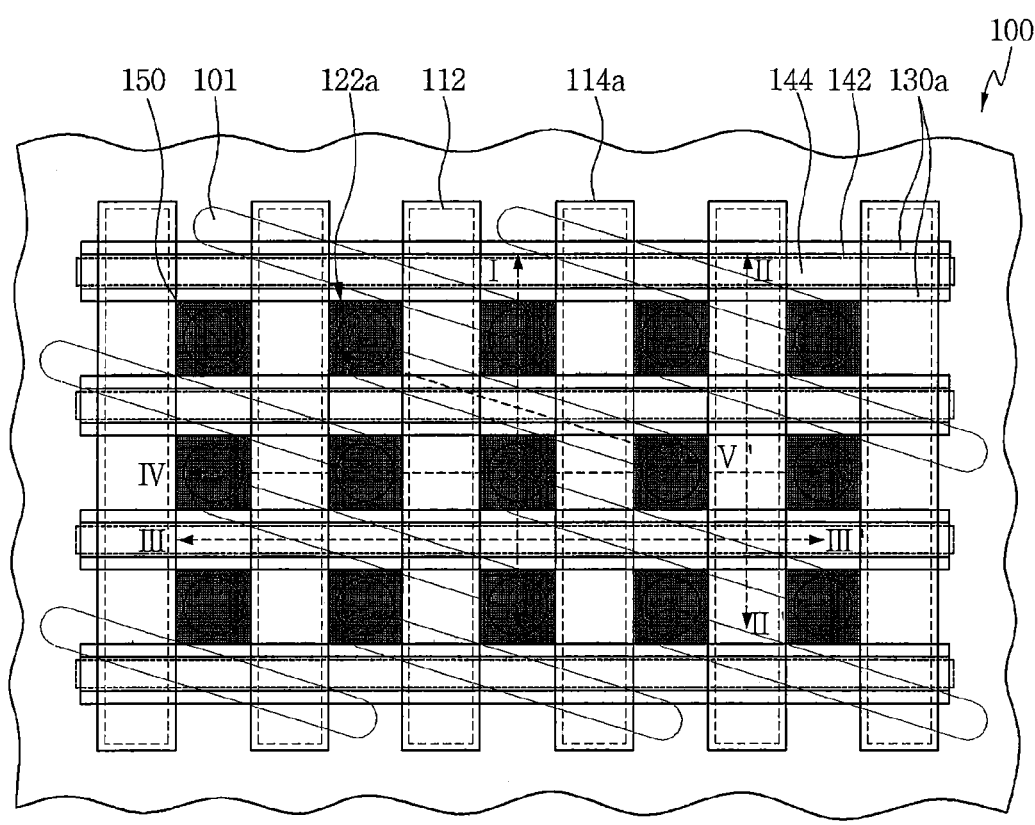
FIG. 1 is a plan view showing a memory cell area of a semiconductor device in accordance with an embodiment.

The inventive concepts will now be described more fully hereinafter with reference to the accompanying drawings, in which embodiments of the inventive concepts are shown. The inventive concepts may, however, be embodied in different forms and should not be construed as limited to the embodiments set forth herein. Rather, these embodiments are provided so that this disclosure is thorough and complete and fully conveys the scope of the inventive concepts to one skilled in the art.

The terminology used herein is for the purpose of describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Like numerals refer to like elements throughout the specification. In the drawings, the lengths and thicknesses of layers and regions may be exaggerated for clarity. In addition, it will be understood that when a first element is referred to as being "on" a second element, the first element may be directly on the second element, or one or more other elements may be interposed between the first element and the second element.

Spatially relative terms, such as "top surface", "bottom surface", "upper end," "lower end," "upper surface," "lower surface," "upper part," "lower part," and the like, may be used herein for ease of description to distinguish relative locations of elements. For example, when an upper part is used as a top in the drawing and a lower part is used as a bottom in the drawing for convenience, the upper part could be termed the lower part and the lower part could be termed the upper part without departing from the scope of the present inventive concepts.

It will be understood that, although the terms "first," "second," etc. may be used herein to describe various elements, these elements should not be limited by these terms. These terms are only used to distinguish one element from another. For example, a first element could be termed a second element, and similarly, a second element could be termed a first element, without departing from the scope of the inventive concepts.

The embodiments of the inventive concepts will be described with reference to cross-sectional views and/or plan views, which are ideal views. Thicknesses of layers and areas in the drawings are exaggerated for effective description of the technical contents. Forms of the embodiments may be modified by the manufacturing technology and/or tolerance. Therefore, the embodiments of the inventive concepts are not intended to be limited to illustrated specific forms, and include modifications of forms generated according to the manufacturing processes. For example, an etching area illustrated at a right angle may be round or have a predetermined curvature. Therefore, areas illustrated in the drawings have overview properties, shapes of the areas are illustrated special forms of the areas of a device, and are not intended to limit the scope of the inventive concepts.

Figure 2:
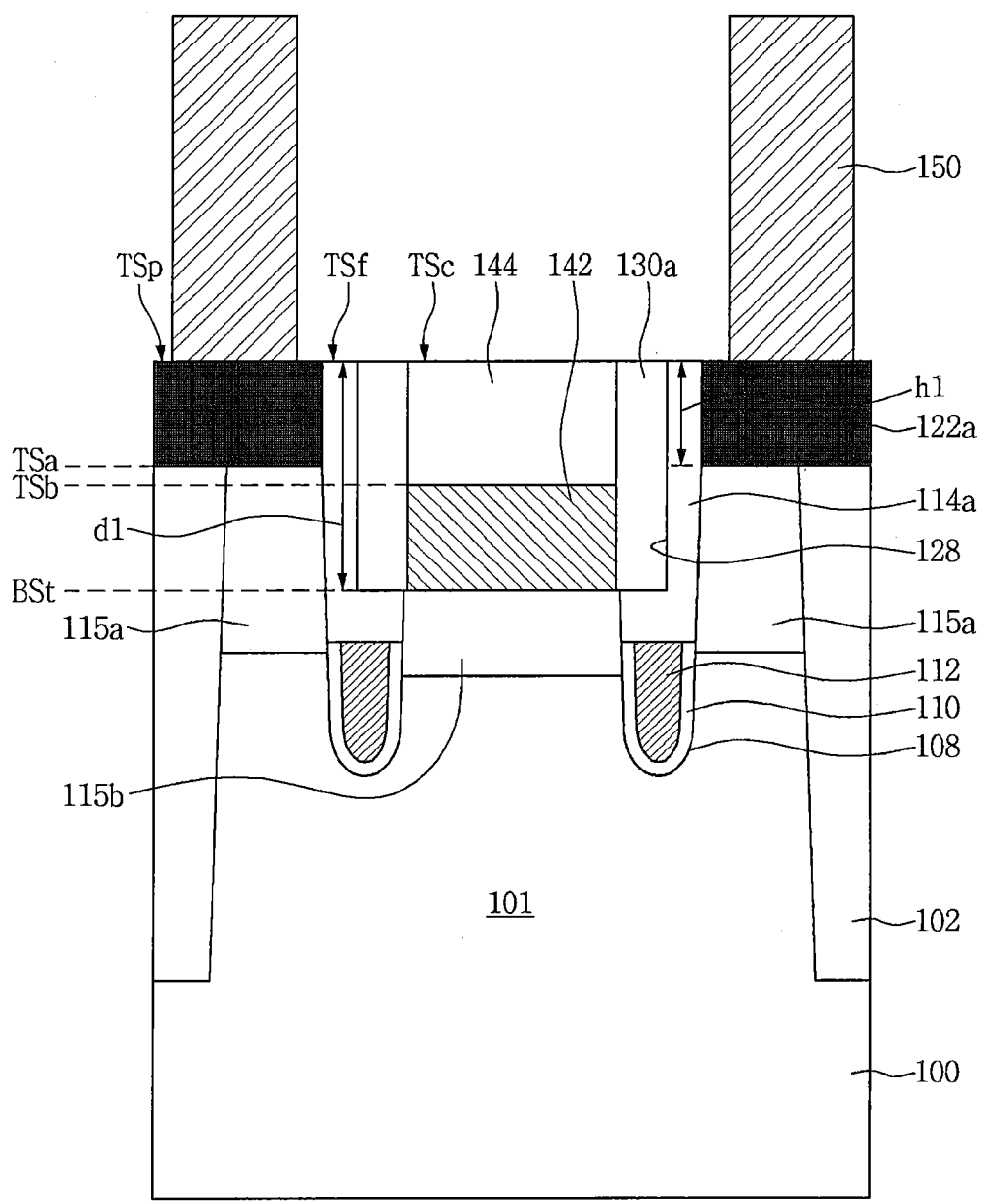
FIG. 2 is a cross-sectional view of a semiconductor device taken along line V-V' of FIG. 1 in accordance with an embodiment.

FIG. 1 is a plan view showing a memory cell area of a semiconductor device in accordance with an embodiment. FIG. 2 is a cross-sectional view of a semiconductor device taken along line V-V' of FIG. 1 in accordance with an embodiment.

Referring to FIGS. 1 and 2, the semiconductor device in accordance with the embodiment may include a substrate 100 having active areas 101 defined by field areas 102. Buried gates 112 extending in a first direction may be formed in the substrate 100. Bit lines 142 extending in a second direction perpendicular to the first direction may be formed in the substrate 100. Contact pads 122a may be formed on the substrate 100 between the adjacent bit lines 142. Lower electrodes 150 of a capacitor may be formed on each contact pad 122a.

The substrate 100 may comprise a semiconductor substrate. For example, the substrate 100 may comprise a silicon substrate, a germanium substrate, a silicon-germanium substrate, or the like.

The field area 102 may be formed in the substrate 100 and define the plurality of active areas 101. The field area 102 may be a shallow trench isolation (STI) area. For example, the field area 102 may include a field trench formed in the substrate 100, and a field insulating layer filling the field trench. The field insulating layer may include a single layer of silicon oxide or a composite layer having silicon oxide and silicon nitride according to a width of the field trench.

Each active area 101 may be formed to have a major axis and a minor axis, and arranged two-dimensionally in directions of the major and minor axes. For example, each active area 101 may have a bar shape in which a length is greater than a width.

The active areas 101 may be oriented such that their major axes are oblique with respect to the buried gates 112 and the bit lines 142. One active area 101 may intersect two buried gates 112 and one bit line 142, and thus, one active area 101 may have a structure of two unit cells. One unit cell may have a length of 2F in the first direction and a length of 4F in the second direction, and have an area of 6F2. Here, F refers to a minimum feature size. The semiconductor device in accordance with the embodiments may not be limited to the 6F2 cell structure, and the active areas 101 may also be formed in an 8F2 cell structure in which the active areas 101 intersects the buried gates 112 at right angles. Further, it is apparent that any cell structures capable of improving a degree of integration of the semiconductor device may also be included.

Each buried gate 112 may be formed in a lower part of a gate trench 108 with a gate insulating layer 110 therebetween, the gate trench extending in the first direction and being formed in the substrate 100. Upper parts of the gate trenches 108 over each buried gate 112 may be filled with gate capping fences 114a. The gate capping fence 114a may be formed to have a line shape extending in the first direction along the buried gate 112. The gate capping fence 114a may protrude from a top surface TSa of the active area 101 by a first height h1.

The buried gate 112 may include poly-silicon, a metal or metal nitride, such as tungsten (W), tungsten nitride (WN), titanium (Ti), titanium nitride (TiN), tantalum (Ta), tantalum nitride (TaN), titanium aluminum nitride (TiAlN), tantalum aluminum nitride (TaAlN), or a composite layer thereof. The gate insulating layer 110 may include silicon oxide, an insulating material having a high dielectric constant or a combination thereof. The gate capping fence 114a may include silicon nitride.

According to an embodiment, first and second impurity areas 115a and 115b provided as source/drain areas of a cell transistor may be formed in the active areas 101 on both sides of each buried gate 112. The first impurity area 115a may be formed in the active area 101 between the buried gate 112 and the field area 102. The first impurity area 115a may be electrically connected to the lower electrode 150 of the capacitor through the contact pad 122a. The second impurity area 115b may be formed in the active area 101 between a pair of buried gates 112. The second impurity area 115b may be electrically connected to the bit line 142. For example, the second impurity area 115b may be formed deeper than the first impurity area 115a.

Bit line trenches 128 crossing the gate capping fences 114a and extending in the second direction perpendicular to the first direction may be formed in the gate capping fences 114a. The bit line trench 128 may be formed by a damascene process using the gate capping fences 114a protruding from a level of the active area 101. The bit line trench 128 may be formed to have a depth greater than or equal to a protruding height of the gate capping fence 114a from the top surface TSa of the active area 101.

The bit line 142 may be formed in a lower part of the bit line trench 128. The bit line 142 may be formed as a structure fully or partially buried in the substrate 100 or a structure disposed on the substrate 100, according to the depth of the bit line trench 128. According to the embodiment, as the bit line trench 128 may be formed to have a first depth d1 greater than the protruding height h1 of the gate capping fence 114a, a top surface TSb of the bit line 142 may be located at a lower level than the top surface TSa of the active area 101, the bit line 142 may be formed to have a structure fully buried in the substrate 100.

A bottom surface BSt of the bit line trench 128 may be controlled to ensure a stable separation between the bit line 142 and the buried gate 112. Since the bit line 142 may be formed by a damascene process, a fine pattern can be implemented by overcoming a pattern limitation of a photolithography process.

Upper parts of the bit line trenches 128 over each bit line 142 may be filled with bit line capping patterns 144. A top surface TSc of the bit line capping pattern 144 may be located at substantially the same level as a top surface TSf of the gate capping fence 114a. The bit line 142 may include a low-resistance metal such as tungsten (W), titanium nitride (TiN), or the like. The bit line capping patterns 144 may include silicon nitride.

Each of insulator structures 130a may be formed on an inner wall of each bit line trench 128. The insulator structures 130a may be formed to expose source/drain areas in the active area 101, for example, the second impurity area 115b, and to extend in the first direction along the inner wall of the bit line trench 128. The insulator structures 130a may stably separate the contact pad 122a from the bit line 142. The insulator structure 130a may be formed by an insulating layer having a low dielectric constant, e.g., silicon oxide and the like, or an air gap of which dielectric constant is 1, to thereby reduce parasitic capacitance between the bit line 142 and the lower electrode 150 of the capacitor.

The contact pad 122a may be self-aligned with the gate capping fence 114a and formed on the substrate 100 between the adjacent bit lines 142. For example, the contact pad 122a may be electrically connected to the first impurity area 115a in the active area 101. The lower electrode 150 of the capacitor may be directly formed on the contact pad 122a, which is self-aligned with the gate capping fence 114a, without a contact hole, to thereby prevent contact misalignment.

A top surface TSp of the contact pad 122a may be located at substantially the same level as the top surface TSf of the gate capping fence 114a. The contact pad 122a may be stably separated from the bit line 142 by the gate capping fence 114a and the insulator structure 130a. For example, the contact pad 122a may include a metal, such as tungsten (W), titanium nitride (TiN), or the like, doped poly-silicon, or a multi-layer structure having a metal and poly-silicon. In some cases, a metal silicide layer for an ohmic contact, or a barrier metal layer such as a metal oxide or the like may be formed between a surface of the active area 101 and the contact pad 122a.

The lower electrode 150 of the capacitor formed on the contact pad 122a may be stably separated from the bit line 142 by the gate capping fence 114a and the insulator structure 130a. Due to the gate capping fence 114a and the insulator structure 130a, scaling down of the semiconductor device can be implemented to sufficiently ensure a distance between the lower electrode 150 of the capacitor and the bit line 142.

FIGS. 3 to 10 are cross-sectional views of semiconductor devices taken along the line V-V' of FIG. 1 in accordance with other embodiments. Hereinafter, the above-described embodiments and repeated parts will be omitted, and modified parts will be mainly described.

Figure 3:
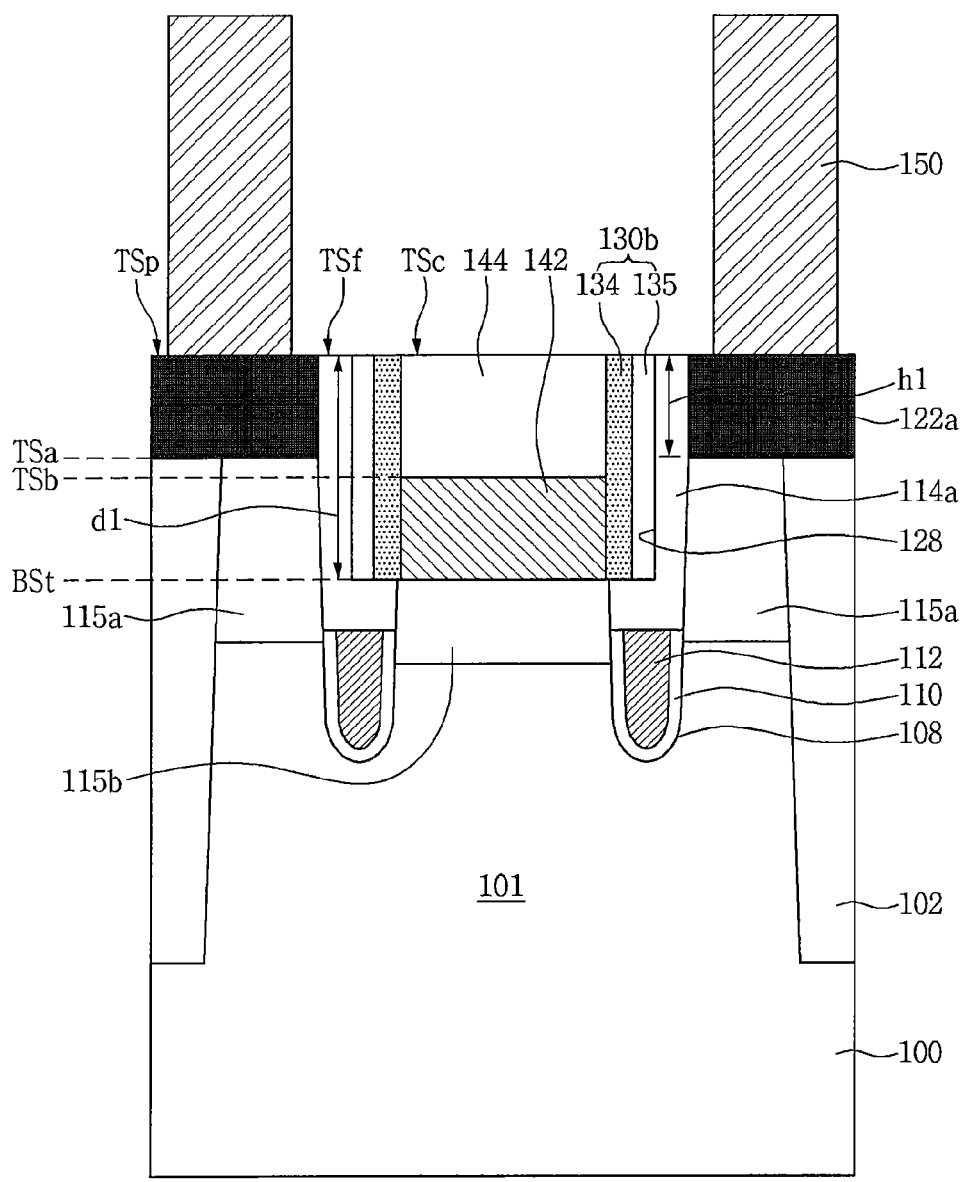
FIGS. 3 to 10 are cross-sectional views of semiconductor devices taken along the line V-V' of FIG. 1 in accordance with other embodiments.

Referring to FIG. 3, in the semiconductor device in accordance with another embodiment, a gate capping fence 114a covering a top surface of a buried gate 112 formed in a substrate 100 may extend in a first direction along the buried gate 112, and protrude from a top surface TSa of an active area 101 by a first height h1.

A bit line trench 128 crossing the gate capping fences 114a and extending in a second direction perpendicular to the first direction may be formed in the gate capping fence 114a. The bit line trench 128 may be formed to have a first depth d1 greater than the protruding height h1 of the gate capping fence 114a.

As a top surface TSb of a bit line 142 in the bit line trench 128 is located at a lower level than the top surface TSa of the active area 101, the bit line 142 may be formed as a structure fully buried in the substrate 100.

An insulator structure 130b extending in the first direction along an inner wall of the bit line trench 128 may be formed as a multi-layer structure having an insulating layer 134 and an air gap 135. The insulating layer 134 may include an insulating material having a low dielectric constant such as silicon oxide or the like.

Figure 4:
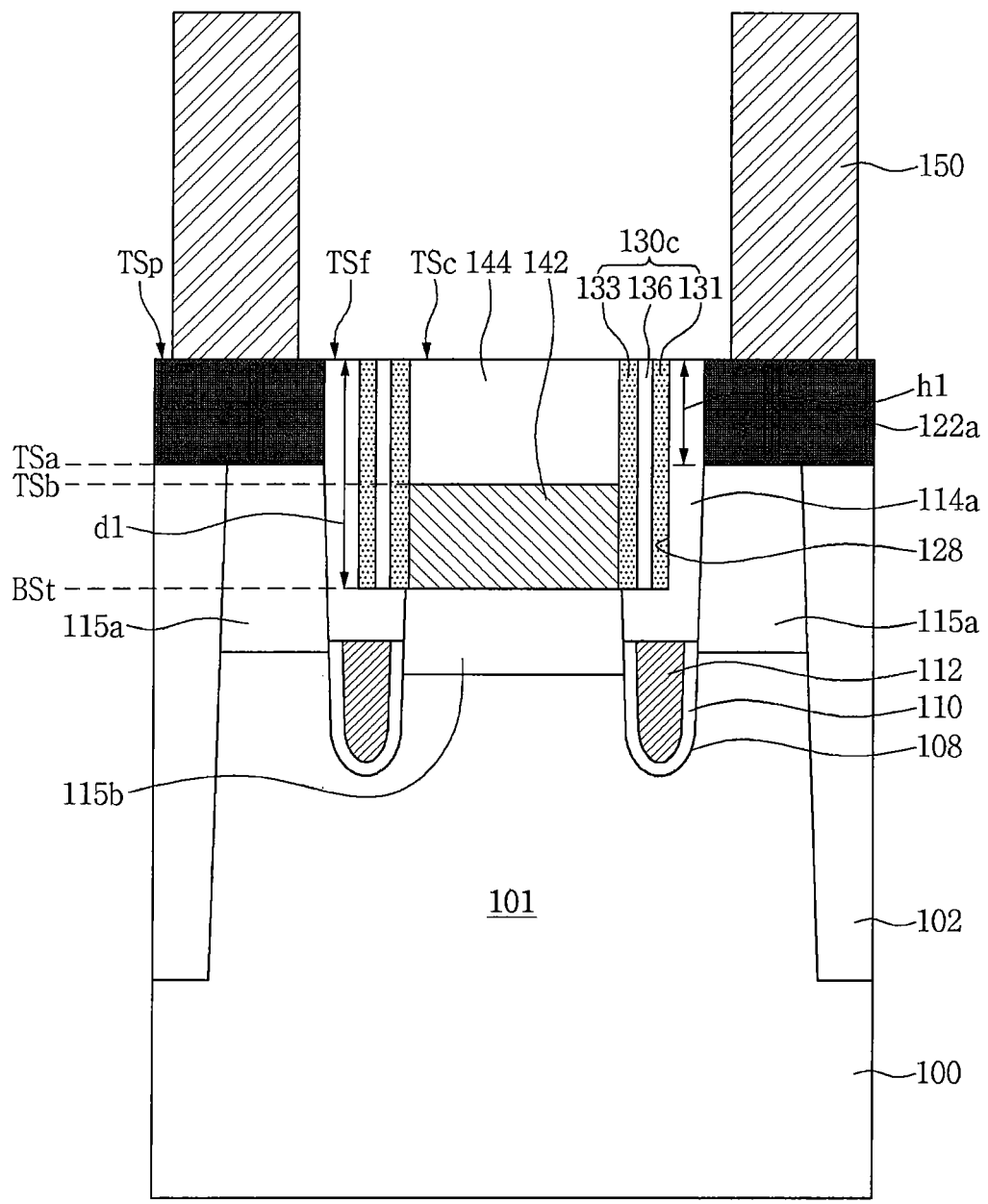

Referring to FIG. 4, in the semiconductor device in accordance with another embodiment, an insulator structure 130c extending in a first direction along an inner wall of a bit line trench 128 may be formed as a multi-layer structure having a first insulating layer 131, an air gap 136, and a second insulating layer 133. Each of the first and second insulating layers 131 and 133 may include a low dielectric constant insulating material such as silicon oxide or the like.

The bit line trench 128 may be formed to have a first depth d1 greater than a protruding height h1 of a gate capping fence 114a. As a top surface TSb of a bit line 142 formed in the bit line trench 128 is located at a lower level than a top surface TSa of an active area 101, the bit line 142 may be formed as a structure fully buried in the substrate 100.

Figure 5:
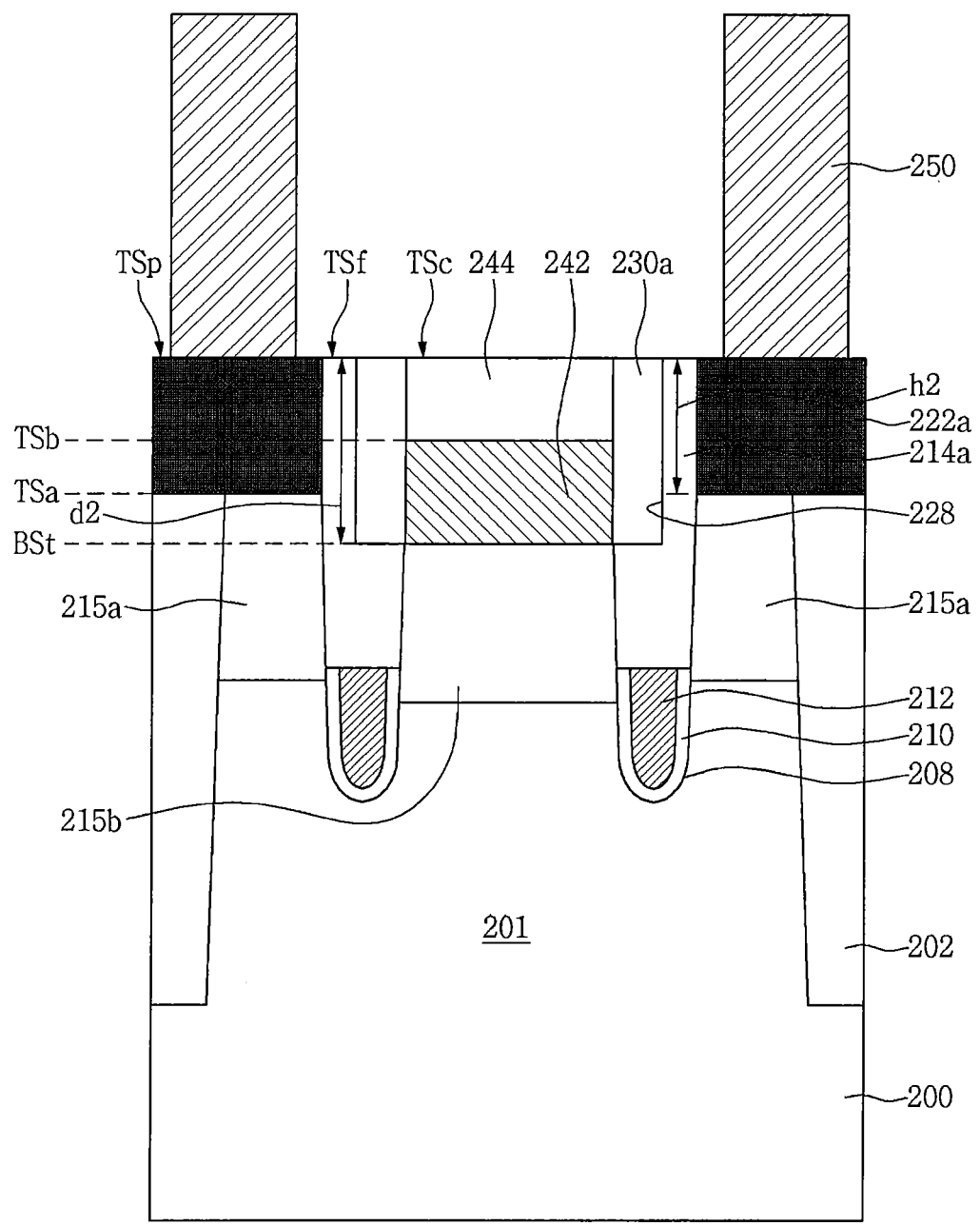

Referring to FIG. 5, the semiconductor device in accordance with another embodiment may include a substrate 200 having active areas 201 defined by a field area 202. Buried gates 212 extending in a first direction may be formed in the substrate 200. Bit lines 242 extending in a second direction perpendicular to the first direction may be formed in and on the substrate 200. Contact pads 222a may be formed on the substrate 200 between the adjacent bit lines 242. Lower electrodes 250 of a capacitor may be formed on each contact pad 222a.

The buried gate 212 may be formed in a lower part of a gate trench 208 extending in the first direction and formed in the substrate 200, with a gate insulating layer 210 therebetween. An upper part of the gate trench 208 may be filled with a gate capping fence 214a over the buried gate 212. The gate capping fence 214a may be formed to have a line shape extending in the first direction along the buried gate 212, and protrude from a top surface TSa of the active area 201 by a second height h2.

First and second impurity areas 215a and 215b provided as source/drain areas of a cell transistor may be formed in the active areas 201 on both sides of each buried gate 212. The first impurity area 215a may be formed in the active area 201 between the buried gate 212 and the field area 202. The first impurity area 215a may be electrically connected to the lower electrode 250 of the capacitor through the contact pad 222a.

The second impurity area 215b may be formed in the active area 201 between a pair of buried gates 212. The second impurity area 215b may be electrically connected to the bit line 242. For example, the second impurity area 215b may be formed deeper than the first impurity area 215a.

A bit line trench 228 crossing the gate capping fence 214a and extending in the second direction perpendicular to the first direction may be formed in the gate capping fence 214a. The bit line trench 228 may be formed to have a second depth d2 greater than the protruding height h2 of the gate capping fence 214a.

An insulator structure 230a may be formed along an inner wall of the bit line trench 228. The bit line trench 228 may be filled with the bit line 242 and a bit line capping pattern 244. As a top surface TSb of the bit line 242 may be located at a higher level than the top surface TSa of the active area 201, the bit line 242 may be formed as a structure partially buried in the substrate 200.

The insulator structure 230a may be formed by an insulating layer having a low dielectric constant, e.g., silicon oxide and the like, or an air gap, or both, to prevent parasitic capacitance between the bit line 242 and the lower electrode 250 of the capacitor.

The contact pad 222a may be self-aligned with the gate capping fence 214a. For example, the contact pad 222a may be electrically connected to the first impurity area 215a in the active area 201. The lower electrode 250 of the capacitor may be directly formed on the contact pad 222a, which is self-aligned with the gate capping fence 214a, without a contact hole, to prevent contact misalignment.

Scaling down of the semiconductor device can be implemented to sufficiently ensure a distance between the lower electrode 250 of the capacitor and the bit line 242 by the gate capping fence 214a and the insulator structure 230a.

Figure 6:
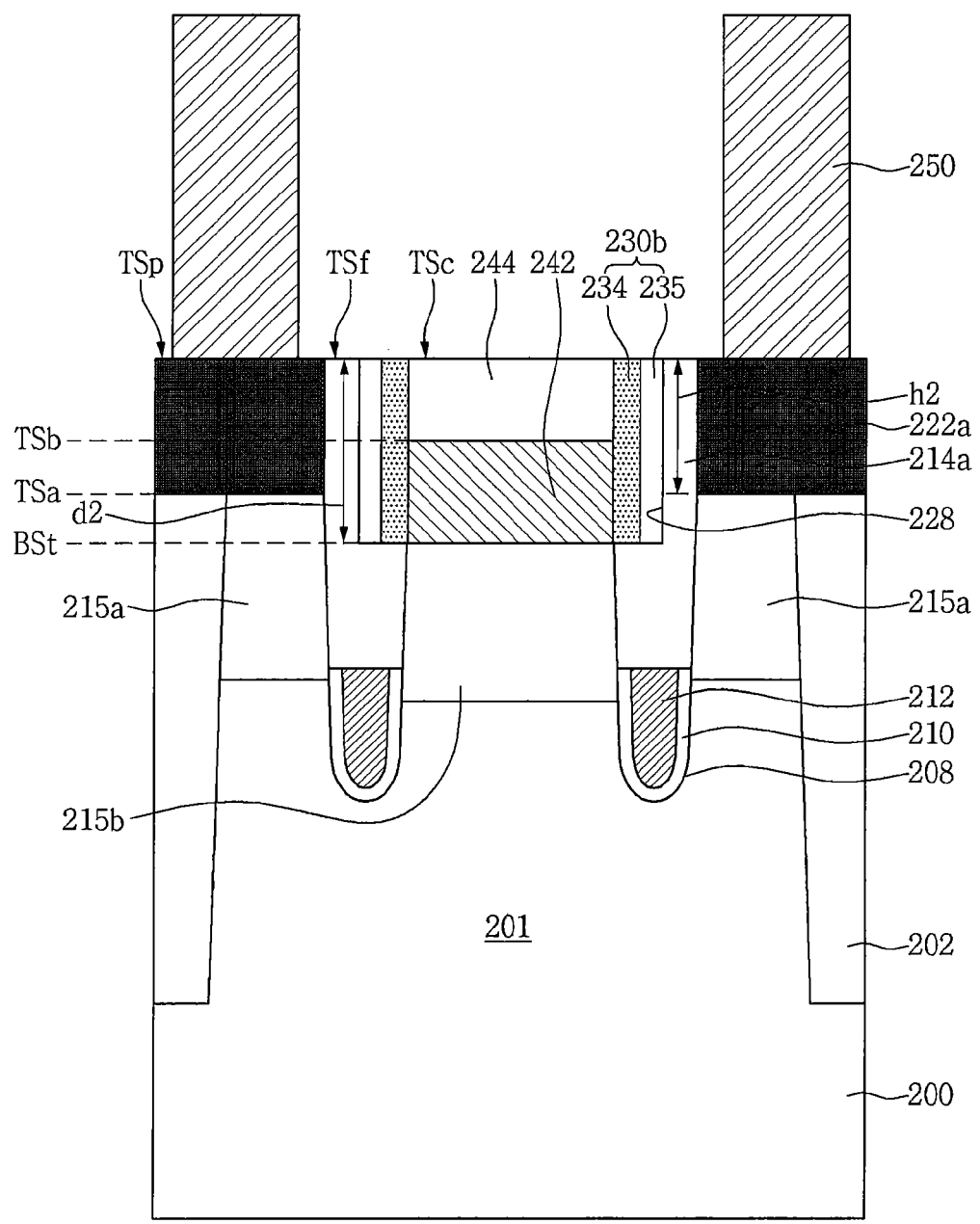

Referring to FIG. 6, in the semiconductor device in accordance with another embodiment, a gate capping fence 214a covering a top surface of a buried gate 212 formed in a substrate 200 may extend in a first direction along the buried gate 212, and protrude from a top surface TSa of an active area 201 by a second height h2.

A bit line trench 228 crossing the gate capping fences 214a and extending in the second direction perpendicular to the first direction may be formed in the gate capping fence 214a. The bit line trench 228 may be formed to have a second depth d2 greater than the protruding height h2 of the gate capping fence 214a.

As a top surface TSb of a bit line 242 in the bit line trench 228 may be located at a higher level than the top surface TSa of the active area 201, the bit line 242 may be formed as a structure partially buried in the substrate 200.

An insulator structure 230b extending in the first direction along an inner wall of the bit line trench 228 may be formed as a multi-layer structure having an insulating layer 234 and an air gap 235. The insulating layer 234 may include a low dielectric constant insulating material such as silicon oxide or the like.

Figure 7:
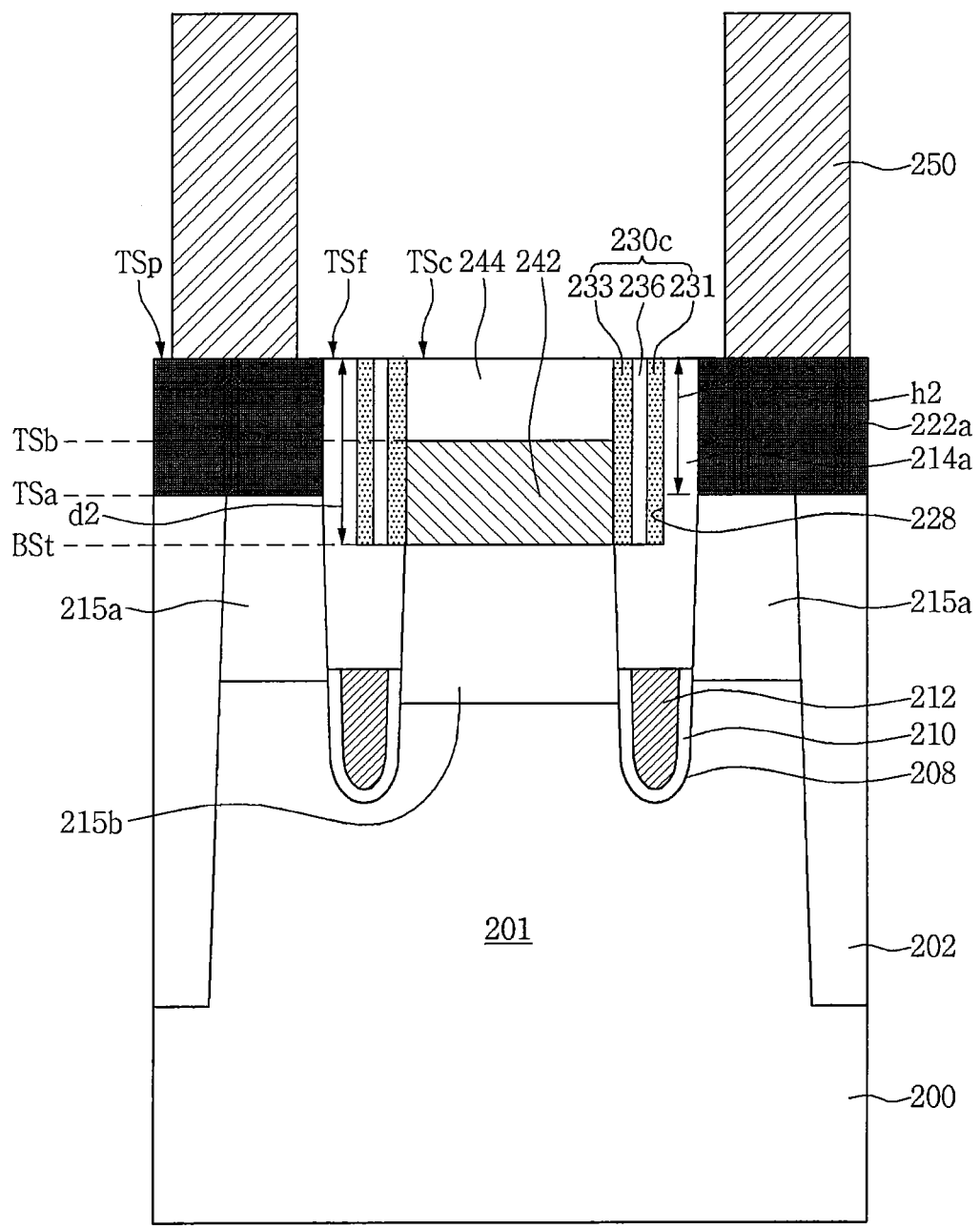

Referring to FIG. 7, in the semiconductor device in accordance with another embodiment, an insulator structure 230c extending in a first direction along an inner wall of a bit line trench 228 may be formed as a multi-layer structure having a first insulating layer 231, an air gap 236, and a second insulating layer 233. Each of the first and second insulating layers 231 and 233 may include a low dielectric constant insulating material such as silicon oxide or the like.

The bit line trench 228 may be formed to have a second depth d2 greater than a protruding height h2 of a gate capping fence 214a. As a top surface TSb of a bit line 242 formed in the bit line trench 228 may be located at a higher level than a top surface TSa of an active area 201, the bit line 242 may be formed as a structure partially buried in the substrate 200.

Figure 8:
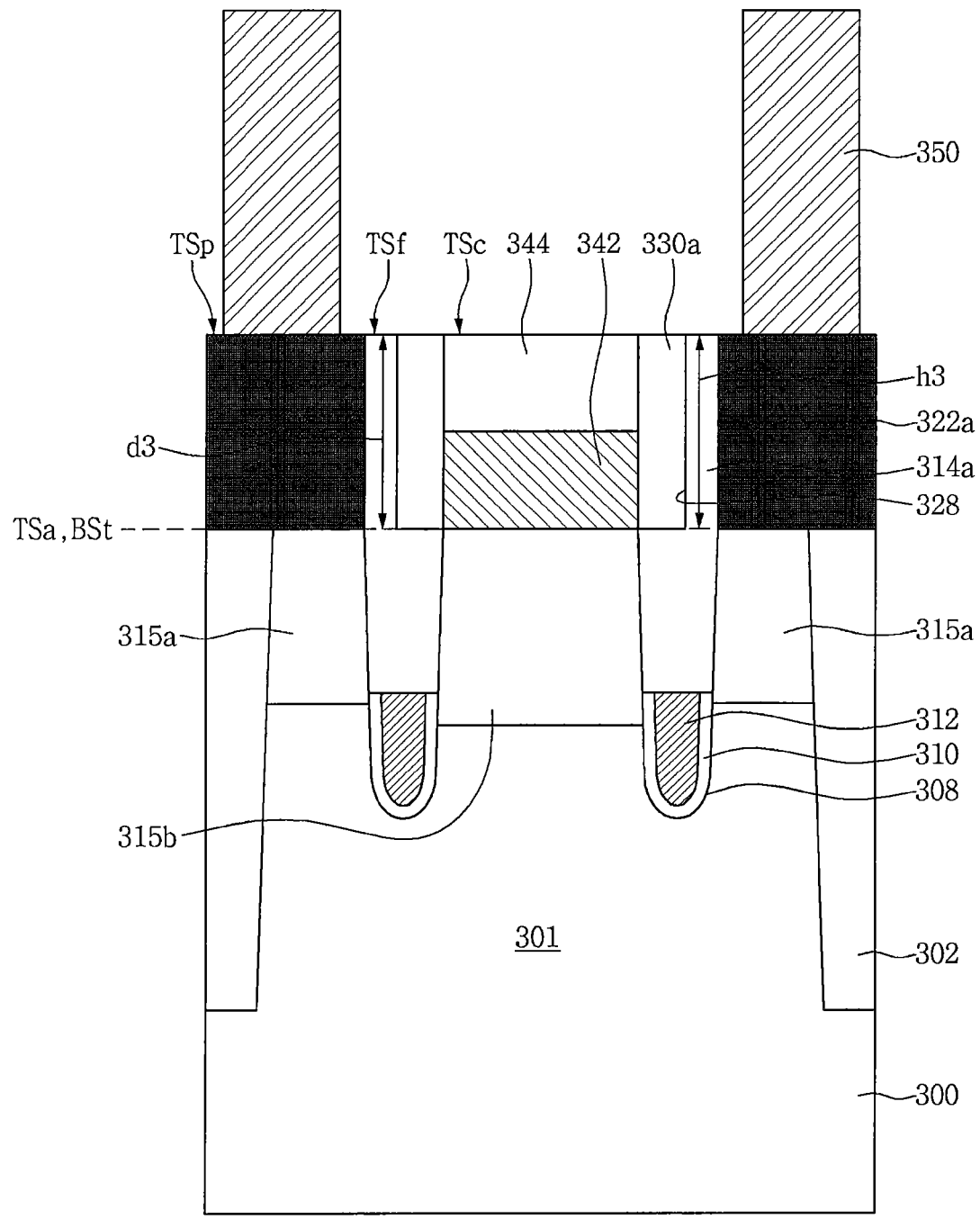

Referring to FIG. 8, the semiconductor device in accordance with another embodiment may include a substrate 300 having active areas 301 defined by a field area 302. Buried gates 312 extending in a first direction may be formed in the substrate 300. Bit lines 342 extending in a second direction perpendicular to the first direction may be formed in the substrate 300. Contact pads 322a may be formed on the substrate 300 between the adjacent bit lines 342. Lower electrodes 350 of a capacitor may be formed on each contact pad 322a.

The buried gate 312 may be formed in a lower part of a gate trench 308 extending in the first direction and formed in the substrate 300 with a gate insulating layer 310 therebetween. An upper part of the gate trench 308 may be filled with a gate capping fence 314a over the buried gate 312. The gate capping fence 314a may be formed to have a line shape extending in the first direction along the buried gate 312, and protrude from a top surface TSa of the active area 301 by a third height h3.

First and second impurity areas 315a and 315b provided as source/drain areas of a cell transistor may be formed in the active areas 301 on both sides of each buried gate 312. The first impurity area 315a may be formed in the active area 301 between the buried gate 312 and the field area 302. The first impurity area 315a may be electrically connected to the lower electrode 350 of the capacitor through the contact pad 322a. The second impurity area 315b may be formed in the active area 301 between a pair of buried gates 312. The second impurity area 315b may be electrically connected to the bit line 342. For example, the second impurity area 315b may be formed deeper than the first impurity area 315a.

A bit line trench 328 crossing the gate capping fence 314a and extending in the second direction perpendicular to the first direction may be formed in the gate capping fence 314a. The bit line trench 328 may expose at least some areas of the substrate 300 between the adjacent gate capping fences 314a. An insulator structure 330a may be formed along an inner wall of the bit line trench 328. The bit line trench 328 may be filled with the bit line 342 and a bit line capping pattern 344.

The bit line trench 328 may be formed to have a third depth d3 the same as the protruding height h3 of the gate capping fence 314a, and a bottom surface BSt thereof may be located at the same level as the top surface TSa of the active area 301. The bit line 342 in the bit line trench 328 may be formed on the substrate 300.

The insulator structure 330a may be formed by an insulating layer having a low dielectric constant, e.g., silicon oxide and the like, or an air gap, or both, to reduce parasitic capacitance between the bit line 342 and the lower electrode 350 of the capacitor.

The contact pad 322a may be self-aligned with the gate capping fence 314a. For example, the contact pad 322a may be electrically connected to the first impurity area 315a in the active area 301. The lower electrode 350 of the capacitor may be directly formed on the contact pad 322a, which is self-aligned with the gate capping fence 314a, without a contact hole, to thereby prevent contact misalignment.

Due to the gate capping fence 314a and the insulator structure 330a, scaling down of the semiconductor device can be implemented to sufficiently ensure a distance between the lower electrode 350 of the capacitor and the bit line 342.

Figure 9:
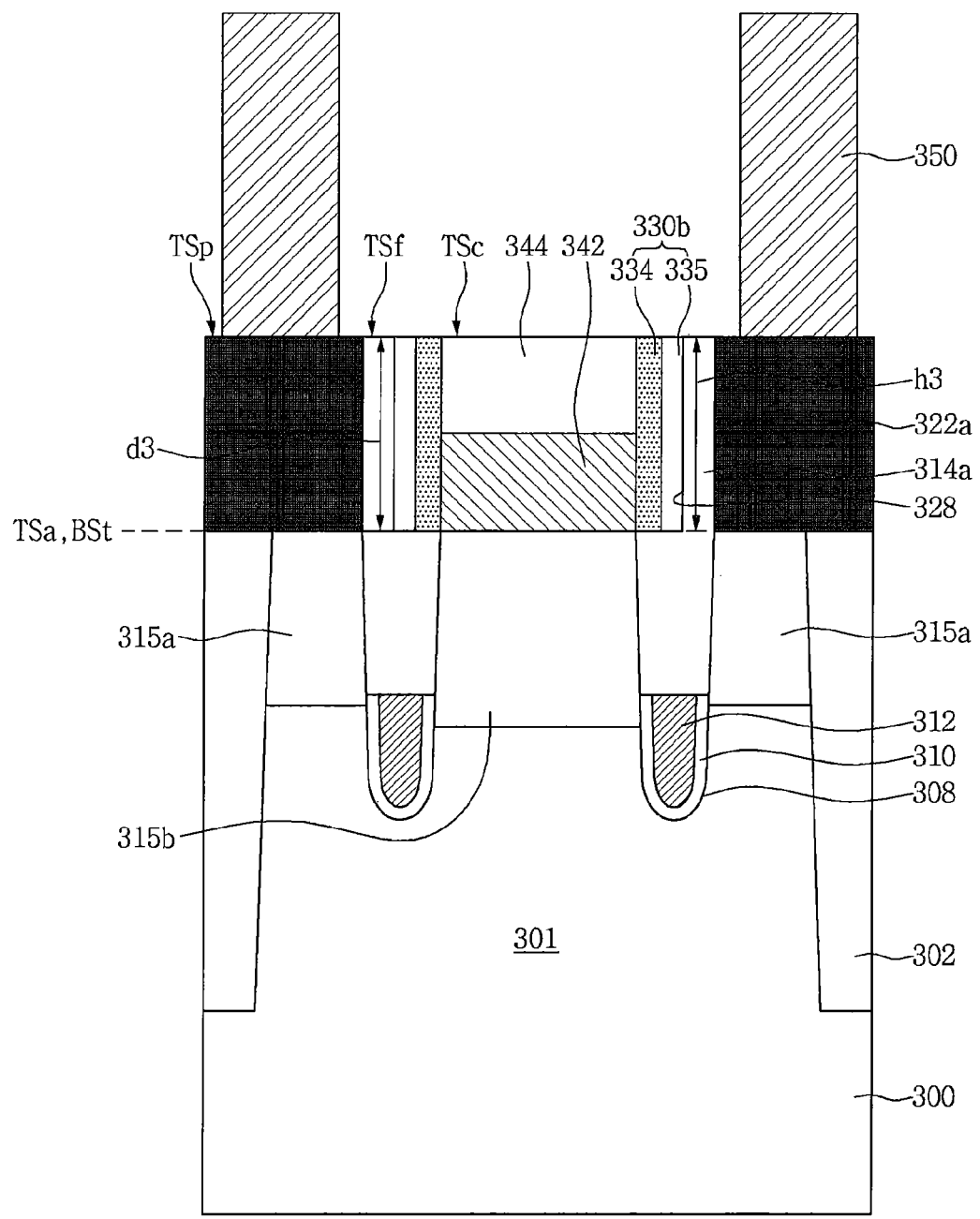

Referring to FIG. 9, in the semiconductor device in accordance with another embodiment, a gate capping fence 314a covering a top surface of a buried gate 312 formed in a substrate 300 may extend in a first direction along the buried gate 312, and protrude from a top surface TSa of an active area 301 by a third height h3.

A bit line trench 328 extending in a second direction perpendicular to the first direction may be formed in the gate capping fence 314a to expose at least some areas of the substrate 300 between the adjacent gate capping fences 314a. The bit line trench 328 may be formed to have a third depth d3 the same as the protruding height h3 of the gate capping fence 314a. A bottom surface BSt of the bit line trench 328 may be located at the same level as the top surface TSa of the active area 301. The bit line 342 in the bit line trench 328 may be formed on the substrate 300.

An insulator structure 330b extending in the first direction along an inner wall of the bit line trench 328 may be formed as a multi-layer structure having an insulating layer 334 and an air gap 335. The insulating layer 334 may include a low dielectric constant insulating material such as silicon oxide or the like.

Figure 10:
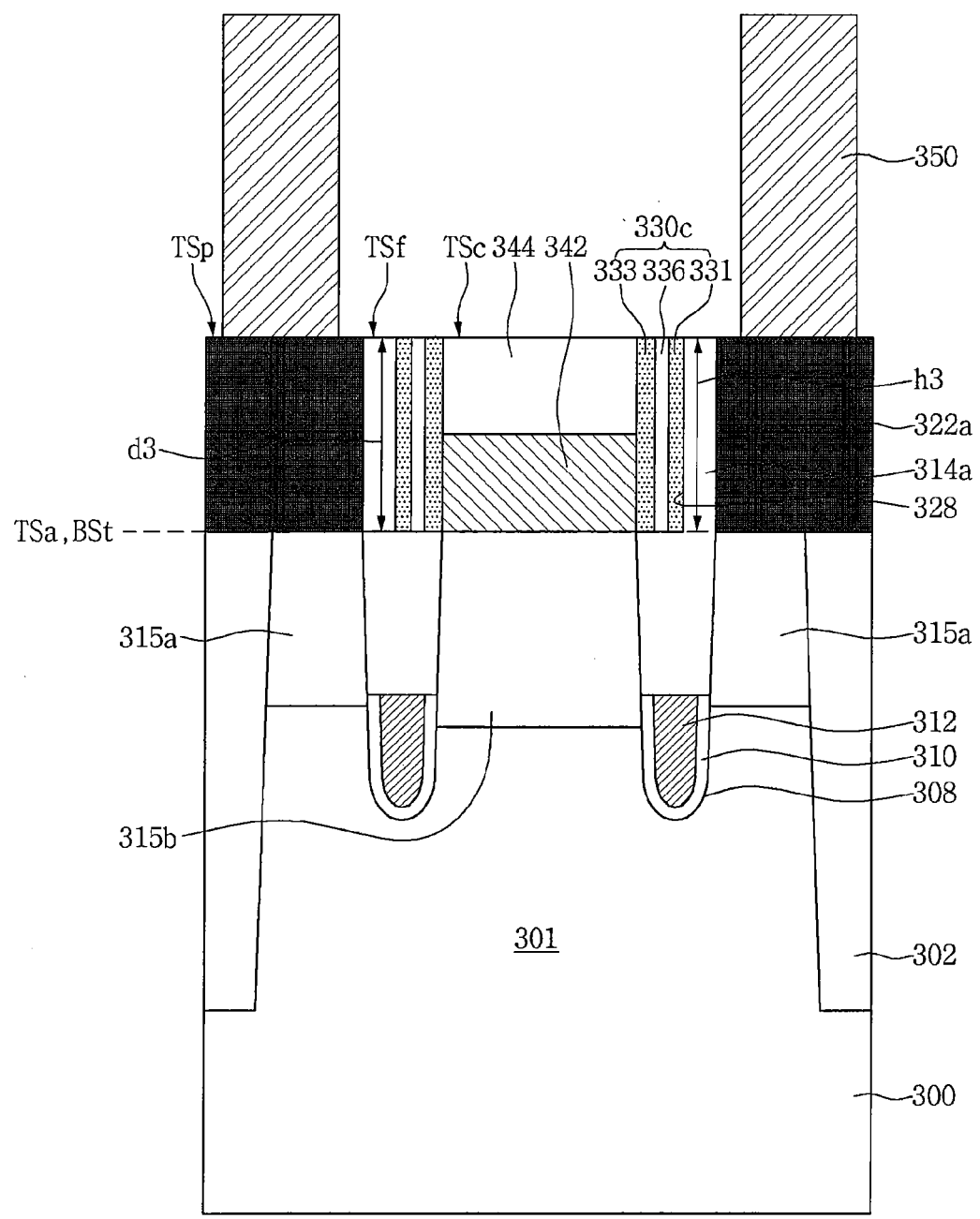
Figure 11A:
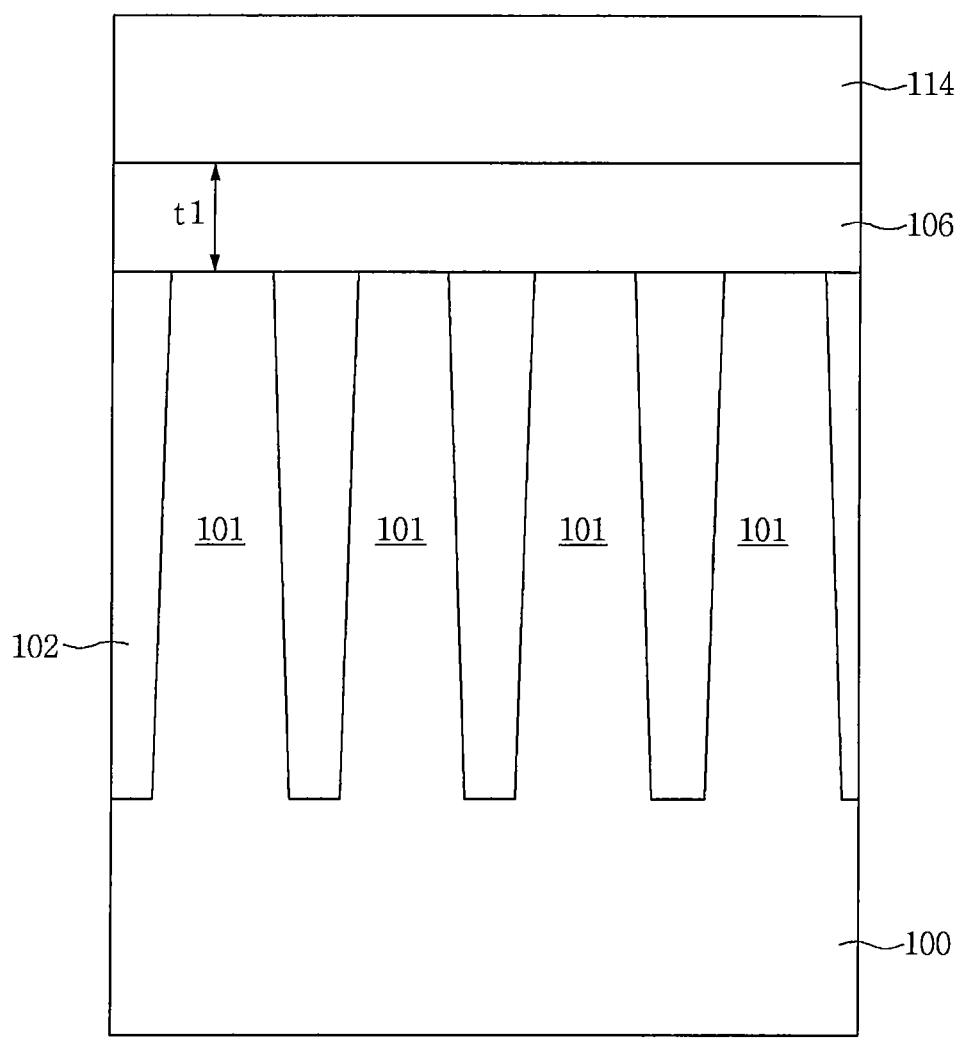
FIGS. 11A to 19D and 20 to 27 are cross-sectional views and plan views of a method of manufacturing a semiconductor device in accordance with an embodiment, and the drawings A, B, C, and D included in each of the FIGS. 11 to 19 are cross-sectional views taken along lines I-I', II-II', III-III', and IV-IV' of FIG. 1, respectively.
Figure 11B:
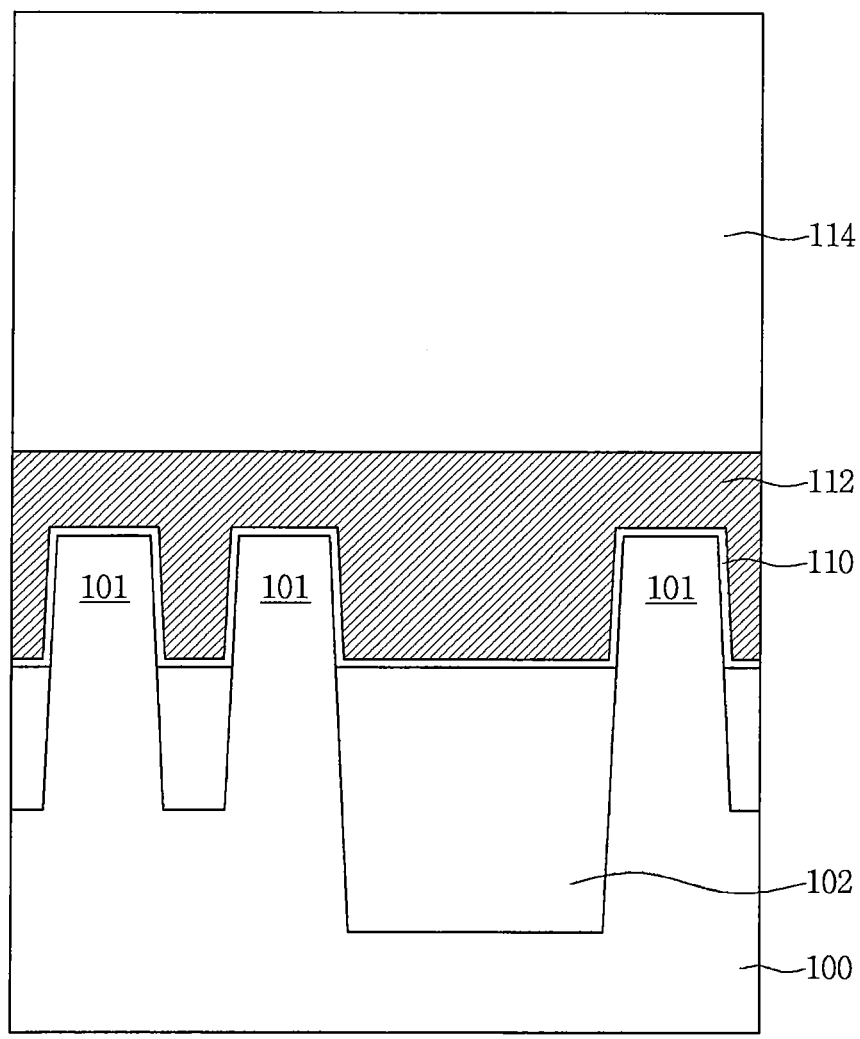
Figure 11C:
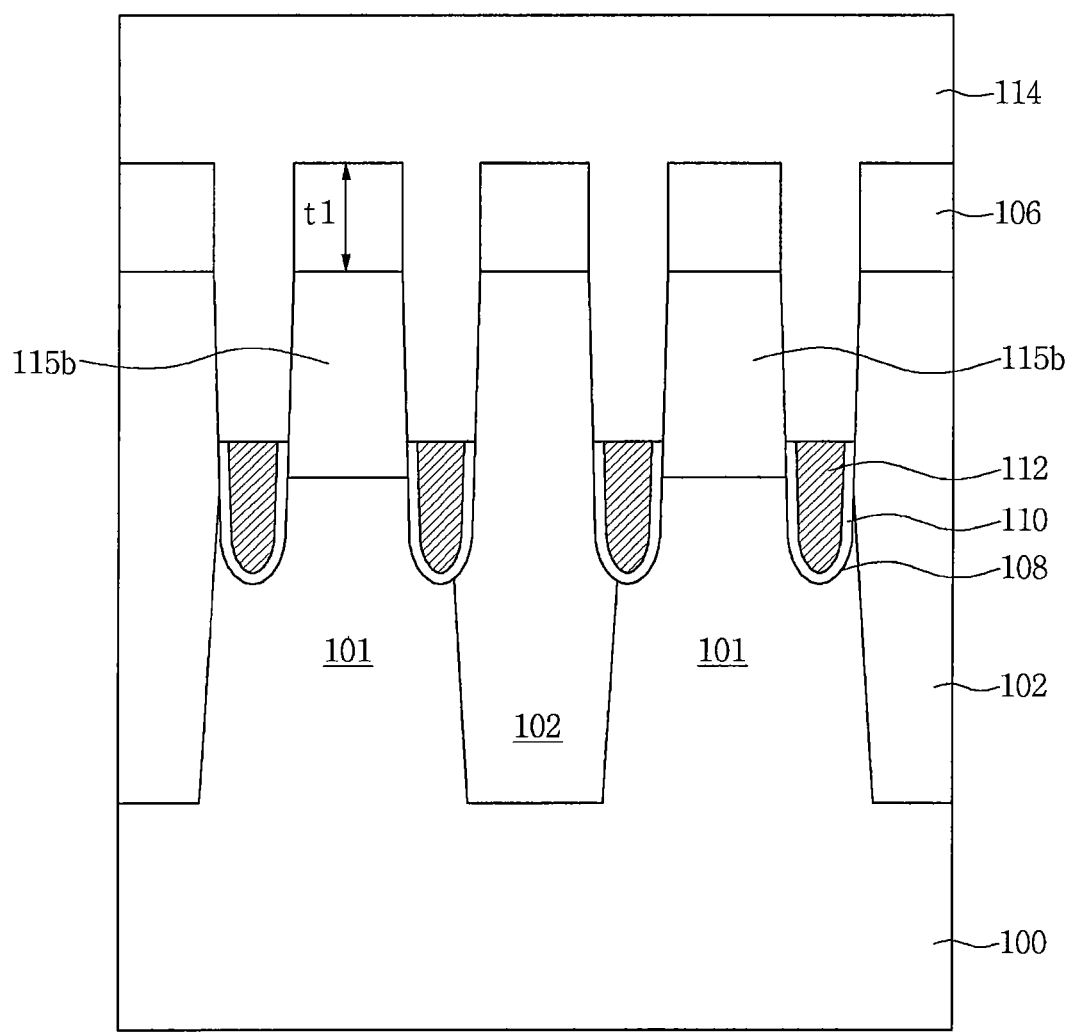
Figure 11D:
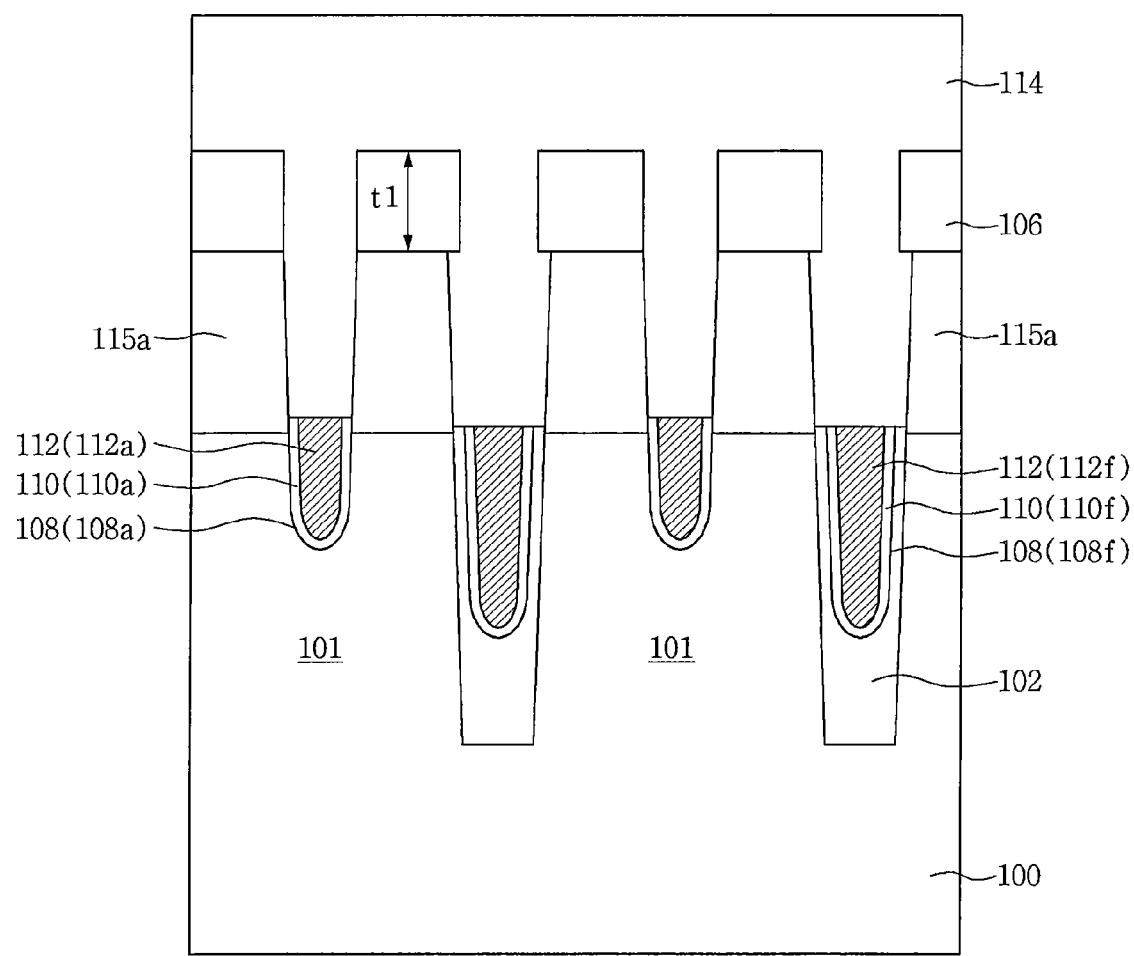

Referring to FIG. 10, in the semiconductor device in accordance with another embodiment, an insulator structure 330c extending in a first direction along an inner wall of a bit line trench 328 may be formed as a multi-layer structure having a first insulating layer 331, an air gap 336, and a second insulating layer 333. Each of the first and second insulating layers 331 and 333 may include a low dielectric constant insulating material such as silicon oxide or the like.

The bit line trench 328 may be formed to have a third depth d3 the same as a protruding height h3 of the gate capping fence 314a. A bottom surface BSt of the bit line trench 328 may be located at the same level as a top surface TSa of an active area 301. The bit line 342 in the bit line trench 328 may be formed on the substrate 300.

Hereinafter, methods of manufacturing semiconductor devices in accordance with various embodiments will be described.

FIGS. 11A to 19D and 20 to 27 are cross-sectional views and plan views of a method of manufacturing a semiconductor device in accordance with an embodiment. Here, the drawings A, B, C, and D included in each of the FIGS. 11 to 19 are cross-sectional views showing a memory cell area of a semiconductor device taken along lines I-I', II-II', III-III', and IV-IV' of FIG. 1, respectively.

Referring to FIGS. 11A to 11D, and 20, a substrate 100 may have a semiconductor substrate. For example, the substrate 100 may have a silicon substrate, a germanium substrate, a silicon-germanium substrate, or the like.

Field areas 102 defining active areas 101 may be formed on the substrate 100 by performing an isolation process. Each active area 101 may be formed to have a major axis and a minor axis, and arranged two-dimensionally in directions of the major and minor axes. For example, each active area 101 may have a bar shape in which a length is greater than a width. The field area 102 may be formed by performing a shallow trench isolation process. For example, a field trench may be formed by partially etching the substrate 100 and filled with a field insulating layer, to form the field area 102. The field insulating layer may include a single layer of silicon oxide, or a composite layer having silicon oxide and silicon nitride according to a size of the field trench.

First and second impurity areas 115a and 115b provided as source/drain areas of a cell transistor may be formed in the active area 101 by performing an ion implanting process.

A buried gate forming process may be performed on the substrate 100.

First, a gate mask pattern 106 defining a buried gate forming area may be formed on the substrate 100. The gate mask pattern 106 may be formed to have a first thickness t1, and may include silicon oxide.

Line-shaped gate trenches 108 extending in a first direction may be formed in the substrate 100 by partially etching the active areas 101 and the field area 102 of the substrate 100 using the gate mask pattern 106 as an etch mask. Each gate trench 108 may include an active gate trench 108a crossing the active area 101, and a field gate trench 108f in the field area 102.

The active gate trench 108a and the field gate trench 108f may have bottom surfaces at different levels. For example, the bottom surface of the active gate trench 108a may be located at a higher level than the bottom surface of the field gate trench 108f.

The gate trench 108 may have a bottom surface located at a lower level than the first and second impurity areas 115a and 115b. The first and second impurity areas 115a and 115b may be spaced-apart from each other by the gate trench 108. The first impurity area 115a may be located in the active area 101 between the active gate trench 108a and the field area 102. The second impurity area 115b may be located in the active area 101 between the active gate trenches 108a. For example, the second impurity area 115b may be formed deeper than the first impurity 115a.

A gate insulating layer 110 may be conformally formed on an inner wall of each gate trench 108 by performing a thermal oxidation process. The gate insulating layer 110 may include an active gate insulating layer 110a on the active gate trench 108a, and a field insulating layer 110f on the field gate trench 108f. In some cases, the gate insulating layer 110 may be formed only on an inner wall of the active gate trench 108a. The gate insulating layer 110 may include silicon oxide.

A gate conductive layer may be deposited on the substrate 100 to fill the gate trenches 108. Buried gates 112 may be formed in a lower part of the gate trench 108 by performing an etch-back process to the gate conductive layer. Each buried gate 112 may include an active gate 112a in the active gate trench 108a, and a field gate 112f in the field gate trench 108f. A bottom surface of the active gate 112a may be located at a higher level than a bottom surface of the field gate 112f. A top surface of the active gate 112a may be located at a level substantially the same as or similar to a top surface of the field gate 112f. The buried gate 112 may include poly-silicon, a metal or metal nitride, such as tungsten (W), tungsten nitride (WN), titanium (Ti), titanium nitride (TiN), tantalum (Ta), tantalum nitride (TaN), titanium aluminum nitride (TiAlN), tantalum aluminum nitride (TaAlN), or a composite layer thereof.

A gate capping layer 114 may be formed on the buried gates 112 and the substrate 100 to fill upper parts of the gate trenches 108. The gate capping layer 114 may include silicon nitride.

Referring to FIGS. 12A to 12D, and 21, line-shaped gate capping fences 114a covering top surfaces of the buried gates 112 and extending in the first direction may be formed by partially removing an upper part of the gate capping layer 114 with a planarization process such as an etch-pack process or a CMP process until a top surface of the gate mask pattern 106 is exposed.

The gate mask pattern 106 may be removed by performing a wet etching process or the like.

Each gate capping fence 114a may be formed to have a structure protruding from a top surface TSa of the active area 101 by a first height h1. The protruding height h1 of the gate capping fence 114a may be substantially the same as or similar to the thickness t1 of the gate mask pattern 106. The protruding height of the gate capping fence 114a may be controlled by the thickness of the gate mask pattern 106.

A cell transistor, which includes a gate structure having the gate trench 108, the gate insulating layer 110, the buried gate 112, and the gate capping fence 114a, and the first and second impurity areas 115a and 115b provided as the source/drain, may be completely formed by performing the process described in FIGS. 11 and 12.

The first impurity area 115a formed between the buried gate 112 and the field area 102 may be electrically connected to a contact pad to be formed in a subsequent process. The second impurity area 115b formed between a pair of buried gates 112 crossing one active area 101 may be electrically connected to a bit line to be formed in a subsequent process.

Figure 12A:
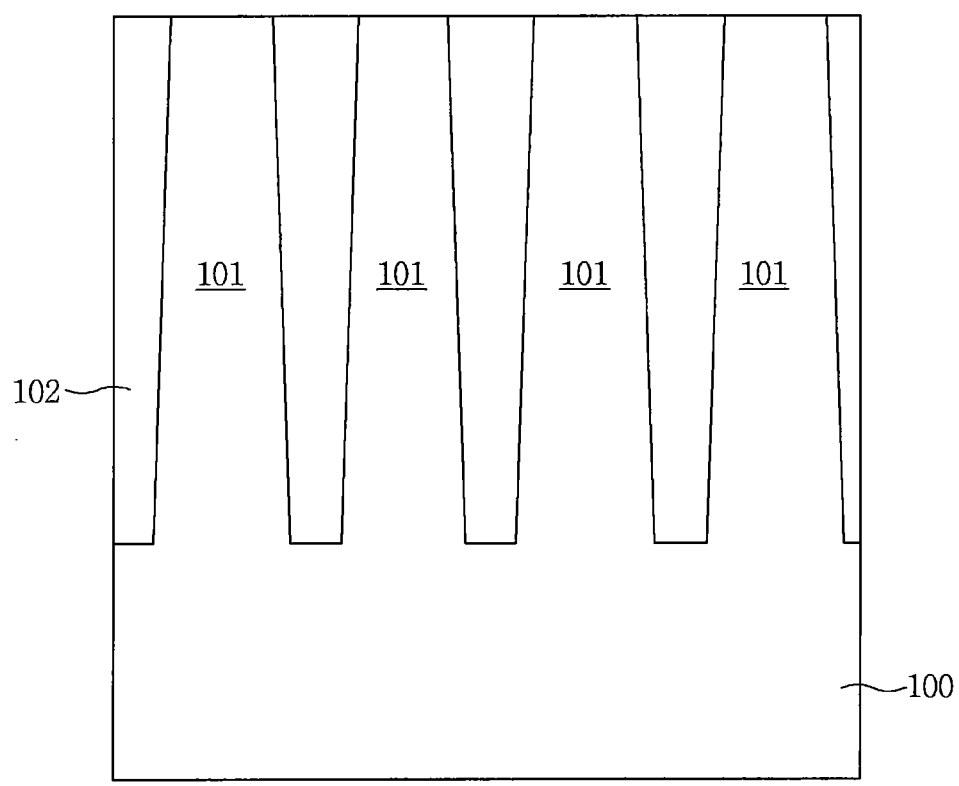
Figure 12B:
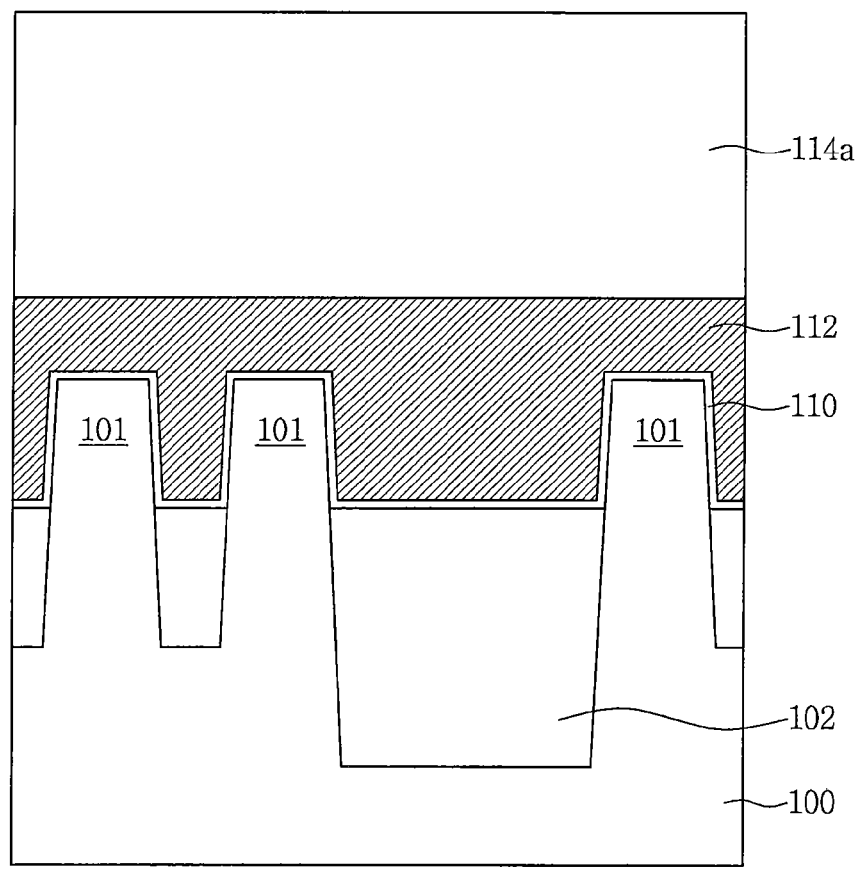
Figure 12C:
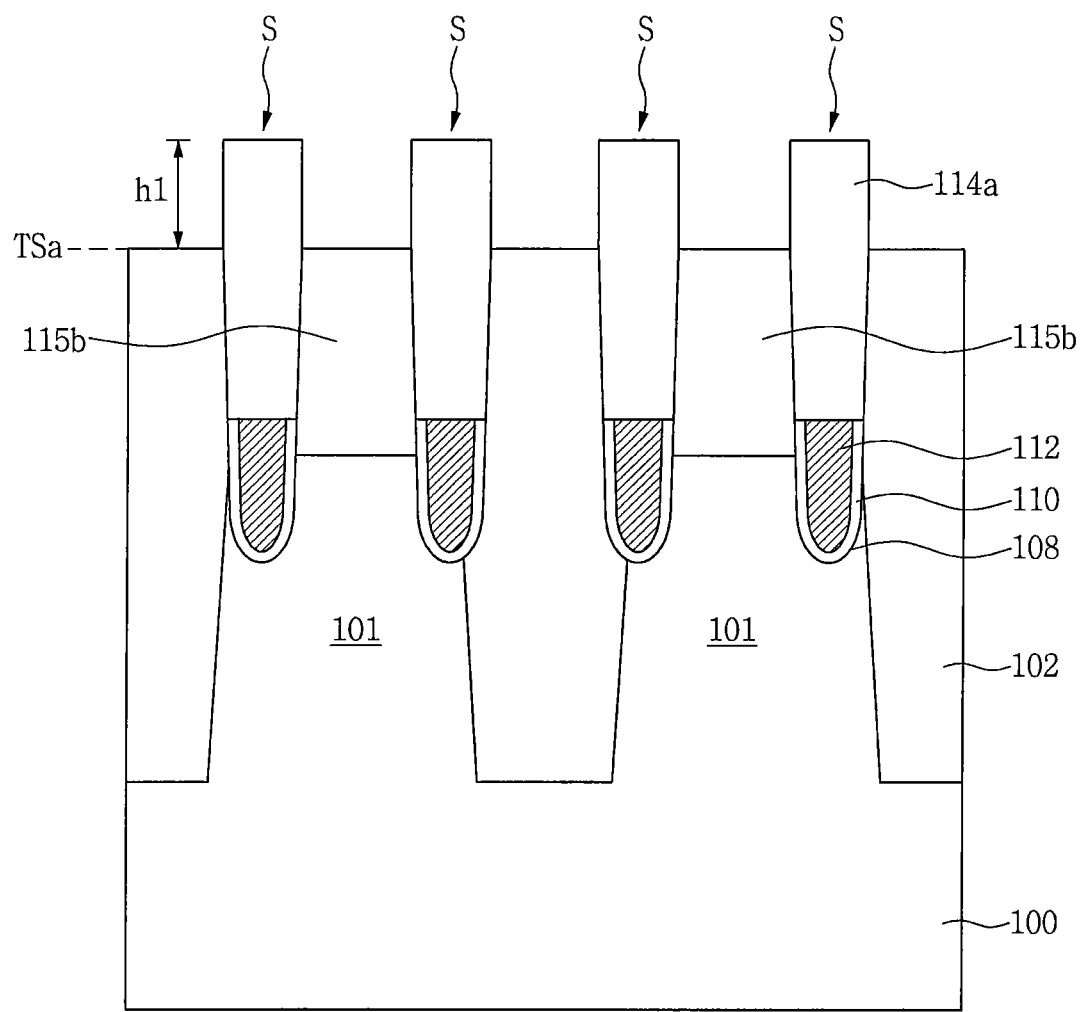
Figure 12D:
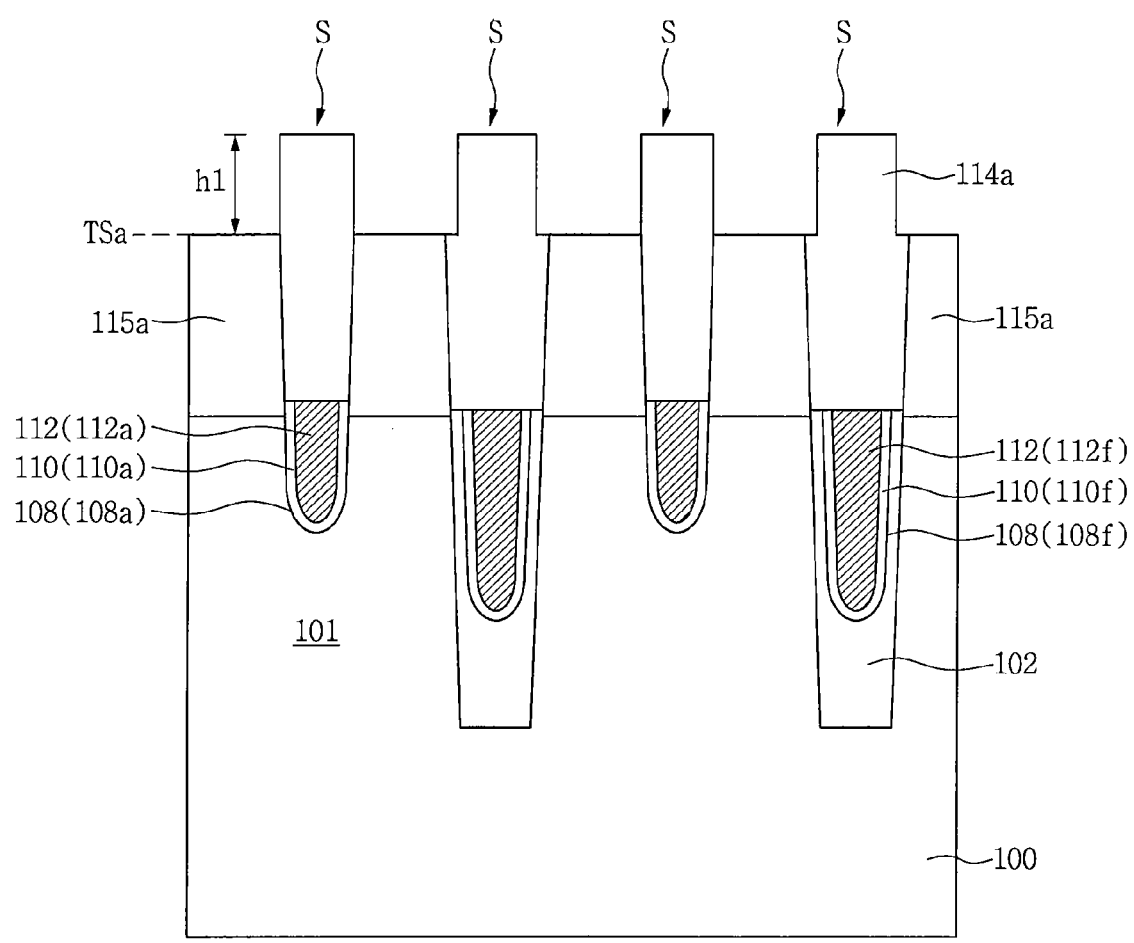

FIGS. 12C and 12D may also be regarded as illustrating forming spaced-apart line-shaped structures S that extend in a first direction of a substrate 100. The spaced-apart line-shaped structures S comprise gate trenches 108 in the substrate 100 having buried gates 112 therein, and gate capping fences 114a thereon that protrude from the substrate 100.

Referring to FIGS. 13A to 13D, and 22, a pad conductive layer may be deposited on the substrate 100, in which the gate structure is formed. Line-shaped pad patterns 122 self-aligned with the gate capping fences 114a and extending in the first direction may be formed by partially removing an upper part of the pad conductive layer with a planarization process such as an etch-pack process or a CMP process until a top surface TSf of the gate capping fence 114a is exposed.

The top surface TSp of the line-shaped pad pattern 122 may be located at the same level as the top surface TSf of the gate capping fence 114a. The pad pattern 122 may include a metal such as tungsten (W), titanium nitride (TiN) or the like, doped poly-silicon, or a composite layer having a metal and poly-silicon.

In some cases, before forming the pad patterns 122, a metal silicide layer for an ohmic contact, or a barrier metal layer such as a metal oxide or the like may be formed on surfaces of the active areas 101 exposed by the gate capping fences 114a. Alternately, after forming the pad patterns 122, the metal silicide layer for the ohmic contact may be formed on a top surface of each pad pattern 122.

Figure 13A:
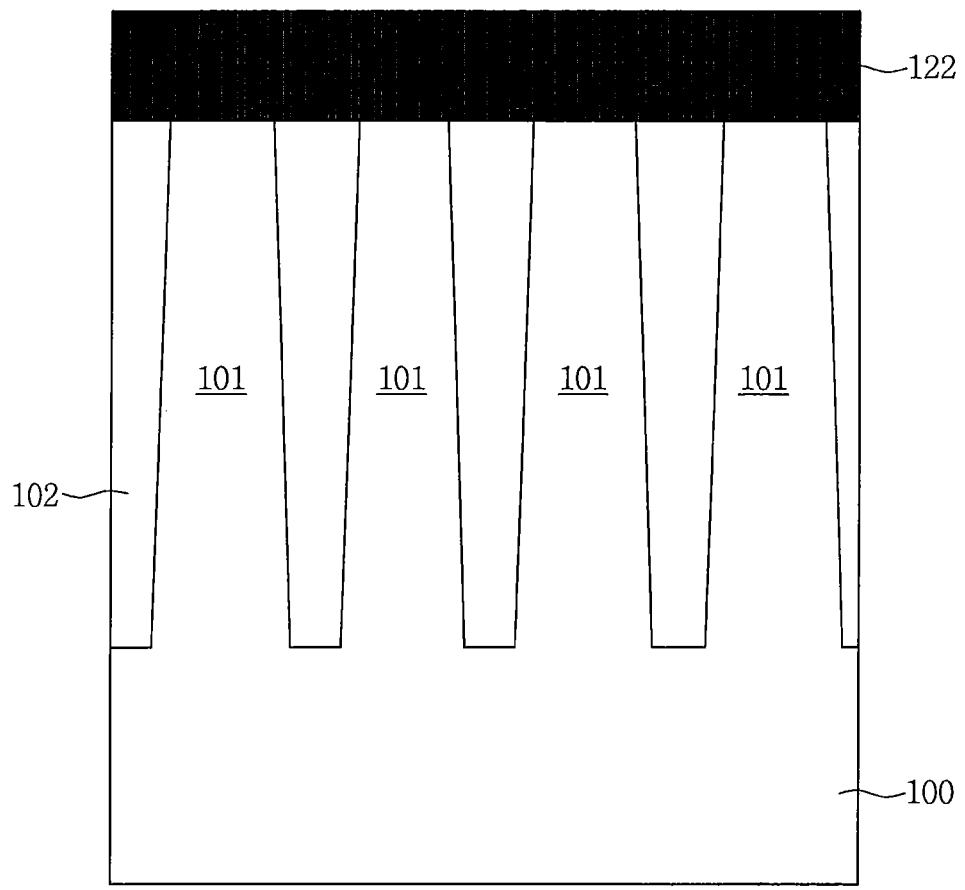
Figure 13B:
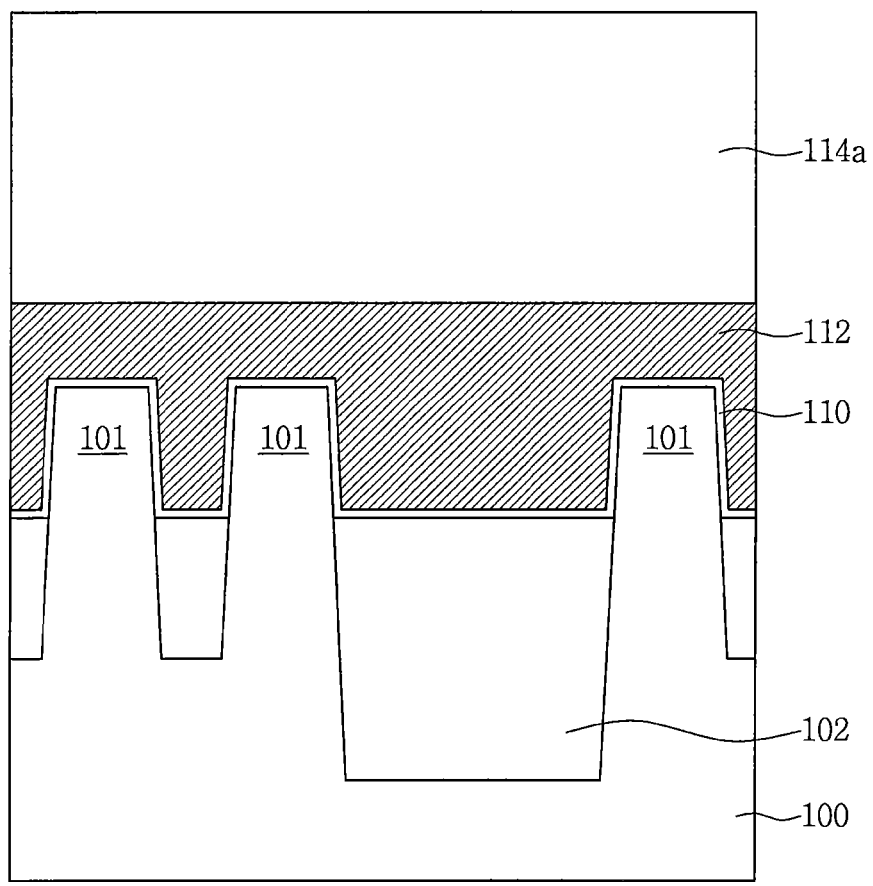
Figure 13C:
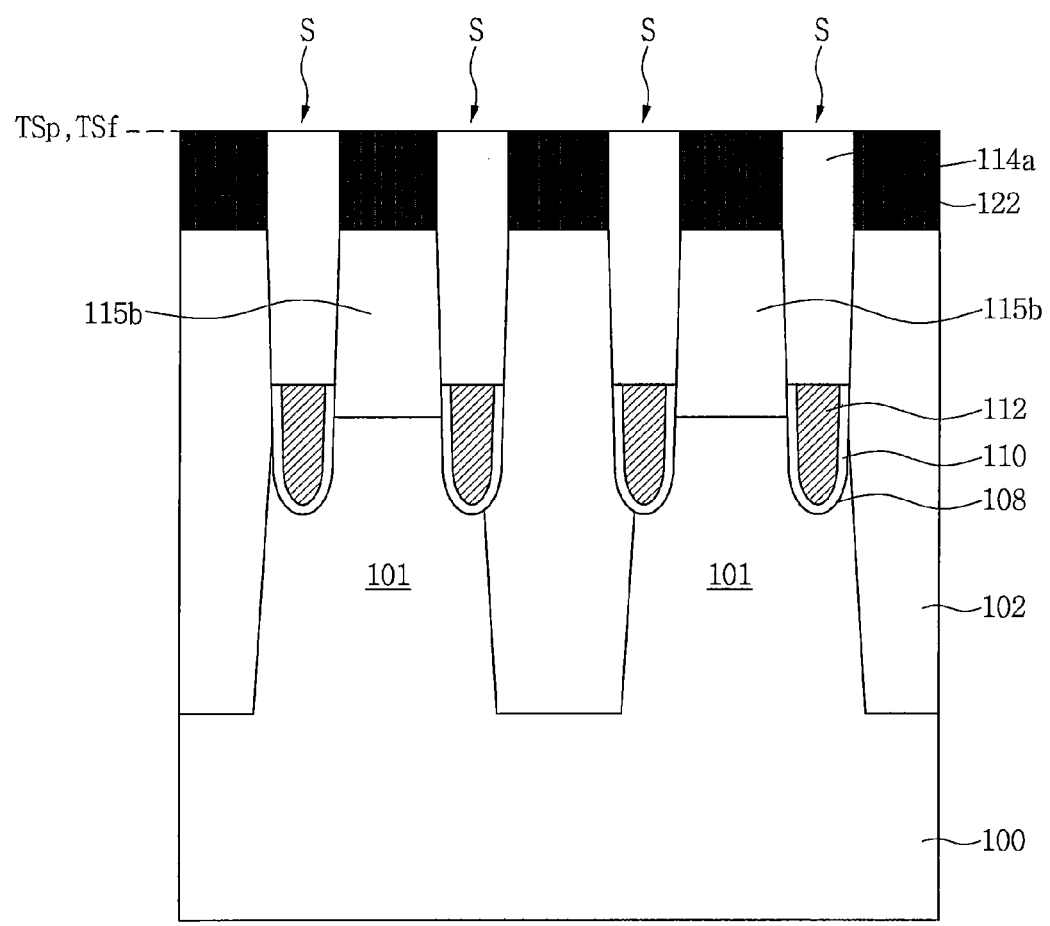
Figure 13D:
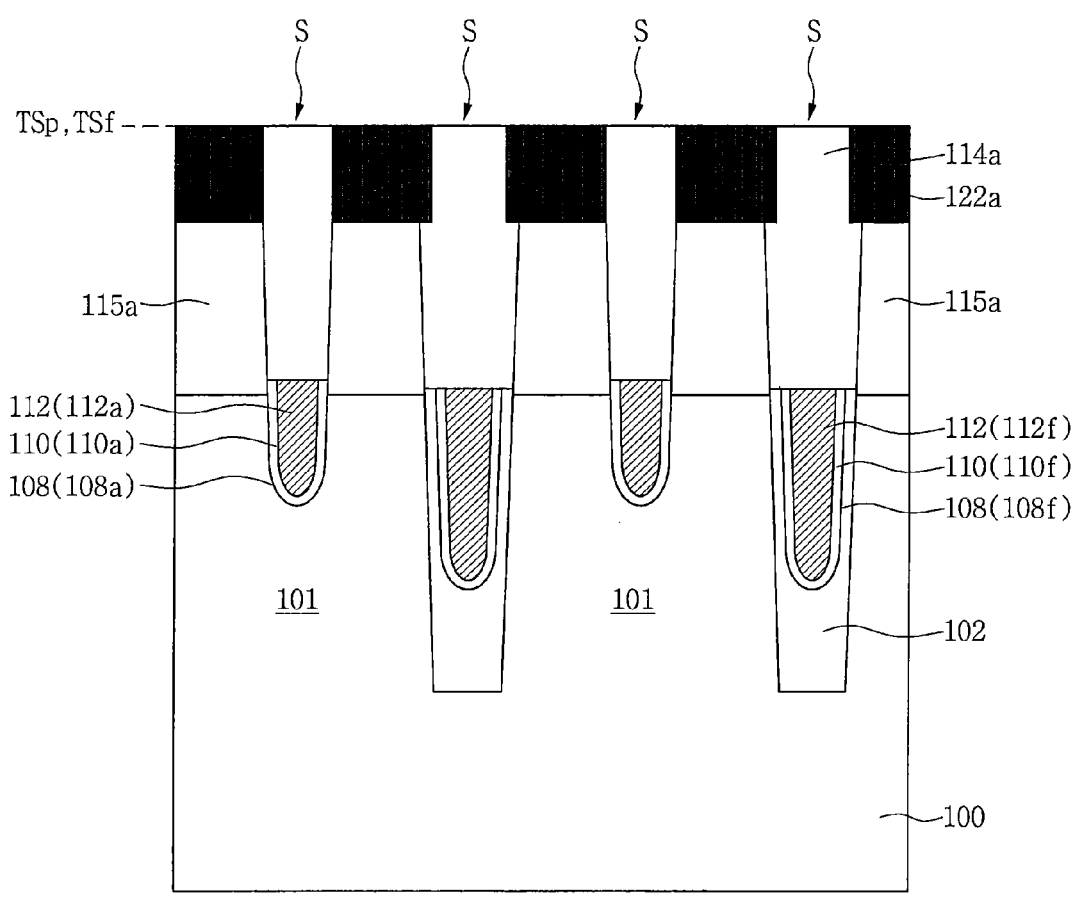

FIGS. 13C and 13D may also be regarded as illustrating forming line-shaped pad patterns 122 that extend in the first direction, between the spaced-apart line-shaped structures S.

Referring to FIGS. 14A to 14D, and 23, a first hard mask layer 124 may be formed on the substrate 100 in which the line-shaped pad patterns 122 are formed. The first hard mask layer 124 may include a material having an etch selectivity with respect to the pad pattern 122 and the gate capping fence 114a thereunder. For example, the first hard mask layer 124 may be formed by a carbon containing layer such as a spin on hard (SOH) mask. The SOH layer may be formed by performing a spin coating process.

Figure 14A:
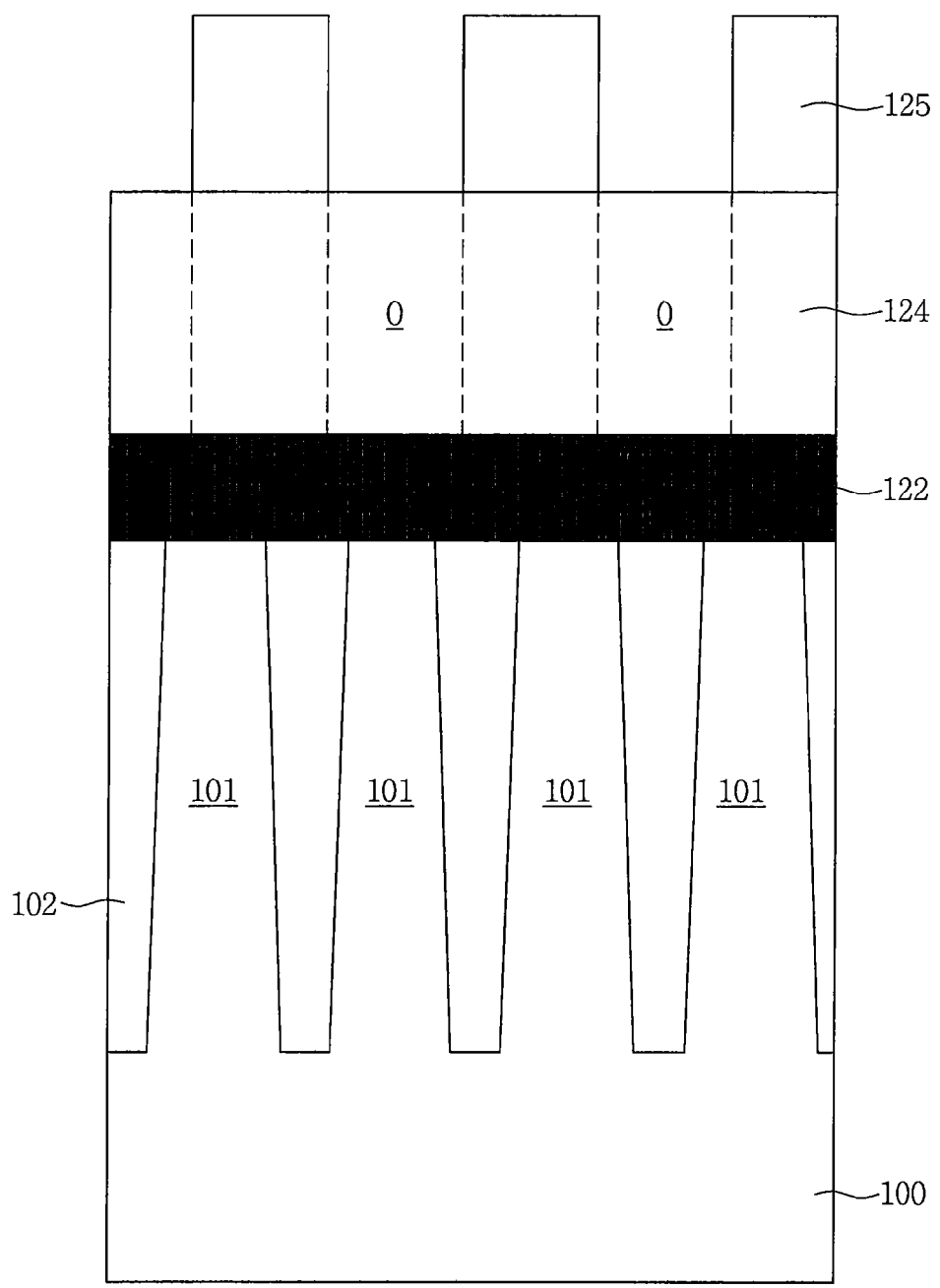
Figure 14B:
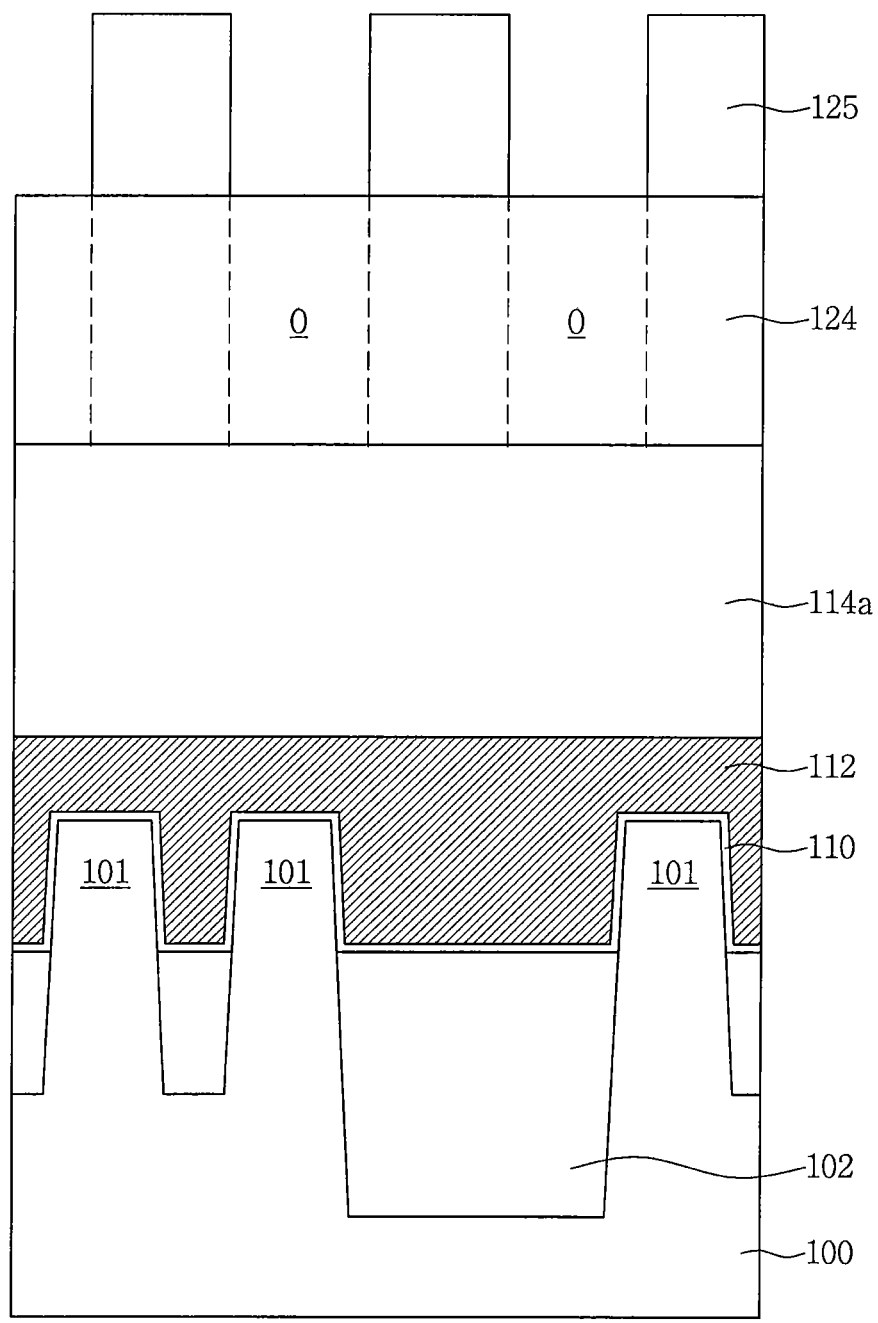
Figure 14C:
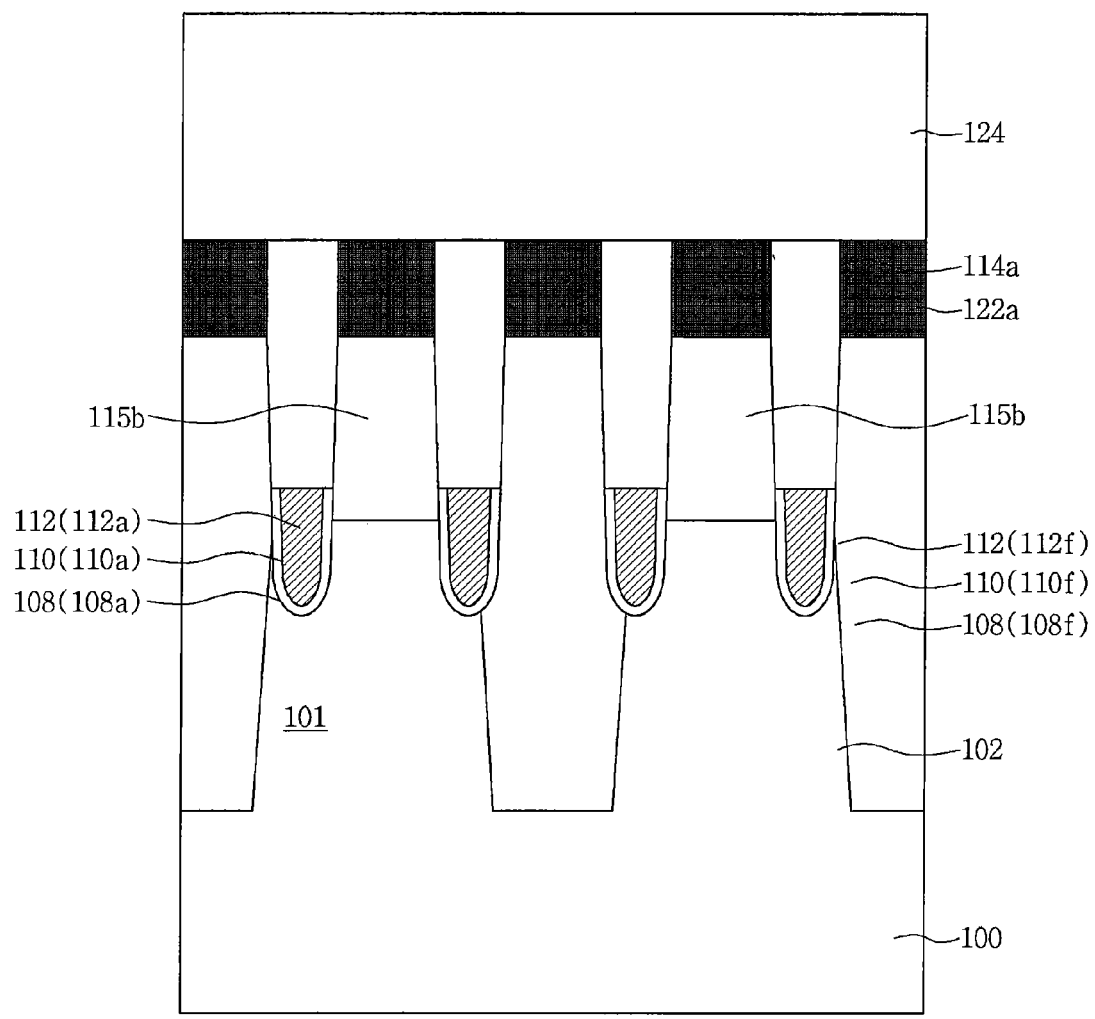
Figure 14D:
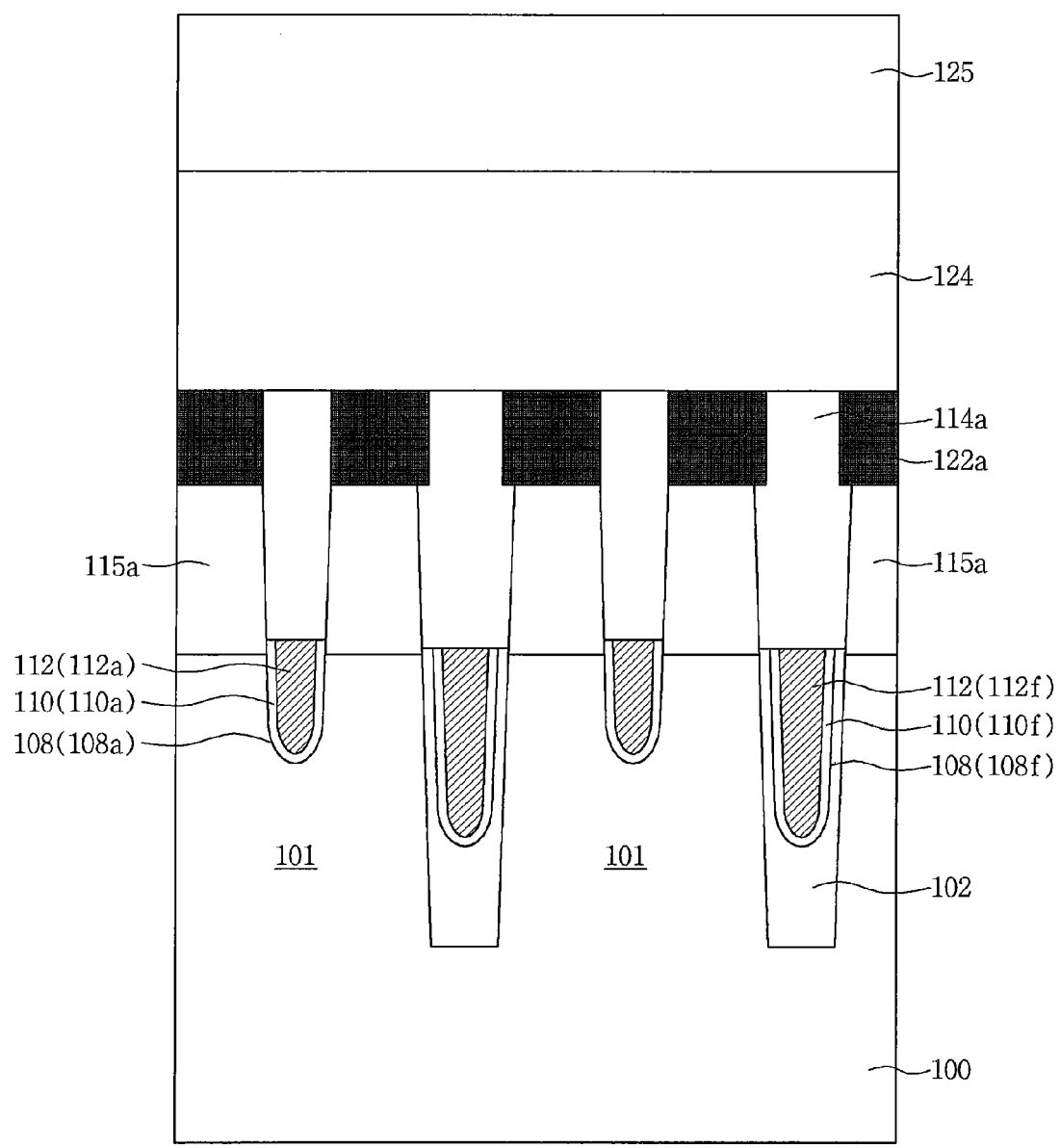
Figure 15A:
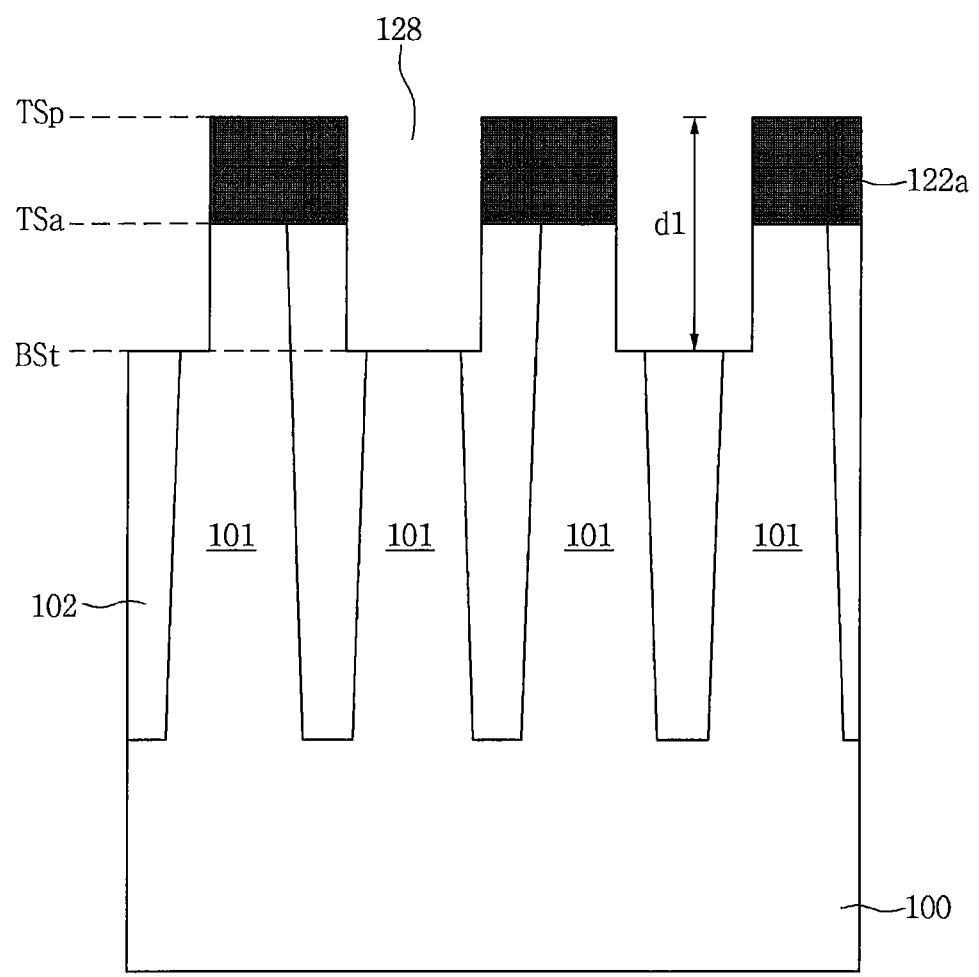
Figure 15B:
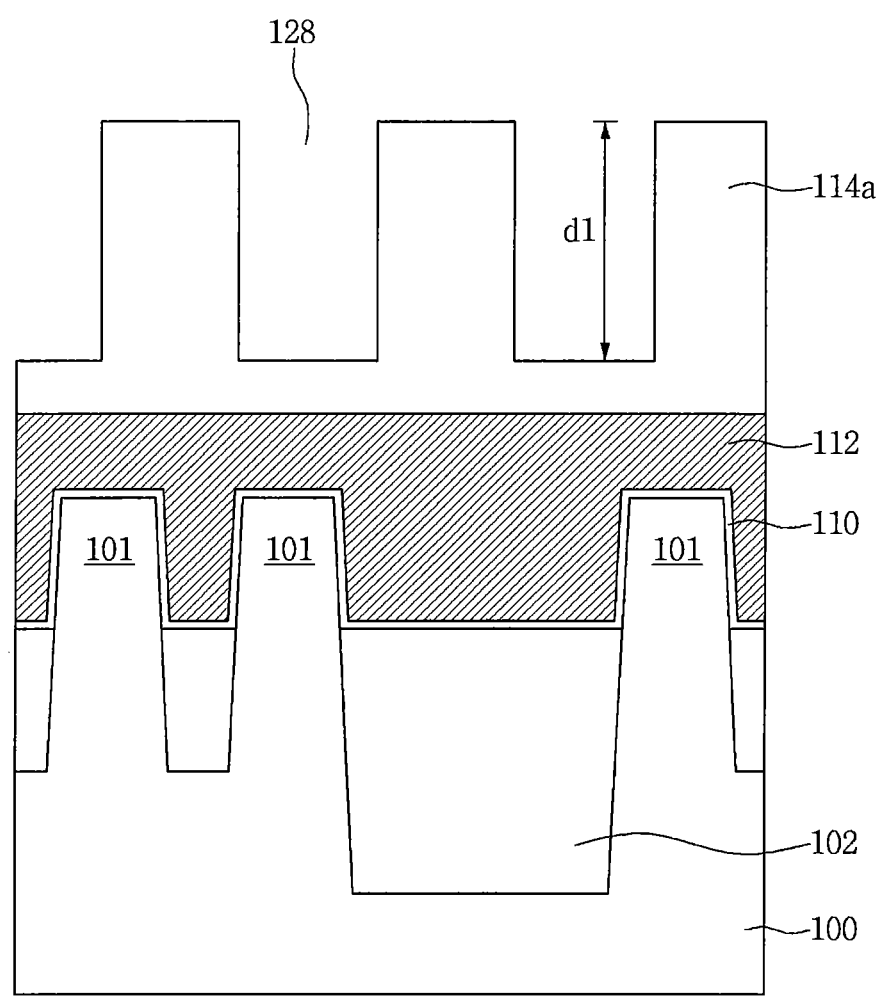
Figure 15C:
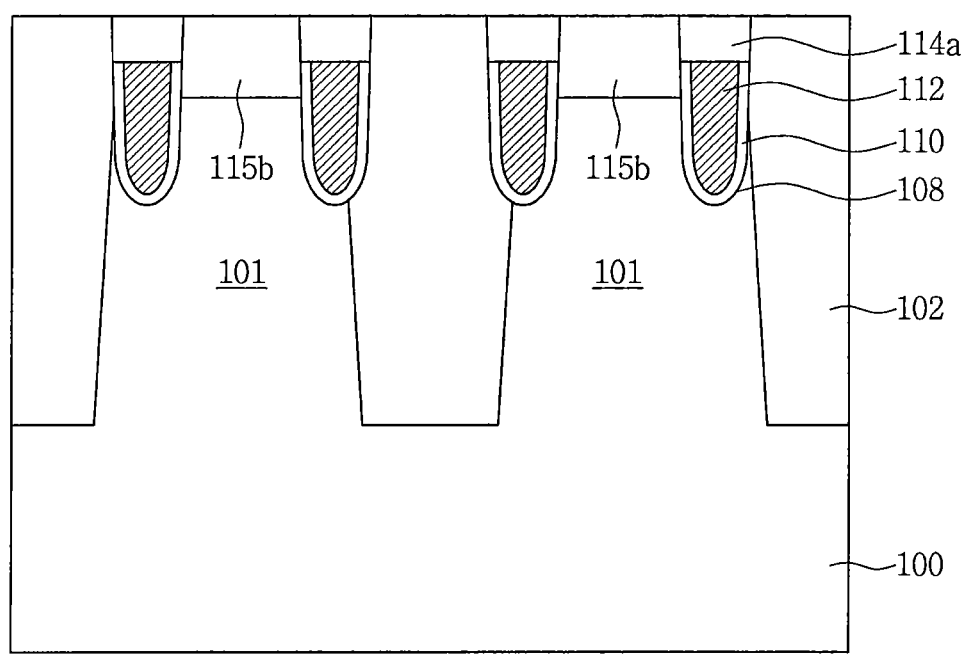
Figure 15D:
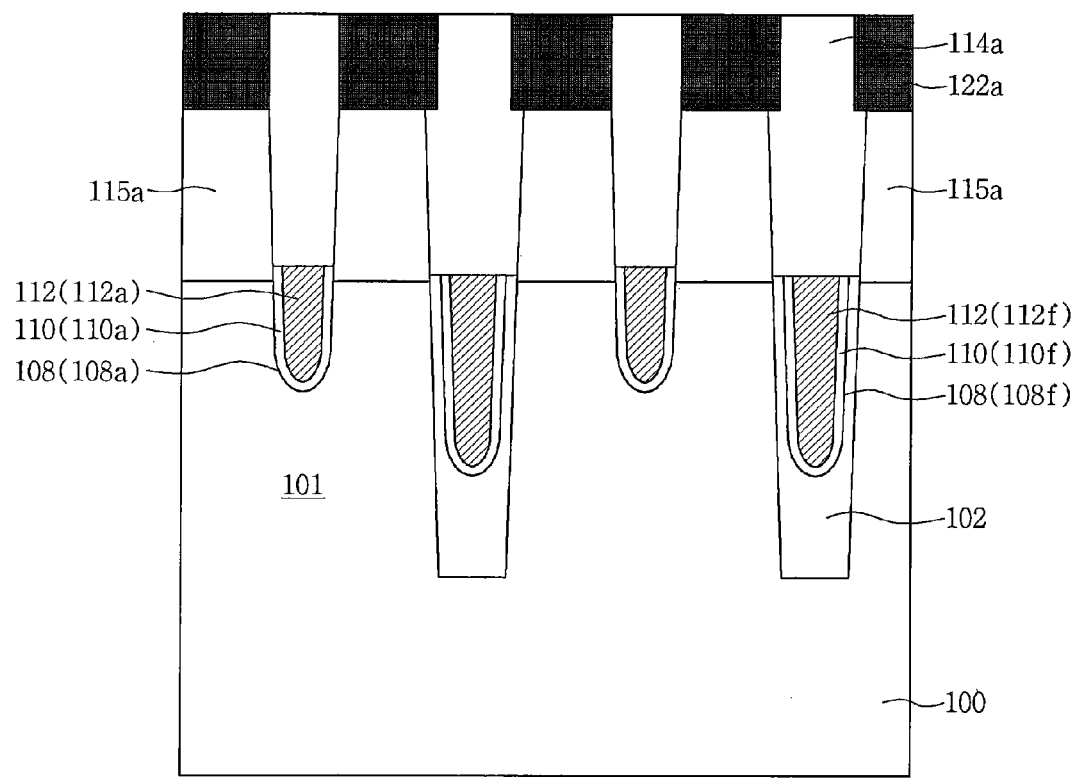
Figure 16A:
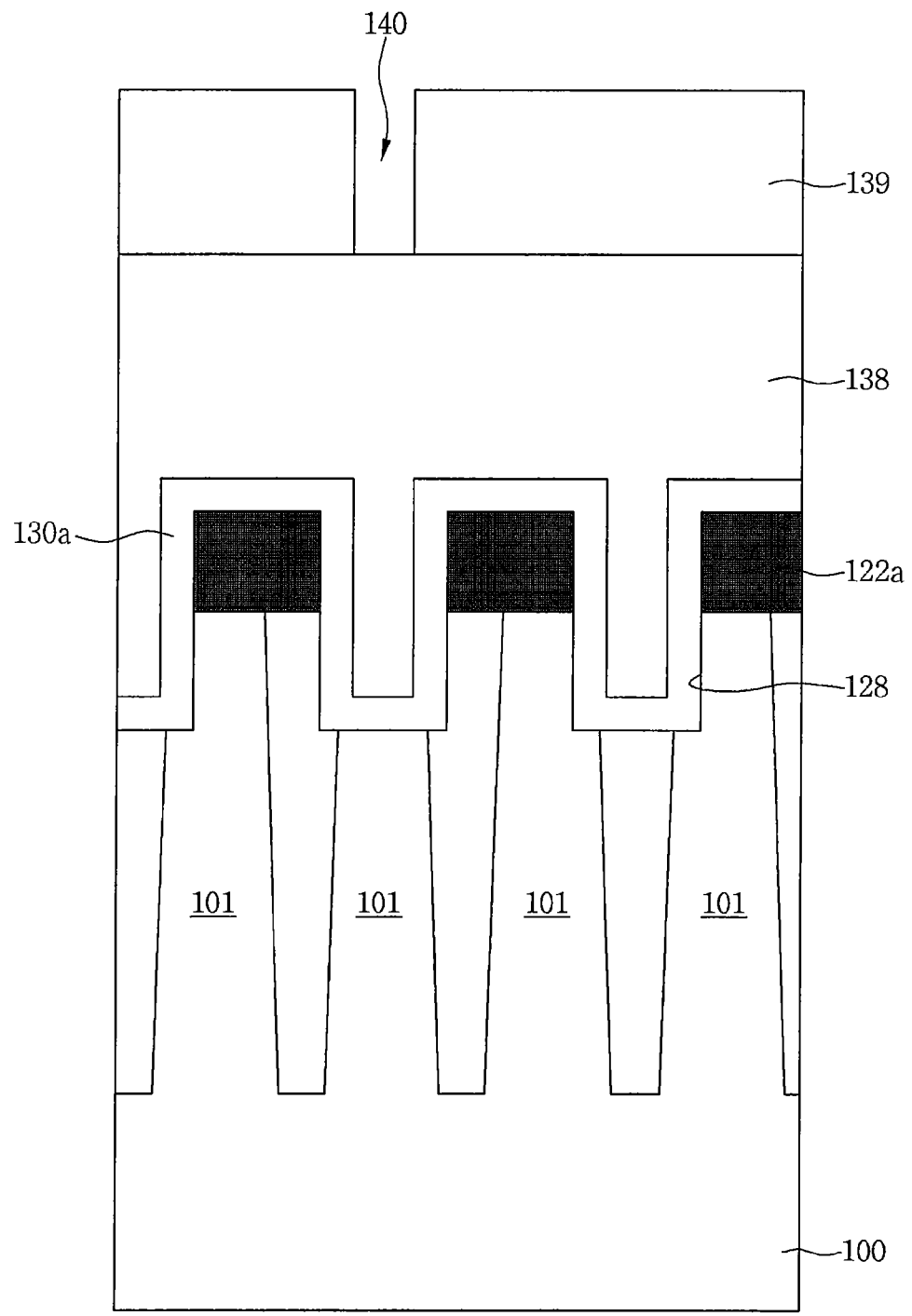
Figure 16B:
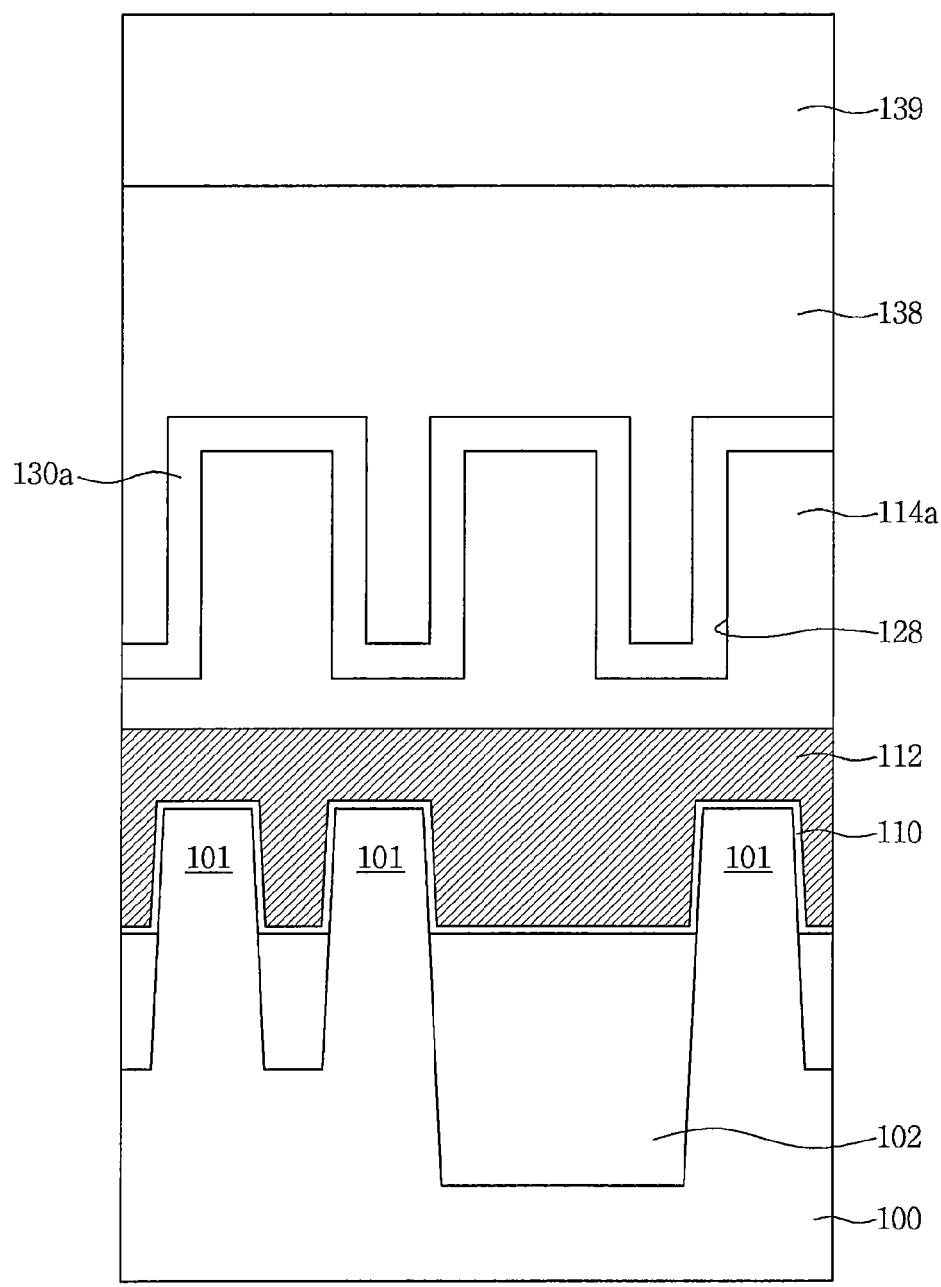
Figure 16C:
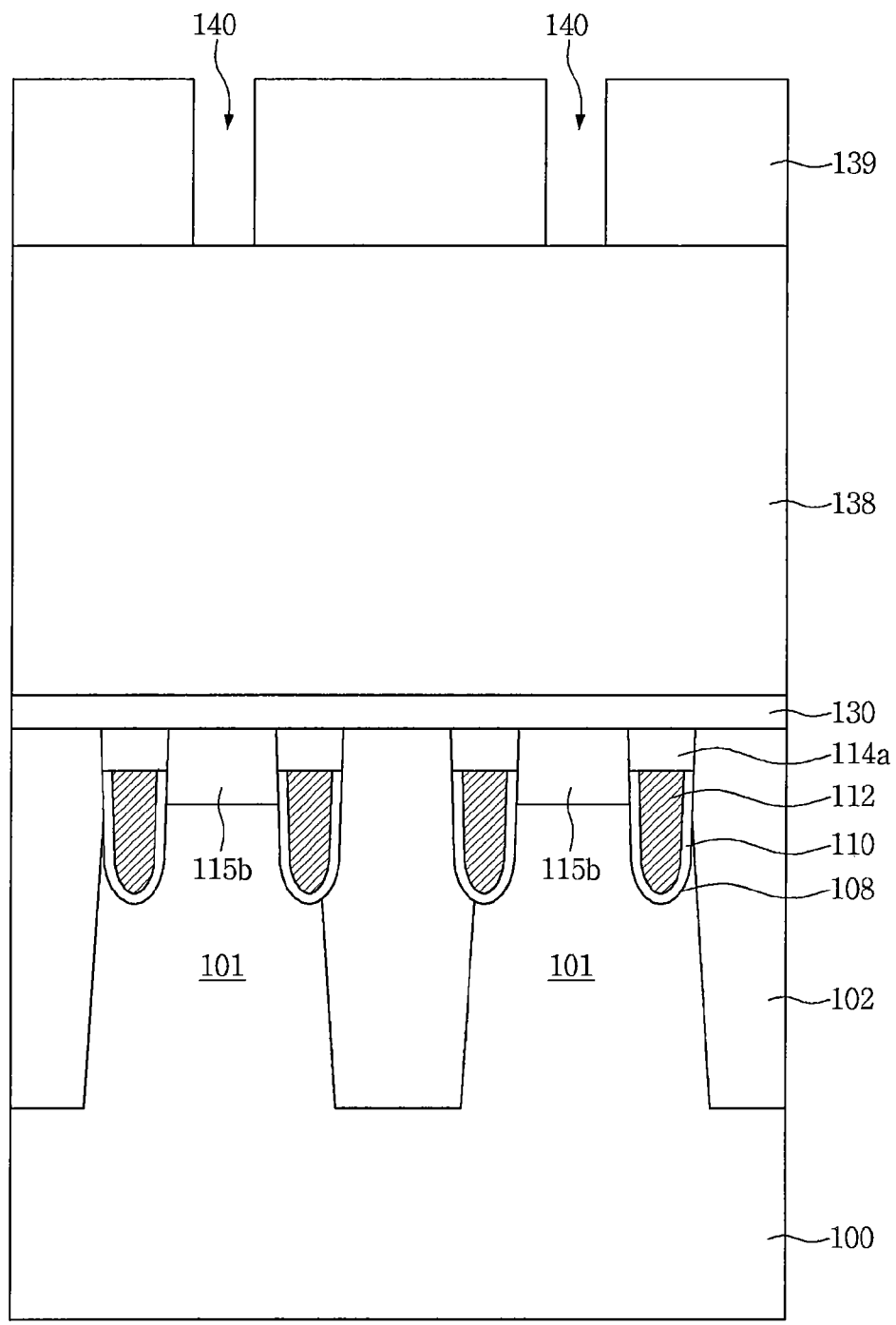
Figure 16D:
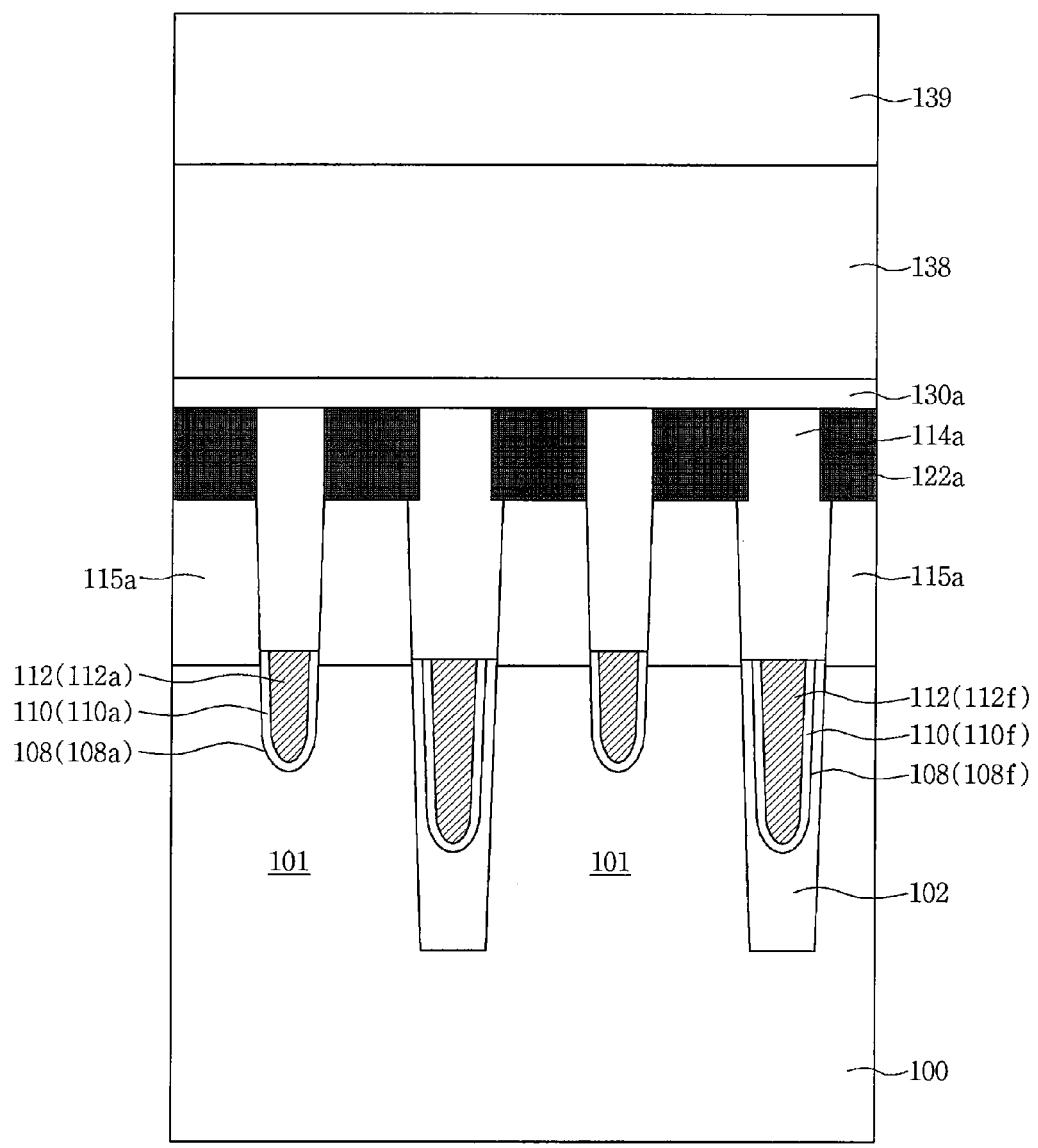
Figure 17A:
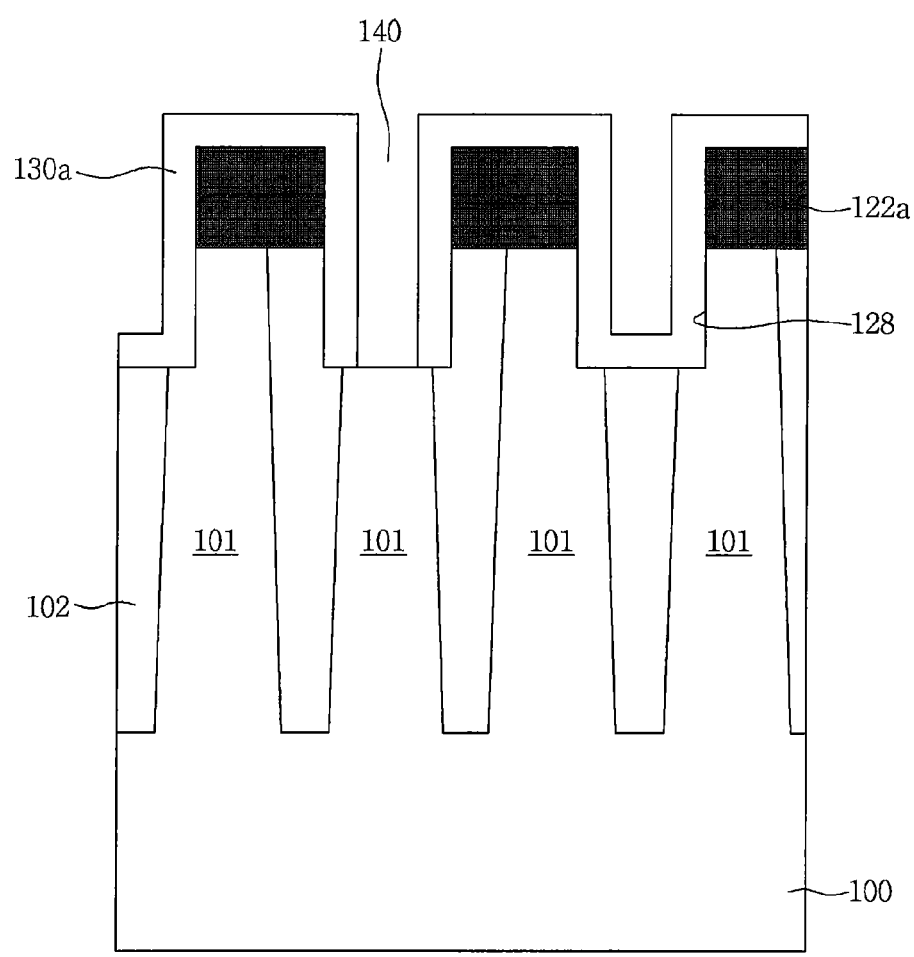
Figure 17B:
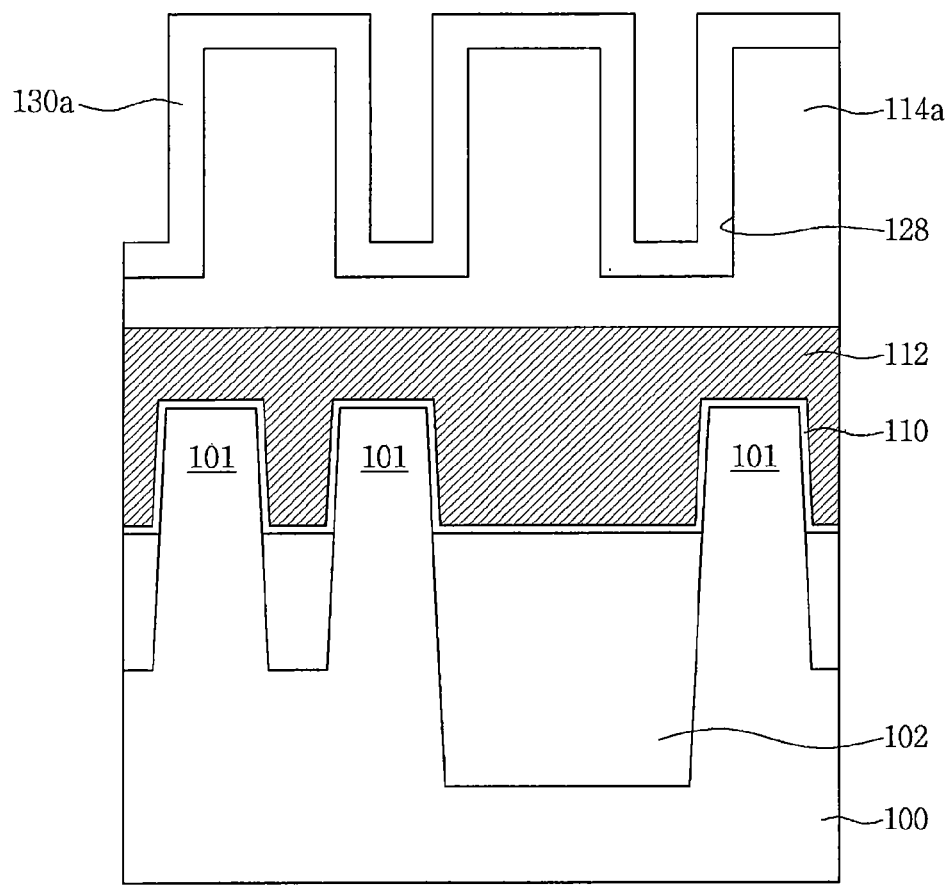
Figure 17C:
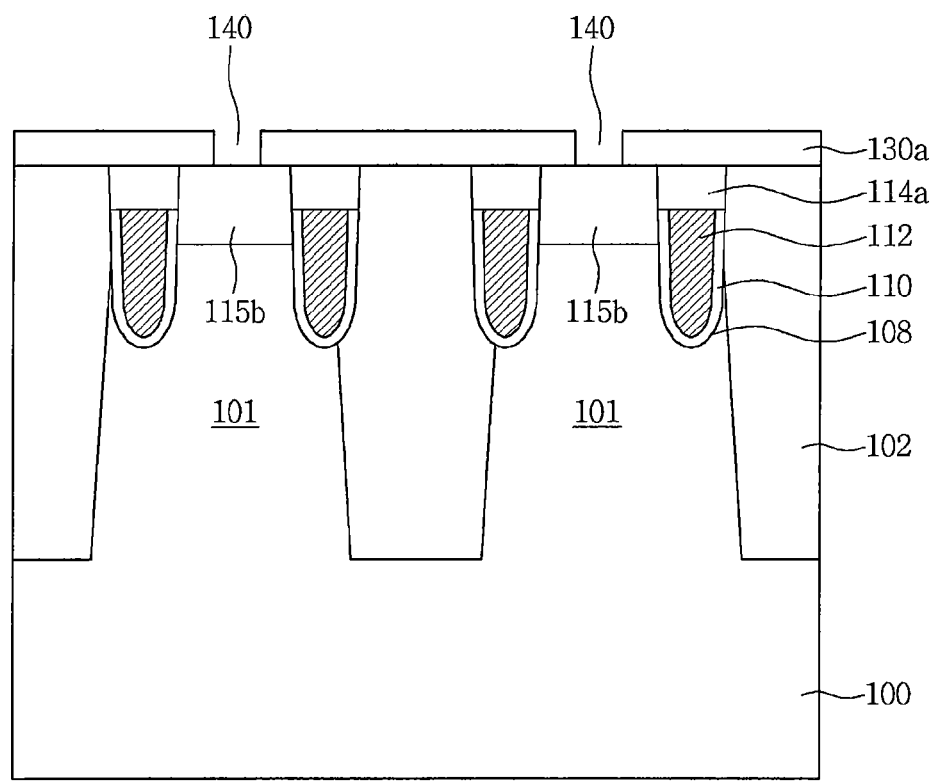
Figure 17D:
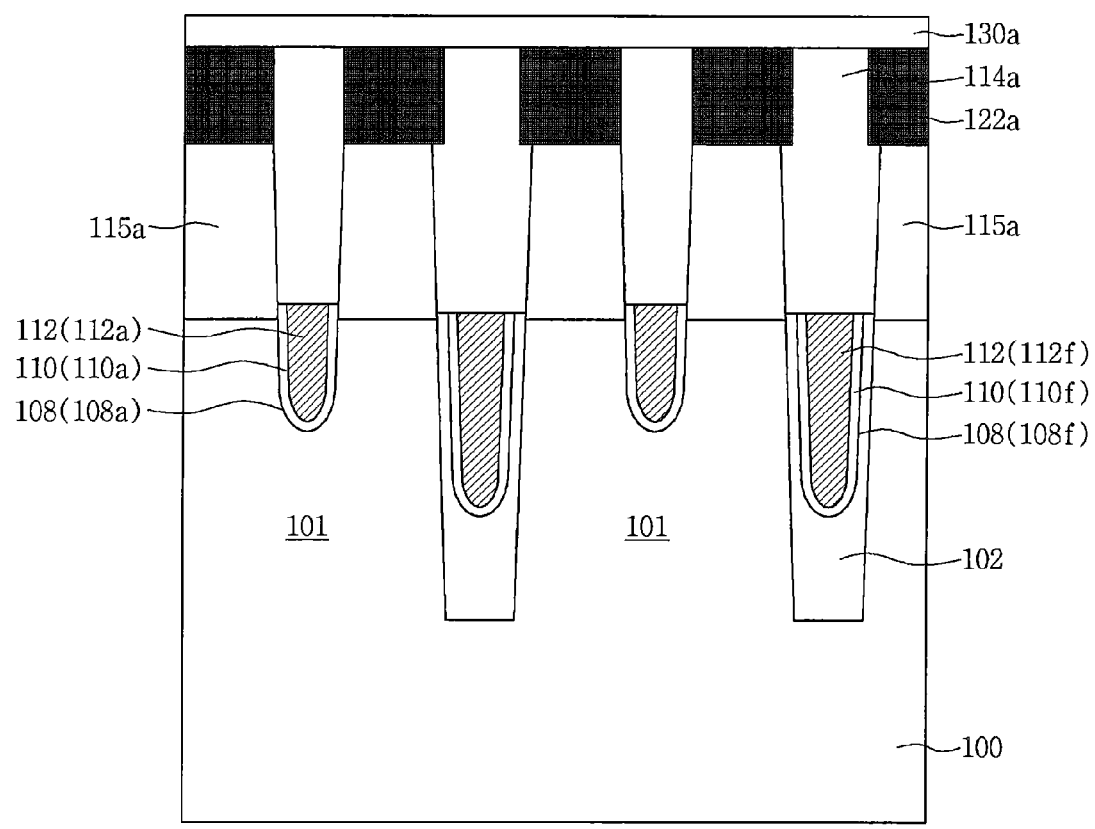

Line-shaped first photoresist patterns 125 extending in a second direction perpendicular to the first direction and defining a bit line forming area may be formed on the first hard mask layer 124. Before forming the first photoresist patterns 125, an anti-reflection layer may be formed on the first hard mask layer 124. The anti-reflection layer may include silicon oxy-nitride (SiON). As shown in FIGS. 14A and 14B, the openings in the first photoresist patterns 125 may also define openings O in the first hard mask layer 124, as will now be described.

Referring to FIGS. 15A to 15D, and 24, the first hard mask layer 124 may be patterned to open the bit line forming area by performing a photolithography process using the first photoresist patterns 125. The first photoresist patterns 125 having a similar etch characteristic to the first hard mask layer 124 may be etched together while the first hard mask layer 124 is etched. Thus, a mask pattern may be formed on the gate capping fences 114a and on the line-shaped pad patterns 122, to define spaced-apart line-shaped mask openings that extend in a second direction perpendicular to the first direction. Portions of the line-shaped pad patterns 122 and the gate capping fences 114 that are exposed by the mask openings are then etched to form contact pads 122a from the line-shaped pad patterns 122 and to form trenches 128 in the gate capping fences 114a that extend in the second direction.

More specifically, bit line trenches 128 crossing the gate capping fences 114a and extending in the second direction perpendicular to the first direction may be formed by partially etching the gate capping fence 114a using the patterned first hard mask layer 124 as an etch mask. At the same time, contact pads 122a self-aligned with the gate capping fences 114a may be formed by removing exposed areas of the line-shaped pad patterns 122. Each contact pad 122a may be electrically connected to the first impurity area 115a formed between the buried gate 112 and the field area 102.

According to an embodiment, the bit line trench 128 may be formed to have a first depth d1 greater than the protruding height h1 of the gate capping fence 114a from the top surface TSa of the active area 101. The depth d1 of the bit line trench 128 may be determined so that a top surface of the bit line to be formed in a subsequent process is located at a lower level than the top surface TSa of the active area 101. According to another embodiment, the depth d1 of the bit line trench 128 may be determined so that the top surface of the bit line to be formed in a subsequent process is located at a higher level than the top surface TSa of the active area 101.

According to an embodiment, a bottom surface BSt of the bit line trench 128 may be located at a lower level than the top surface TSa of the active area 101. The bottom surface BSt of the bit line trench 128 may be controlled to ensure a stable separation between the bit line to be formed in a subsequent process and the buried gate 112. According to another embodiment, the bottom surface BSt of the bit line trench 128 may be located at a level the same as or similar to the top surface TSa of the active area 101.

The top surface TSp of the contact pad 122a may be located at a level the same as or similar to the top surface TSf of the gate capping fence 114a.

As described above, after the bit line trenches 128 and the contact pads 122a are formed, the first hard mask layer 124 and the remaining first photoresist patterns 125 may be removed.

Referring to FIGS. 16A to 16D, and 25, an insulator structure 130 may be formed on the substrate 100 having the bit line trenches 128 and the contact pads 122a. The insulator structure 130 may include an insulating layer having a low dielectric constant, e.g., silicon oxide or the like, or an air gap, or both. The insulator structure 130 may be formed on an inner wall of the bit line trench 128 to have a conformal thickness. The insulator structure 130 including an insulating layer having a low dielectric constant or an air gap can reduce parasitic capacitance between the bit line and a low electrode of a capacitor to be formed in a subsequent process.

A second hard mask layer 138 may be formed on the insulator structure 130. The second hard mask layer 138 may include a material having an etch selectivity with respect to the insulator structure 130 thereunder. For example, the second hard mask layer 138 may be formed by a carbon containing layer such as an SOH mask.

A second photoresist pattern 139 defining bit line contact areas 140 may be formed on the second hard mask layer 138. Before the second photoresist pattern 139 is formed, an anti-reflection layer such as a SiON or the like may be formed on the second hard mask layer 138.

Referring to FIGS. 17A to 17D, the second hard mask layer 138 may be patterned by performing a photolithography process using the second photoresist pattern 139. The second photoresist pattern 139 having a similar etch characteristic to the second hard mask layer 138 may be etched together while the second hard mask layer 138 is etched.

The bit line contact areas 140 may be formed by etching the insulator structure 130 using the patterned second hard mask layer 138 as an etch mask.

The insulator structure 130 may expose the bit line contact areas 140, and extend in the first direction along the inner wall of the bit line trench 128. The insulator structure 130 may stably separate the contact pad 122a from the bit line to be formed in a subsequent process.

The second hard mask layer 138 and the remaining second photoresist pattern 139 may be removed.

Figure 18A:
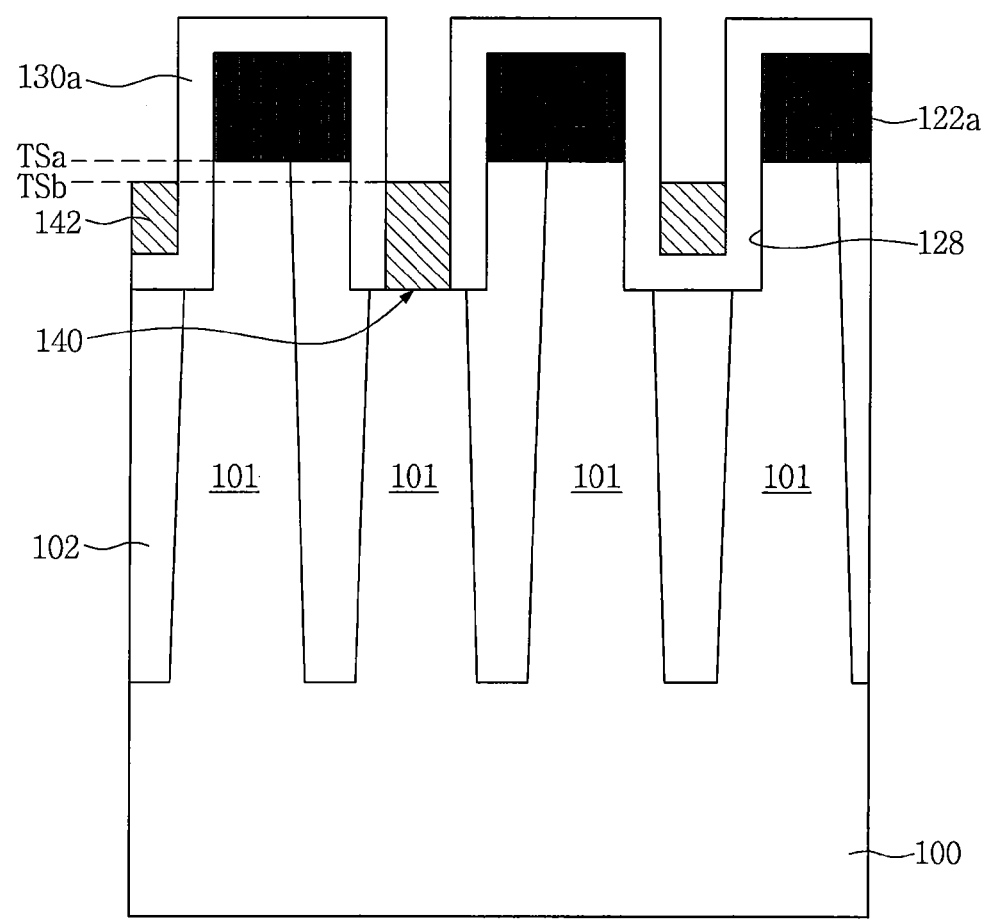
Figure 18B:
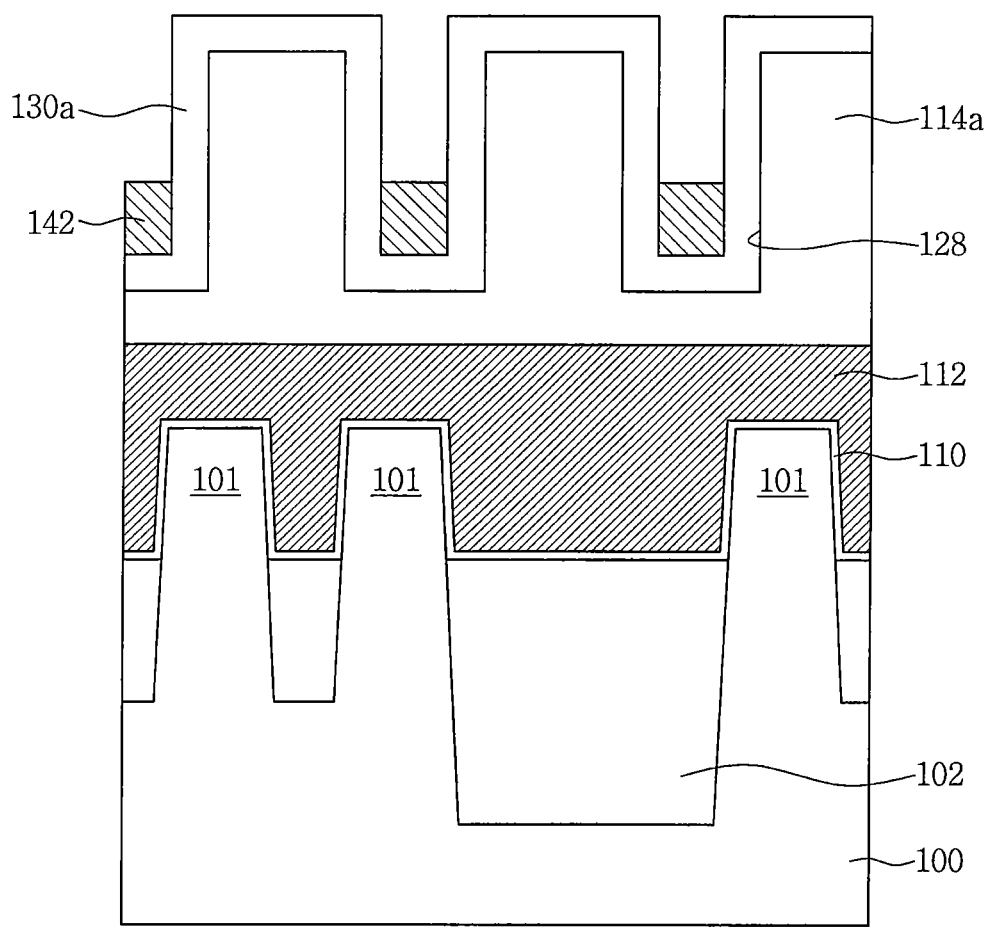
Figure 18C:
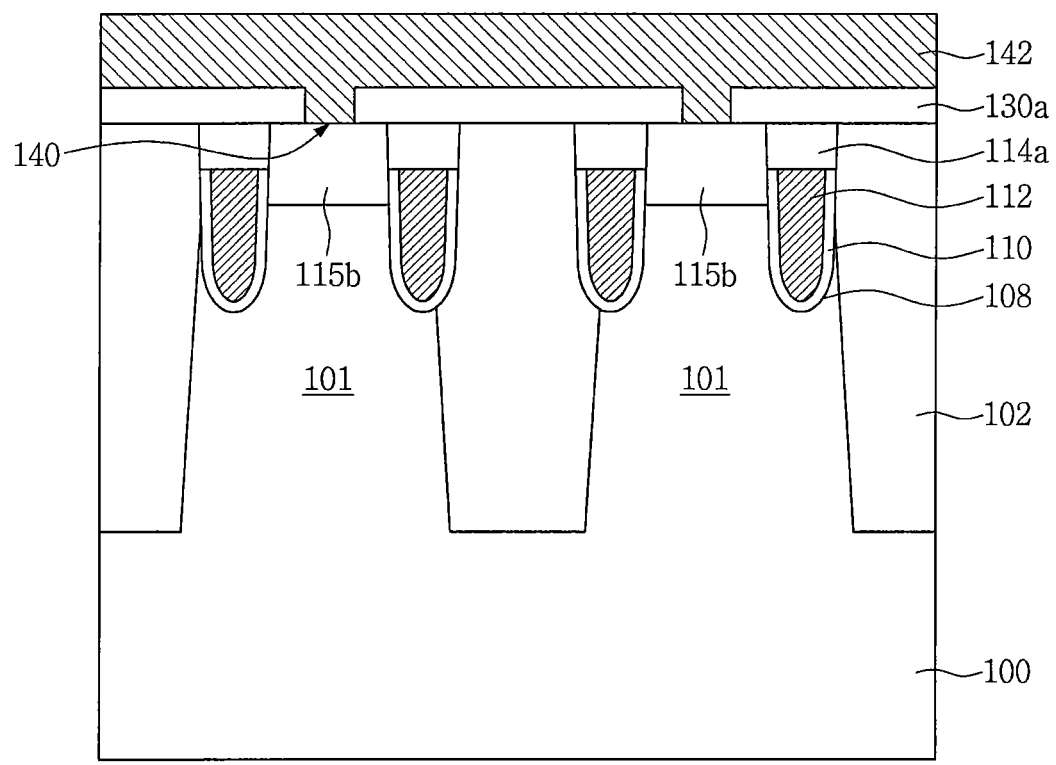
Figure 18D:
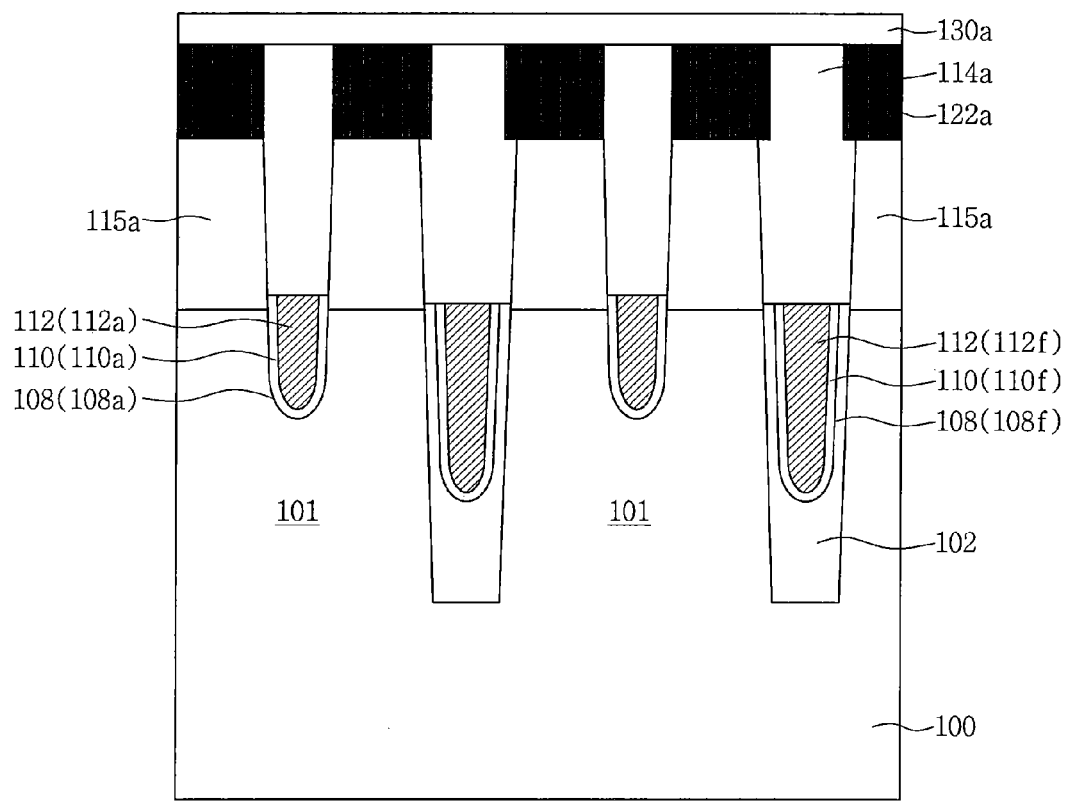
Figure 19A:
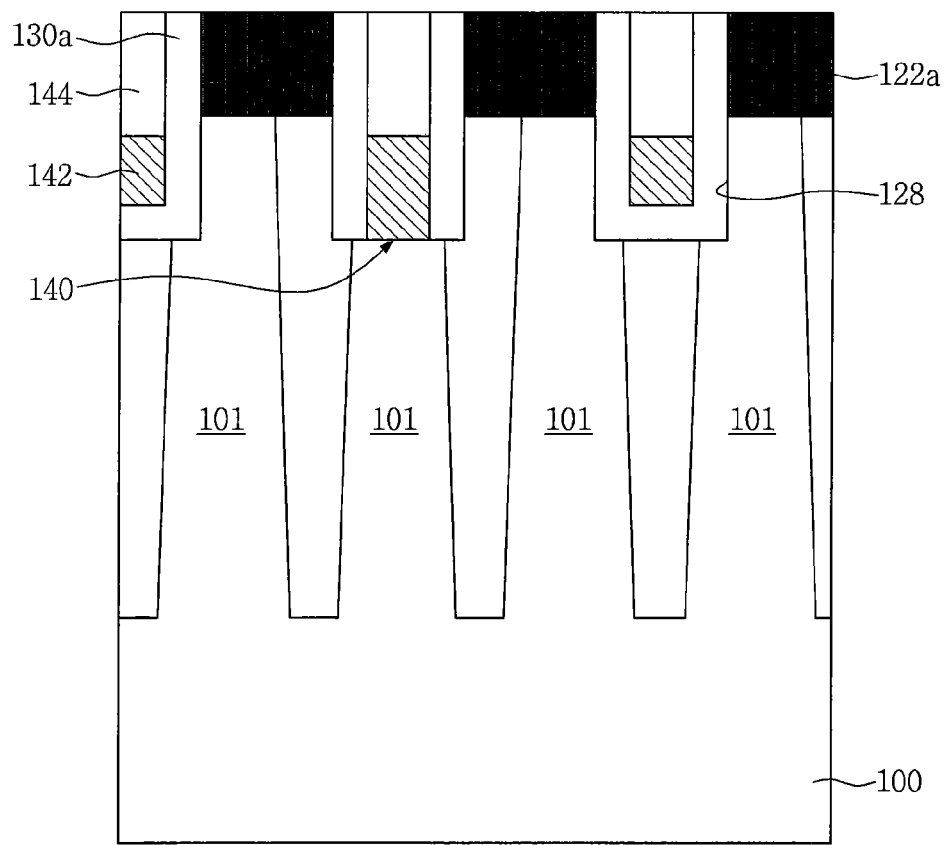
Figure 19B:
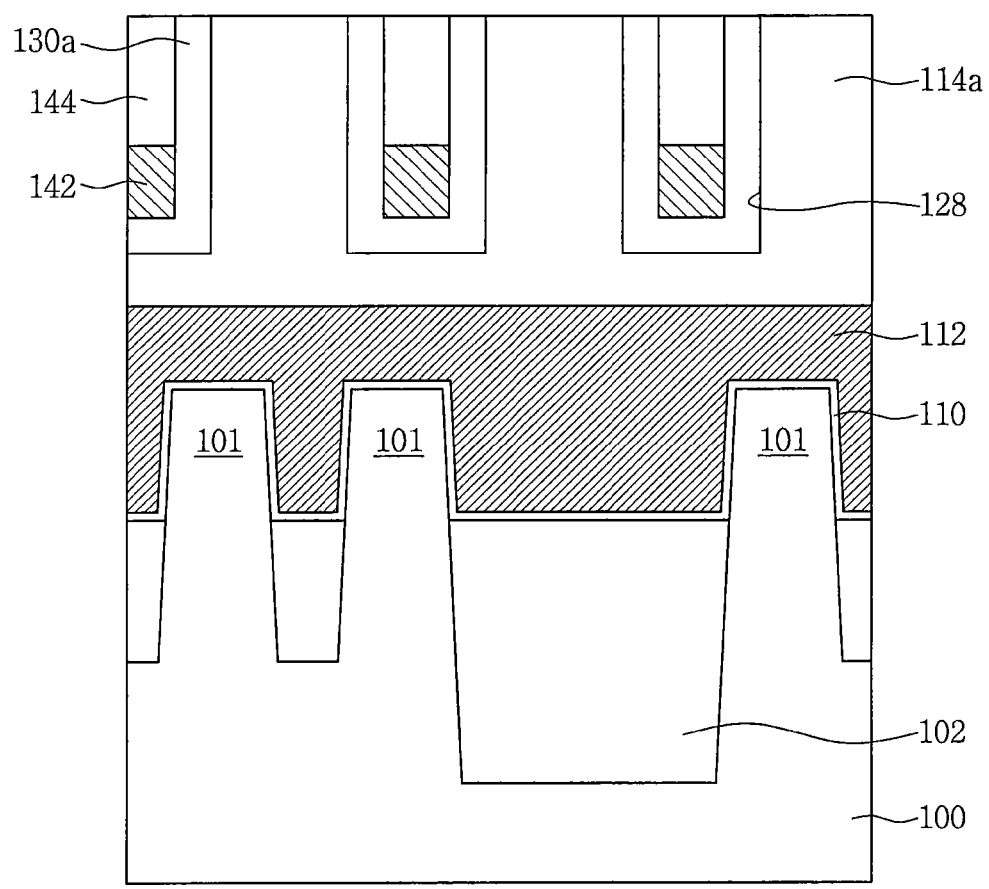
Figure 19C:
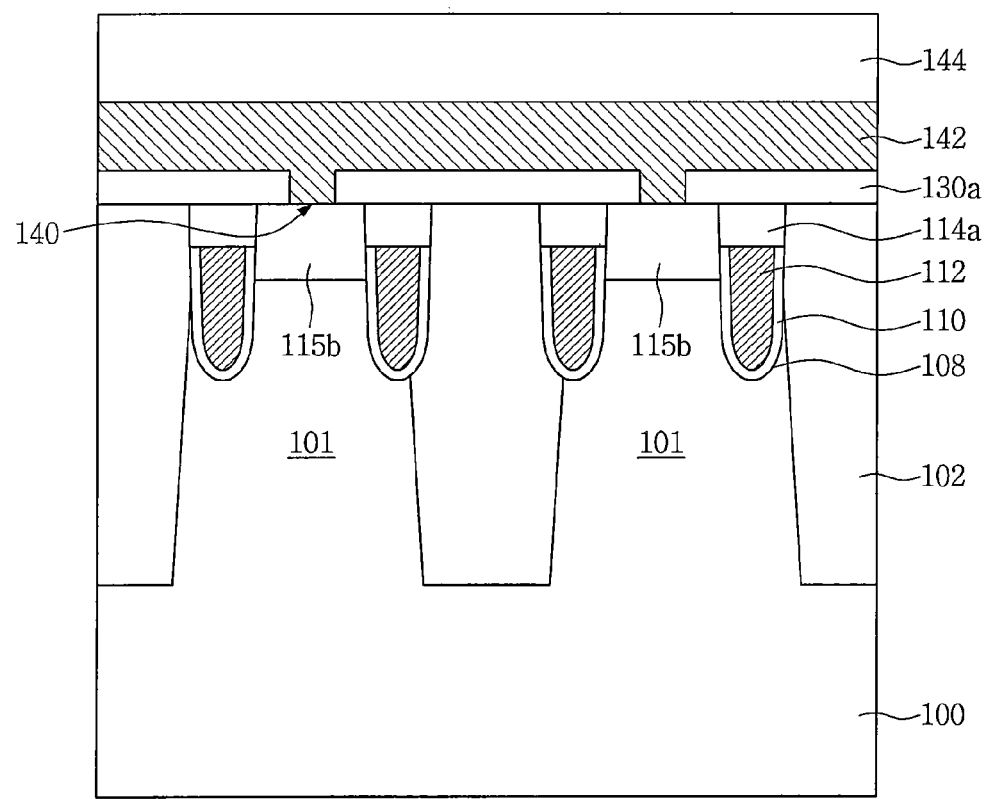
Figure 19D:
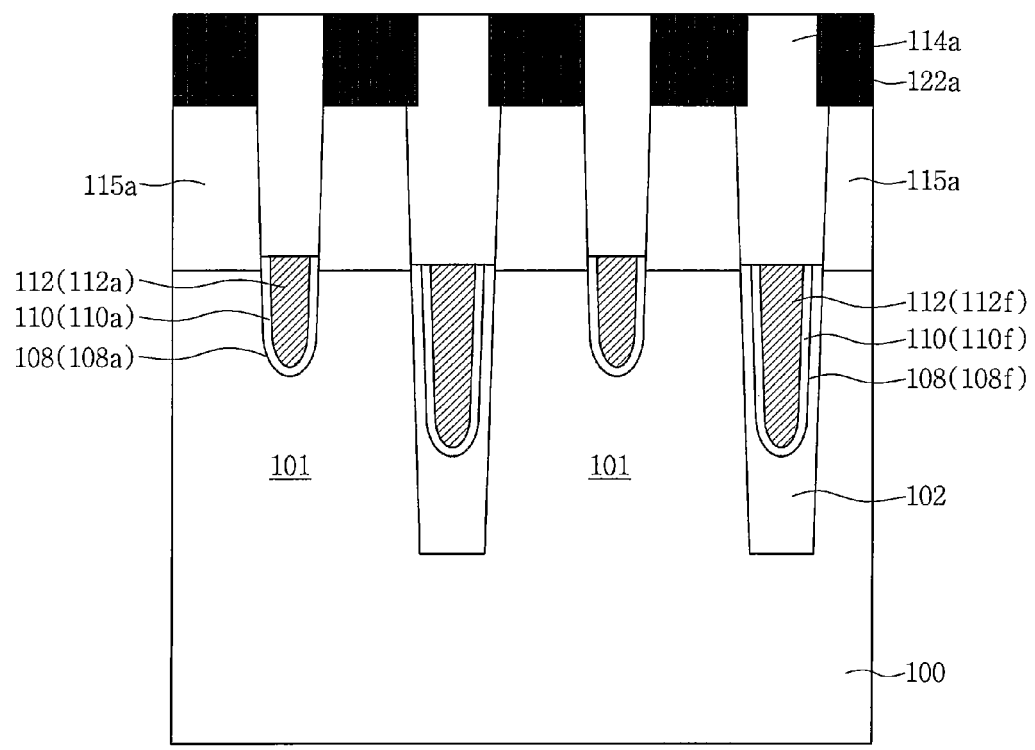
Figure 20:
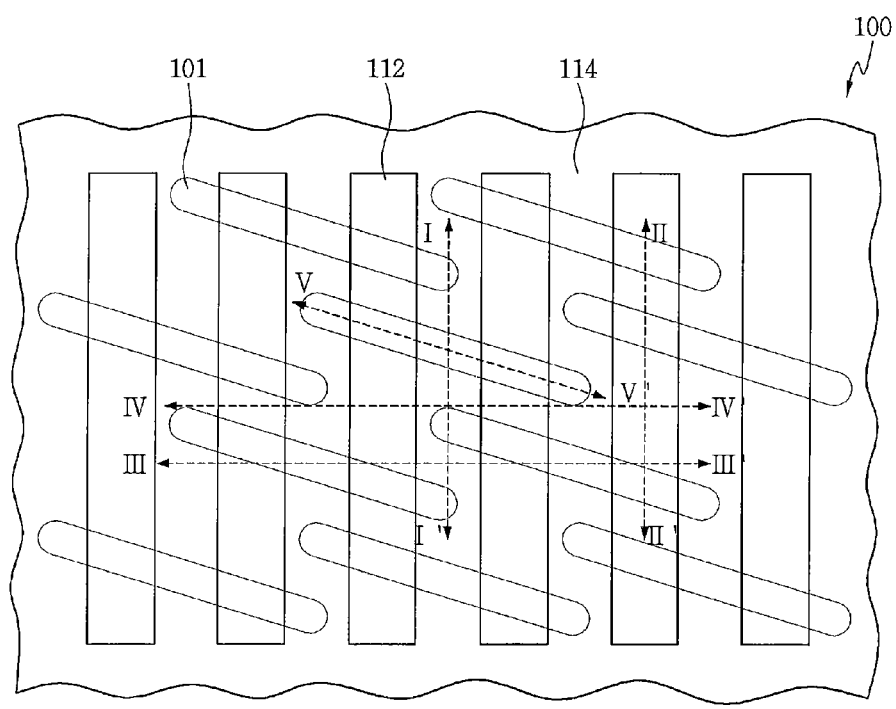
Figure 21:
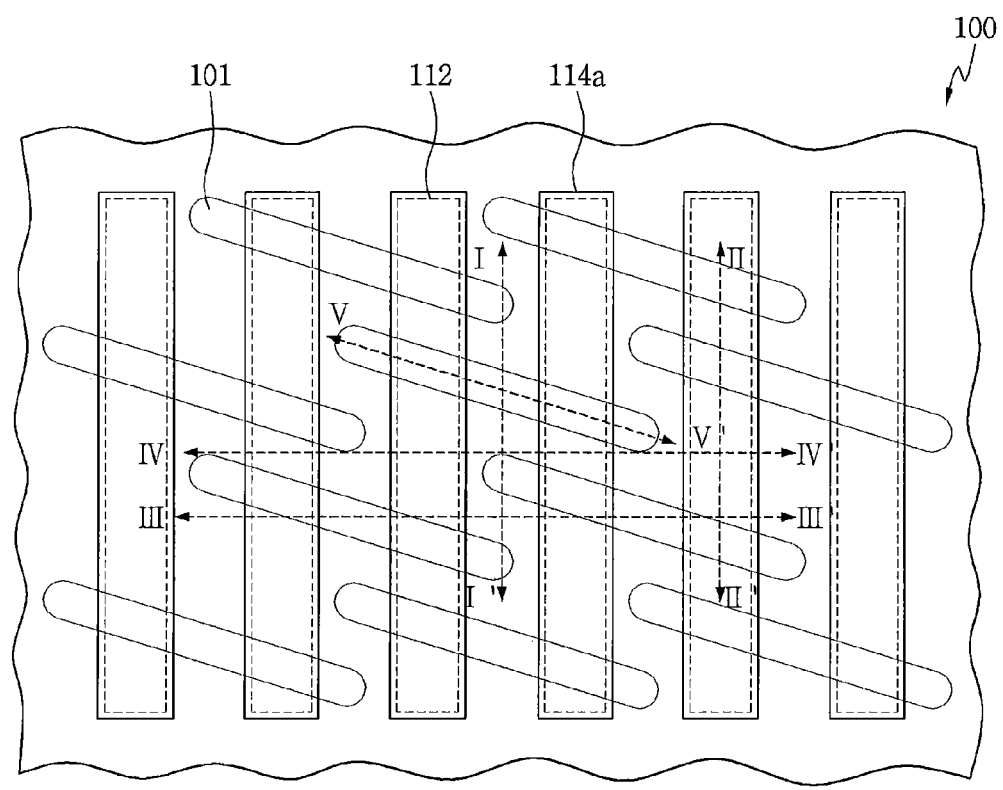
Figure 22:
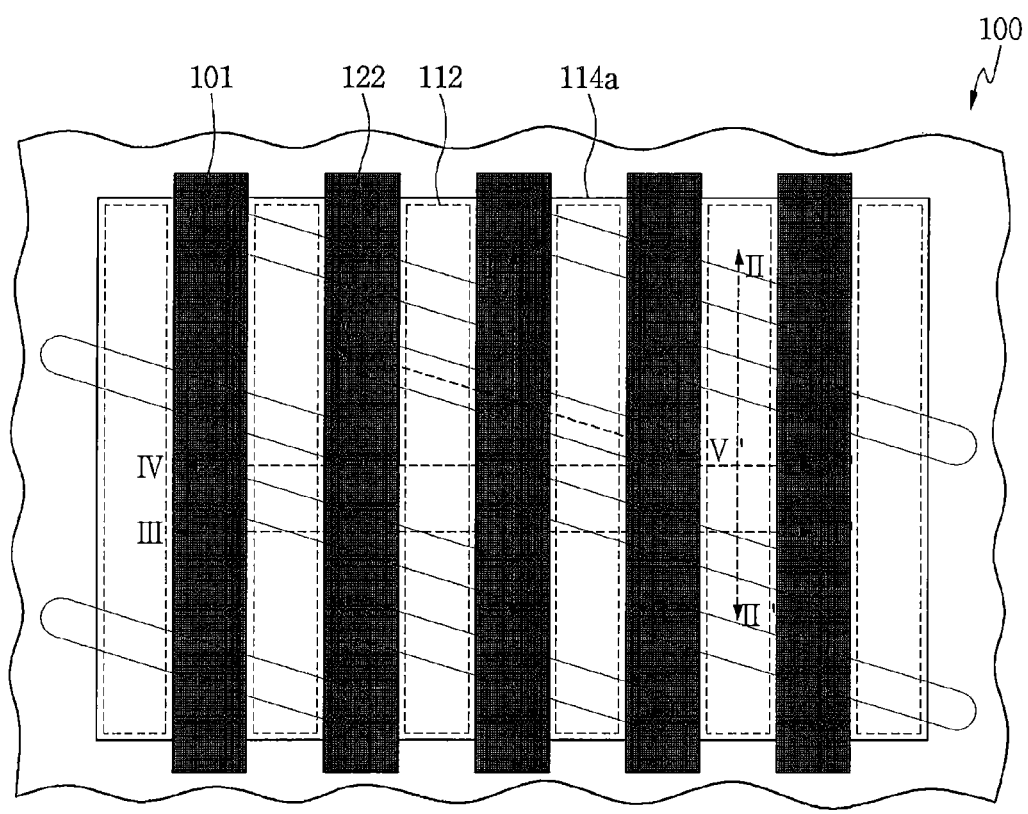
Figure 23:
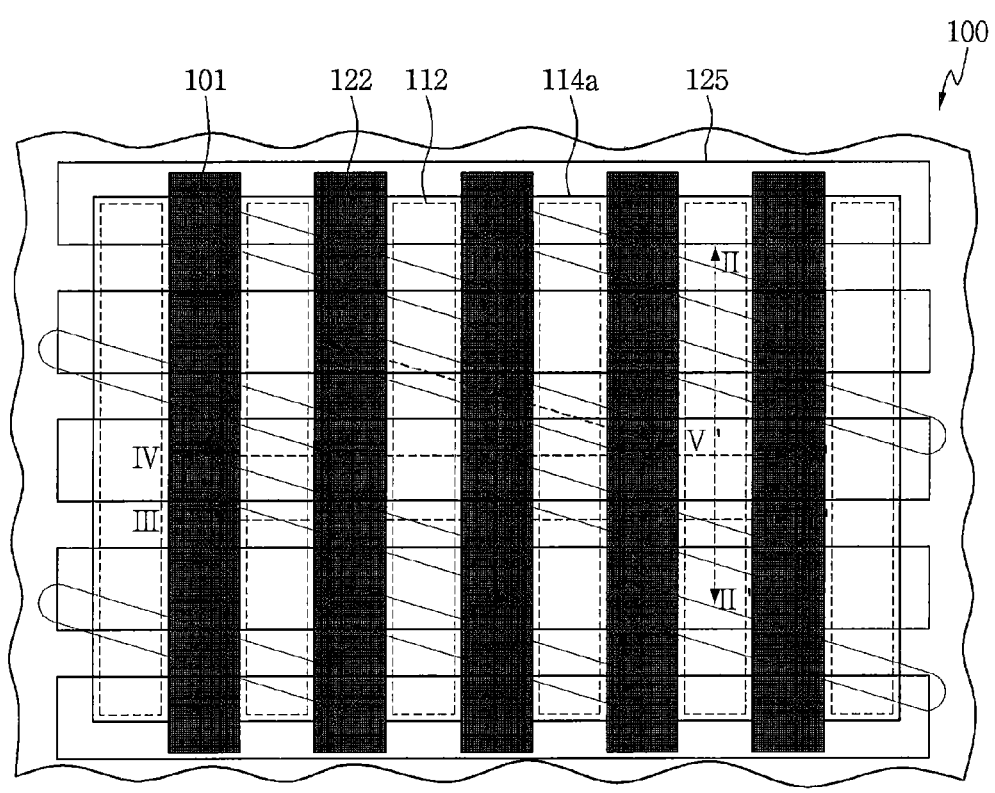
Figure 24:
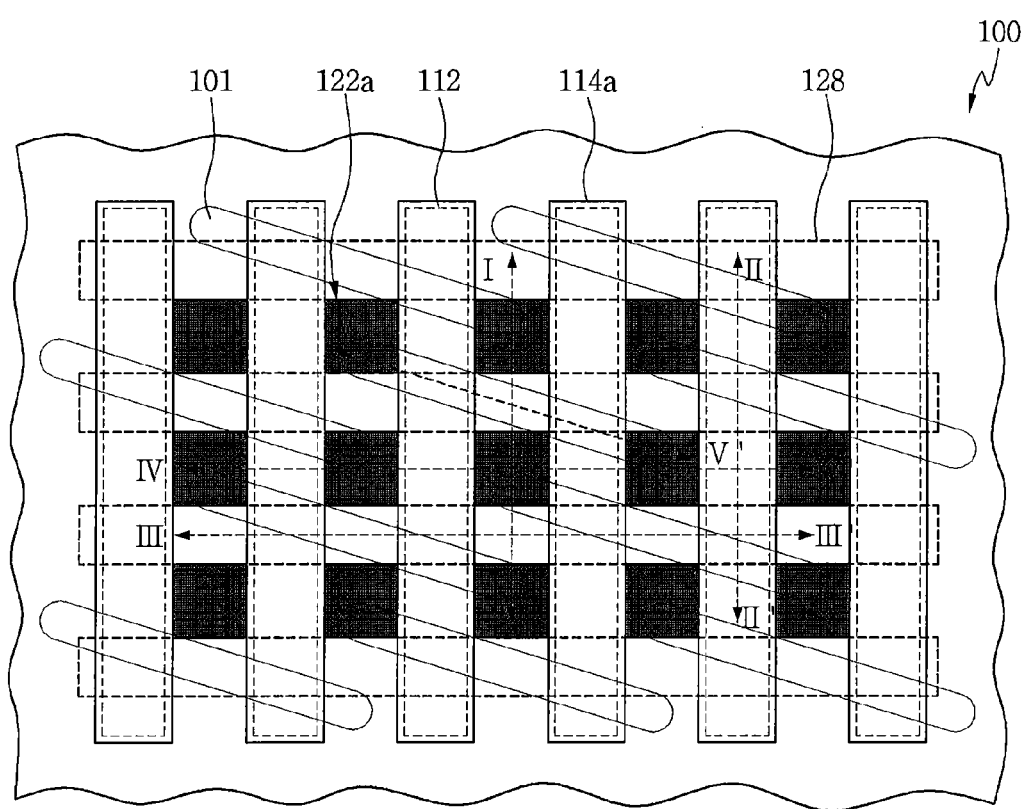
Figure 25:
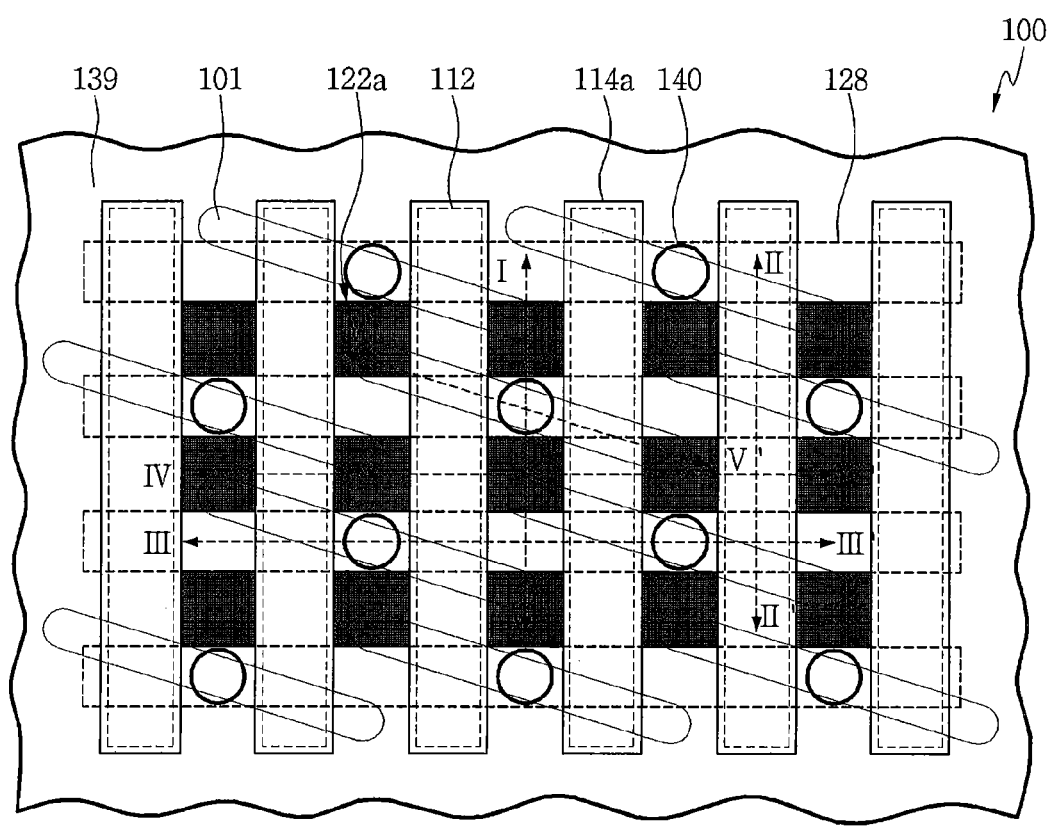
Figure 26:
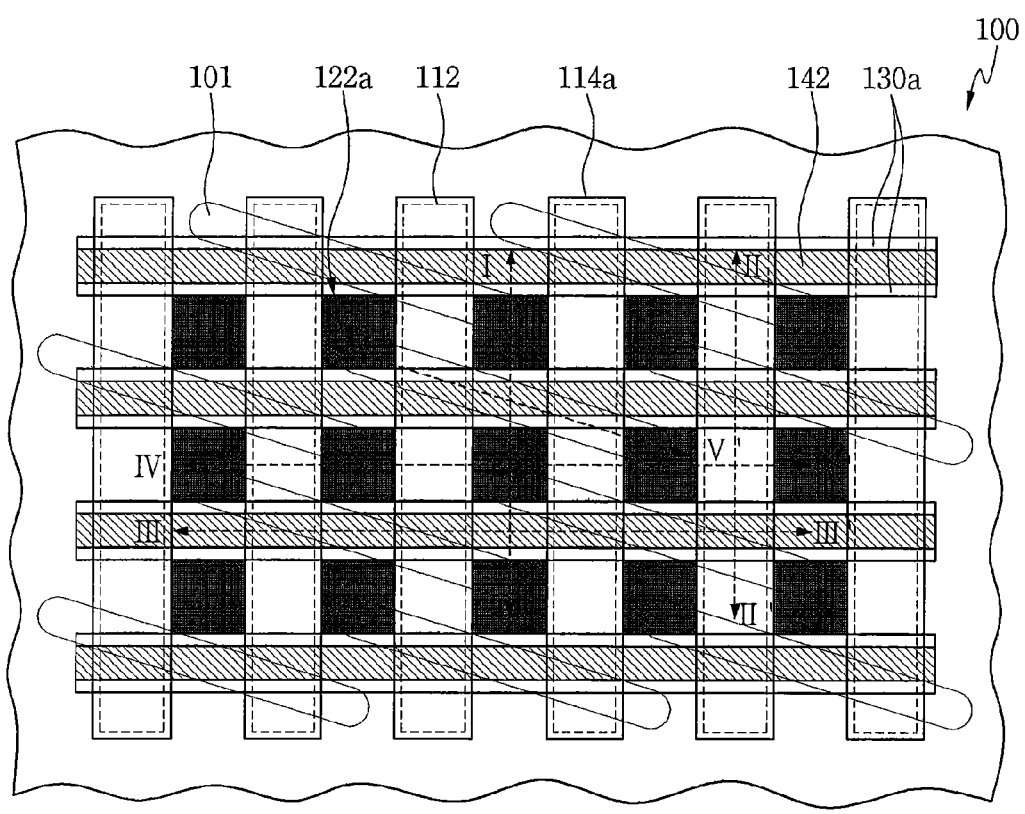
Figure 27:
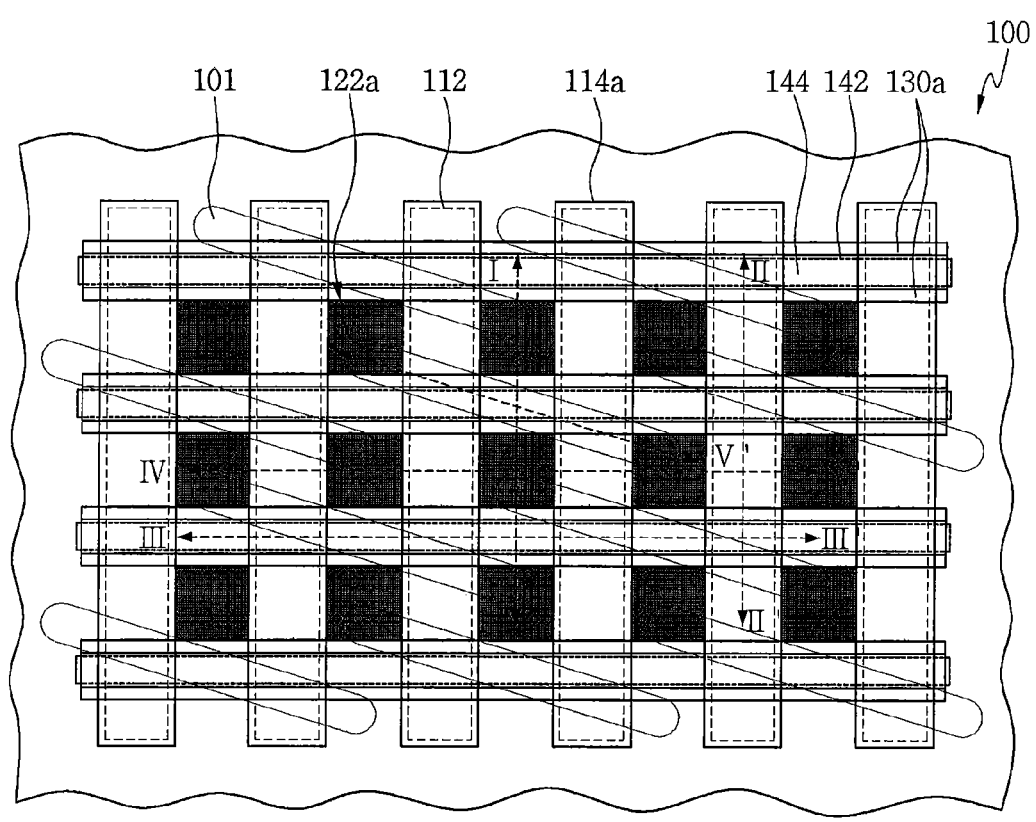

Referring to FIGS. 18A to 1817, and 26, a bit line conductive layer may be deposited on the substrate 100 to fill the bit line trench 128. Bit lines 142 filling each bit line trench 128 and extending in the second direction may be formed on the insulator structure 130 by partially removing the bit line conductive layer with an etch-back process or a CMP process.

The bit line 142 may be electrically connected to the second impurity area 115b formed in the active area 101 between a pair of buried gates 112 through the bit line contact area 140. Since the bit line 142 is formed by performing a damascene process, a fine pattern can be implemented by overcoming a pattern limitation of a photolithography process. For example, the bit line 142 may include a low-resistance metal such as tungsten (W) or titanium nitride (TiN).

According to an embodiment, a top surface TSb of the bit line 142 may be located at a lower level than the top surface TSa of the active area 101. Therefore, the bit line 142 may be formed as a structure fully buried in the substrate 100. According to another embodiment, since the top surface TSb of the bit line 142 is located at a higher level than the top surface TSa of the active area 101, the bit line 142 may be formed as a structure partially buried in the substrate 100. According to still another embodiment, bit line 142 may be formed on the substrate 100.

Referring to FIGS. 19A to 19D, and 27, an insulating layer may be deposited on the substrate 100 in which the bit lines 142 are formed. Bit line capping patterns 144 filling upper parts of the bit line trenches 128 and extending in the second direction may be formed by partially removing the insulating layer with an etch-back process or a CMP process until top surfaces of the contact pads 122a are exposed.

When the bit line capping patterns 144 are formed, the top surfaces of the contact pads 122a and the gate capping fences 114a may be exposed together.

A top surface of the bit line capping pattern 144 may be located at a level substantially the same as or similar to the top surface of the gate capping fence 114a. The bit line capping pattern 144 may include silicon nitride.

A bit line structure including a bit line trench 128, an insulator structure 130, a bit line 142, and a bit line capping pattern 144 may be formed in or on the substrate 100 by the process described in FIGS. 15 to 19.

As shown in FIG. 2, the lower electrode 150 of the capacitor may be formed on the contact pads 122a. The lower electrode 150 of the capacitor may be electrically connected to the first impurity area 115a formed between the buried gate 112 and the field area 102 through the contact pad 122a thereunder.

Since the lower electrode 150 of the capacitor may be directly formed on the contact pad 122a, which is self-aligned with the gate capping fence 114a, without a contact hole, contact misalignment can be prevented. The lower electrode 150 of the capacitor may be stably separated from the bit line 142 by the insulator structure 130 and the bit line capping pattern 144. Scaling down of the semiconductor device can be implemented to sufficiently ensure a distance between the lower electrode 150 of the capacitor and the bit line 142 by the gate capping fence 114a and the insulator structure 130a.

According the method of manufacturing a semiconductor device in accordance with the inventive concepts, a process of forming a contact hole and a landing pad to connect the lower electrode 150 of the capacitor with the active area 101 of the substrate 100, and a process of forming an interlayer insulating layer between the bit line 142 and the lower electrode 150 of the capacitor can be omitted to simplify the manufacturing process and to improve process throughput.

FIGS. 28A to 28D are cross-sectional views for describing a method of manufacturing a semiconductor device in accordance with another embodiment.

Figure 28A:
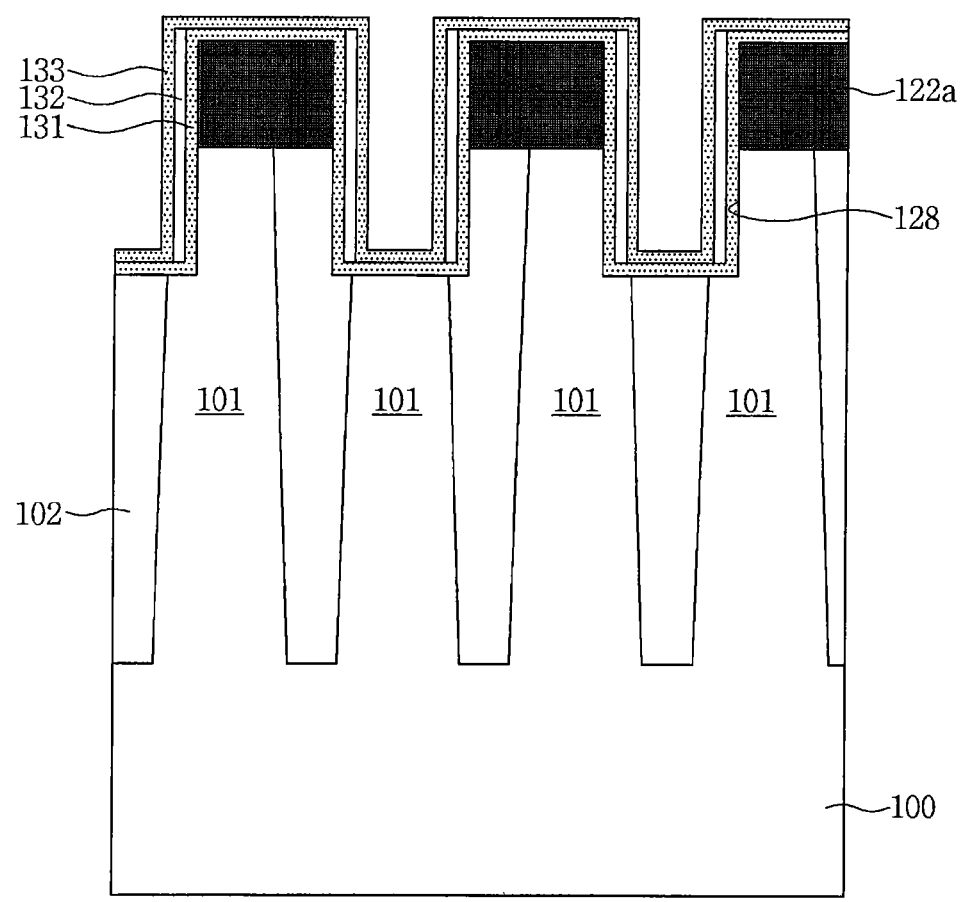
FIGS. 28A to 28D are cross-sectional views for describing a method of manufacturing a semiconductor device in accordance with the another embodiment.

Referring to FIG. 28A, the process described with reference to FIGS. 11 to 15 may be performed to form buried gates 112, gate capping fences 114a, bit line trenches 128, and contact pads 122a in and on a substrate 100 having a field area 102 defining active areas 101.

The gate capping fence 114a may cover a top surface of the buried gate 112, extend in a first direction, and protrude from a top surface of the active area 101. The bit line trench 128 may be formed in the gate capping fence 114a, cross the gate capping fences 114a, and extend in a second direction perpendicular to the first direction. The bit line trench 128 may be formed to have a depth greater than or equal to a protruding height of the gate capping fence 114a from the top surface of the active area 101. The contact pad 122a may be self-aligned with the gate capping fence 114a on the substrate 100 between the adjacent bit line trenches 128.

A first insulating layer 131, a sacrificial layer 132, and a second insulating layer 133 may be sequentially formed on the substrate 100. The first insulating layer 131, the sacrificial layer 132, and the second insulating layer 133 may be formed to have conformal thicknesses on an inner wall of the bit line trench 128. Each of the first and second insulating layers 131 and 133 may include a low dielectric constant insulating material such as silicon oxide. The sacrificial layer 132 may include a material having an etch selectivity with respect to the first and second insulating layers 131 and 133, for example, silicon nitride or a polysilicon-based organic compound.

Figure 28B:
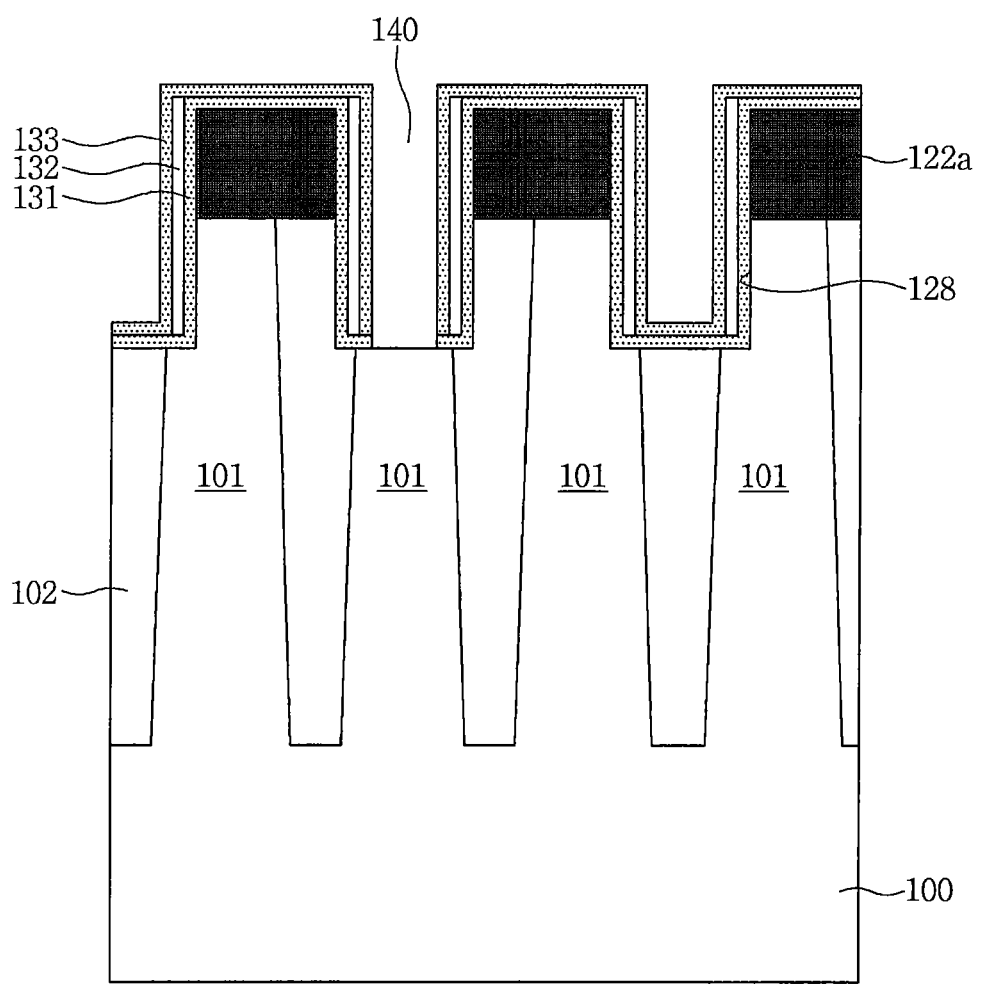

Referring to FIG. 28B, bit line contact areas 140 may be formed by etching the second insulating layer 133, the sacrificial layer 132, and the first insulating layer 131 which are located on the active area 101 between a pair of buried gates 112.

Figure 28C:
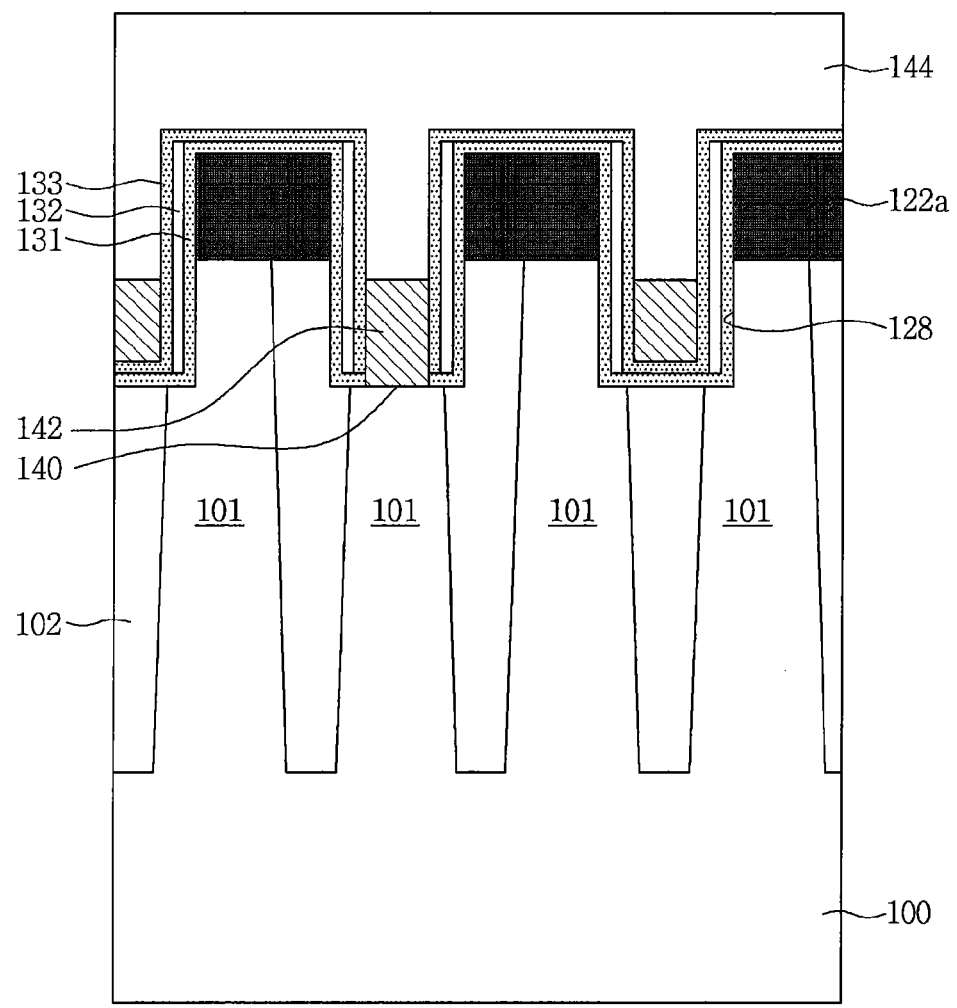

Referring to FIG. 28C, bit lines 142 may be formed to fill lower parts of the bit line trenches 128. The bit line 142 may be electrically connected to the active area 101 between a pair of buried gates 112 through the bit line contact area 140.

An air gap 136 may be formed between the first insulating layer 131 and the second insulating layer 133 by selectively removing the sacrificial layer 132 with a wet etching process.

A bit line capping pattern 144 may be formed to cover top surfaces of the bit lines 142 and to fill the bit line trenches 128.

Figure 28D:
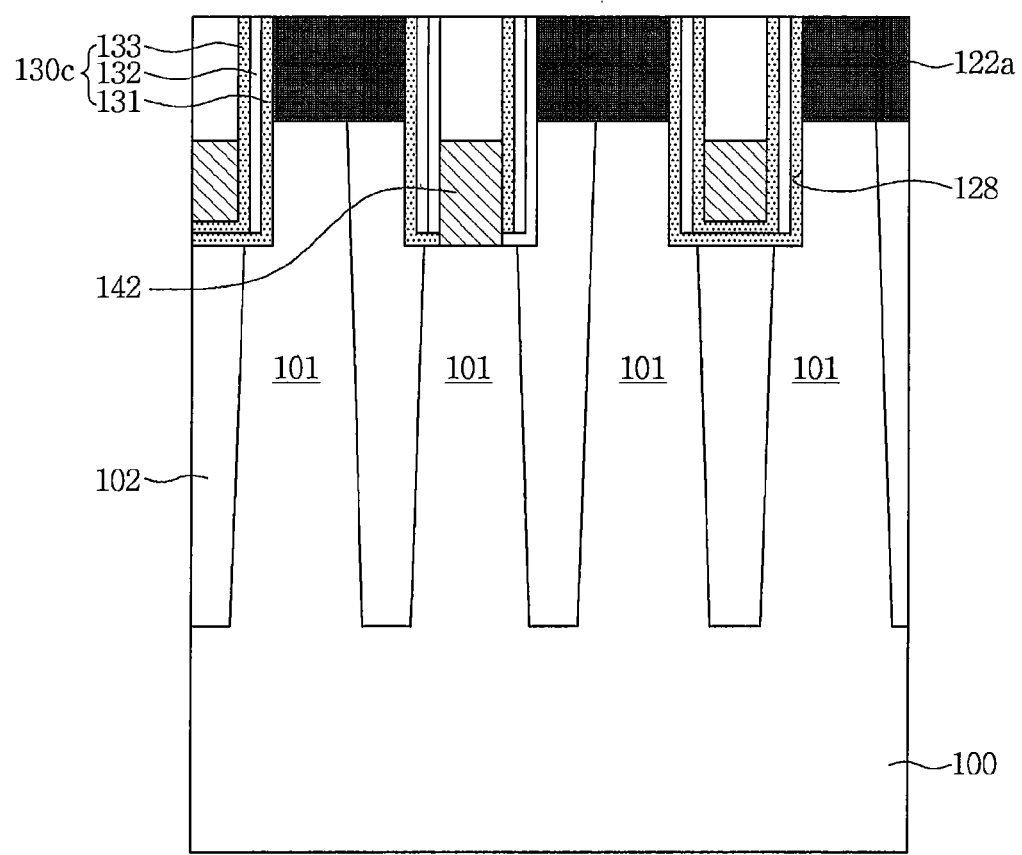

Referring to FIG. 28D, the bit line capping pattern 144 may be partially removed by performing an etch-back process or a CMP process until top surfaces of the contact pads 122a are exposed. The top surface of the bit line 142 may be covered by the bit line capping pattern 144, and sides of the bit line 142 may be covered by an insulator structure 130c including the first insulating layer 131, the sacrificial layer 132, and the second insulating layer 133.

A lower electrode of a capacitor may be directly formed on each contact pad 122a without a contact hole. The lower electrode of the capacitor may be stably separated from the bit line 142 by the bit line capping pattern 144 and the insulator structure 130c.

Figure 29:
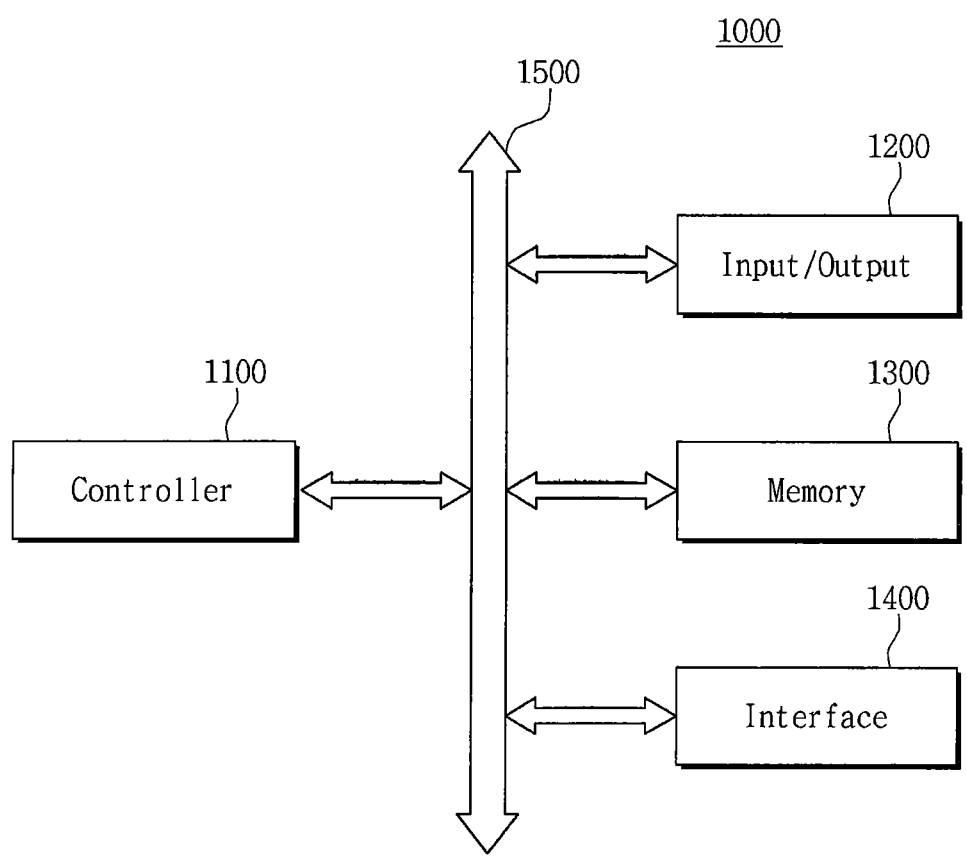
FIG. 29 is a block diagram of an electronic system having the semiconductor devices in accordance with various embodiments.

FIG. 29 is a block diagram of an electronic system having the semiconductor devices in accordance with various embodiments.

Referring to FIG. 29, the semiconductor devices in accordance with various embodiments may be applied to the electronic system 1000.

The electronic system 1000 may include a controller 1100, an input/output 1200, a memory 1300, an interface 1400, and a bus 1500.

The controller 1100, the input/output 1200, the memory 1300, and the interface 1400 may be combined through the bus 1500. The bus 1500 may be a path through which data moves.

The controller 1100 may include at least one of a microprocessor, a digital signal processor, a micro controller, and logical devices capable of performing a similar function thereto. The input/output 1200 may include a keypad, a keyboard, a display device, etc. The memory 1300 may store data and/or a command. The interface 1400 may serve to transmit data to a communication network or receive data from the communication network. The interface 1400 may be a wired or wireless form. For example, the interface 1400 may include an antenna, a wired/wireless transceiver, or the like. Semiconductor devices in accordance with various embodiments described herein may be used in the controller 1100, the input/output 1200, the memory 1300 or the interface 1400 or in various combinations and subcombinations thereof.

According to various embodiments, the bit line trenches may be formed by a damascene process using the gate capping fences protruding from the top surfaces of the active areas, and contact pads self-aligned with the gate capping fence may be formed on the substrate between the adjacent bit lines. Since the lower electrode of the capacitor may be directly formed on the contact pad, which is self-aligned with the gate capping fence, without a contact hole, contact misalignment can be reduced or prevented.

Other various effects in accordance with various embodiments were described in the above detailed specification.

The foregoing is illustrative of embodiments and is not to be construed as limiting thereof. Although a few embodiments have been described, those skilled in the art will readily appreciate that many modifications are possible in embodiments without materially departing from the novel inventive concepts. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of manufacturing a semiconductor device, the method comprising:
   forming a field area that defines active areas in a substrate;
   forming gate trenches that extend in a first direction in the substrate;
   forming buried gates in the gate trenches;
   forming gate capping fences in the gate trenches on a respective buried gate, the gate capping fences protruding from top surfaces of the active areas and extending in the first direction;
   forming line-shaped pad patterns self-aligned with the gate capping fences and extending in the first direction on the substrate;
   forming contact pads and bit line trenches by patterning a part of the pad patterns and the gate capping fences to expose at least some areas of the substrate between adjacent gate capping fences, wherein a respective contact pad is formed on the substrate between the adjacent bit line trenches and a respective bit line trench extends in a second direction perpendicular to the first direction;
   forming a bit line in a respective bit line trench; and
   forming a lower electrode of a capacitor on a respective contact pad.

2. The method according to claim 1, wherein the forming of the line-shaped pad patterns self-aligned with the gate capping fences and extending in the first direction comprises:
   forming a pad conductive layer on a surface of the substrate; and
   partially removing the pad conductive layer until a top surface of the gate capping fence is exposed,
   wherein a top surface of the line-shaped pad pattern is located at substantially a same level as the top surface of the gate capping fence.

3. The method according to claim 1, wherein the forming of the contact pads and the bit line trenches comprises:
   forming mask patterns on the substrate on which the line-shaped pad patterns are formed, the mask patterns extending in the second direction and defining a bit line forming areas;
   forming the contact pads and the bit line trenches by etching the exposed areas of the pad patterns and some areas of the gate capping fences using the mask patterns; and
   removing the mask patterns.

4. The method according to claim 1, wherein the bit line trench is formed to have a depth is greater than or equal to a protruding height of the gate capping fence from a top surface of the active area.

5. The method according to claim 1, wherein the bit line is formed so that a top surface thereof is located at a lower level than a top surface of the active area.

6. The method according to claim 1, wherein the bit line is formed so that a top surface thereof is located at a higher level than a top surface of the active area.

7. The method according to claim 1, further comprising forming insulator structures on inner walls of the bit line trenches, wherein a respective insulator structure includes an insulating layer, an air gap, or a multi-structure including an insulating layer and an air gap.

8. The method according to claim 1, further comprising forming bit line capping patterns in the bit line trenches over each bit line, wherein top surfaces of the bit line capping patterns are located at substantially a same level as top surfaces of the gate capping fences.

9. A method of manufacturing a semiconductor device, the method comprising:
   forming spaced-apart line-shaped structures that extend in a first direction of a substrate, the spaced-apart line-shaped structures comprising gate trenches in the substrate having buried gates therein and gate capping fences thereon that protrude from the substrate;
   forming line-shaped pad patterns that extend in the first direction, between the spaced-apart line-shaped structures;
   forming a mask pattern on the gate capping fences and on the line-shaped pad patterns to define spaced-apart line-shaped mask openings that extend in a second direction perpendicular to the first direction; and
   etching portions of the line-shaped pad patterns and the gate capping fences that are exposed by the mask openings to form contact pads from the line-shaped pad patterns and to form trenches in the gate capping fences that extend in the second direction.

10. The method according to claim 9 wherein the forming line-shaped pad patterns comprises:
    forming a pad conductive layer on the spaced-apart line-shaped structures and between the spaced-apart line-shaped structures; and
    removing the pad conductive layer until top surfaces of the gate capping fences are exposed to form the line-shaped pad patterns.

11. The method according to claim 10 further comprising:
    forming a bit line in a respective trench.

12. The method according to claim 10 further comprising:
    forming a lower electrode of a capacitor directly on a respective contact pad.

13. The method according to claim 11 wherein the following is performed between the etching and the forming a bit line:
    forming an insulating layer including an air gap on walls of the trenches.

* * * * *